US011248138B2

(12) United States Patent
Pan et al.

(10) Patent No.: US 11,248,138 B2
(45) Date of Patent: Feb. 15, 2022

(54) PRINTING INK FORMULATIONS, PREPARATION METHODS AND USES THEREOF

(71) Applicant: GUANGZHOU CHINARAY OPTOELECTRONIC MATERIALS LTD., Guangdong (CN)

(72) Inventors: Junyou Pan, Guangdong (CN); Xi Yang, Guangdong (CN); Xiaolin Yan, Guangdong (CN)

(73) Assignee: Guangzhou Chinaray Optoelectronic Materials Ltd., Guangdong (CN)

( * ) Notice: Subject to any disclaimer, the term of this patent is extended or adjusted under 35 U.S.C. 154(b) by 351 days.

(21) Appl. No.: 16/463,526

(22) PCT Filed: Nov. 23, 2017

(86) PCT No.: PCT/CN2017/112702
§ 371 (c)(1),
(2) Date: May 23, 2019

(87) PCT Pub. No.: WO2018/095381
PCT Pub. Date: May 31, 2018

(65) Prior Publication Data
US 2019/0375956 A1 Dec. 12, 2019

(30) Foreign Application Priority Data

Nov. 23, 2016 (CN) .......................... 201611051757.9

(51) Int. Cl.
*C09D 11/36* (2014.01)
*C09D 11/033* (2014.01)
(Continued)

(52) U.S. Cl.
CPC ............ *C09D 11/50* (2013.01); *C09D 11/033* (2013.01); *C09D 11/037* (2013.01);
(Continued)

(58) Field of Classification Search
None
See application file for complete search history.

(56) References Cited

U.S. PATENT DOCUMENTS 3,567,450 A    3/1971   Brantly et al.
3,615,404 A    10/1971  Price et al.
(Continued)

FOREIGN PATENT DOCUMENTS

CN    1531579 A    9/2004
CN    1180049 C    12/2004
(Continued)

OTHER PUBLICATIONS

Computer-generated English-language translation of CN-104282834-A.*
(Continued)

*Primary Examiner* — Vu A Nguyen
(74) *Attorney, Agent, or Firm* — Cozen O'Connor

(57) ABSTRACT

A printing ink formulation includes a functional material and a solvent being evaporable from the printing ink formulation to form a functional material thin film. The solvent is formed by mixing at least two organic solvents including a first solvent and a second solvent. The solvent system containing at least two solvents can effectively dissolve the functional material without the need of adding an additive, and can also effectively prevent the occurrence of a "coffee-ring effect", and accordingly, the thin film containing a uniform thickness and a strong electron transmission capability can be obtained.

19 Claims, 1 Drawing Sheet

(51) Int. Cl.

| | | |
|---|---|---|
| *C09K 11/06* | (2006.01) | |
| *C09K 11/08* | (2006.01) | |
| *H01L 51/00* | (2006.01) | |
| *C09D 11/50* | (2014.01) | |
| *C09D 11/037* | (2014.01) | |
| *C09D 11/322* | (2014.01) | |
| *C09D 11/52* | (2014.01) | |
| *C09K 11/54* | (2006.01) | |
| *C09K 11/56* | (2006.01) | |
| *C09K 11/88* | (2006.01) | |
| *H01L 33/04* | (2010.01) | |
| *H01L 33/28* | (2010.01) | |
| *H01L 51/50* | (2006.01) | |

(52) U.S. Cl.
CPC ............ *C09D 11/322* (2013.01); *C09D 11/36* (2013.01); *C09D 11/52* (2013.01); *C09K 11/06* (2013.01); *C09K 11/54* (2013.01); *C09K 11/565* (2013.01); *C09K 11/883* (2013.01); *H01L 51/0056* (2013.01); *H01L 51/0058* (2013.01); *H01L 51/0059* (2013.01); *H01L 51/0067* (2013.01); *H01L 51/0072* (2013.01); *H01L 51/0077* (2013.01); *H01L 51/0085* (2013.01); *C09K 2211/1029* (2013.01); *C09K 2211/185* (2013.01); *H01L 33/04* (2013.01); *H01L 33/28* (2013.01); *H01L 51/0005* (2013.01); *H01L 51/5012* (2013.01); *H01L 51/5016* (2013.01); *H01L 51/5056* (2013.01); *H01L 51/5072* (2013.01); *H01L 51/5088* (2013.01); *H01L 51/5092* (2013.01); *H01L 51/5096* (2013.01)

(56) References Cited

U.S. PATENT DOCUMENTS

| | | | |
|---|---|---|---|
| 4,720,432 A | 1/1988 | VanSlyke et al. | |
| 4,769,292 A | 9/1988 | Tang et al. | |
| 5,061,569 A | 10/1991 | VanSlyke et al. | |
| 5,121,029 A | 6/1992 | Hosokawa et al. | |
| 5,130,603 A | 7/1992 | Tokailin et al. | |
| 5,962,631 A | 10/1999 | Woo et al. | |
| 6,020,078 A | 2/2000 | Chen et al. | |
| 6,207,229 B1 | 3/2001 | Bawendi et al. | |
| 6,251,303 B1 | 6/2001 | Bawendi et al. | |
| 6,251,531 B1 | 6/2001 | Enokida et al. | |
| 6,319,426 B1 | 11/2001 | Bawendi et al. | |
| 6,426,513 B1 | 7/2002 | Bawendi et al. | |
| 6,576,291 B2 | 6/2003 | Bawendi et al. | |
| 6,607,829 B1 | 8/2003 | Bawendi et al. | |
| 6,824,895 B1 | 11/2004 | Sowinski et al. | |
| 6,830,828 B2 | 12/2004 | Thompson et al. | |
| 6,835,469 B2 | 12/2004 | Kwong et al. | |
| 6,861,155 B2 | 3/2005 | Bawendi et al. | |
| 6,921,496 B2 | 7/2005 | Anderson et al. | |
| 7,029,766 B2 | 4/2006 | Huo et al. | |
| 7,060,243 B2 | 6/2006 | Bawendi et al. | |
| 7,125,605 B2 | 10/2006 | Bawendi et al. | |
| 7,138,098 B2 | 11/2006 | Bawendi et al. | |
| 7,150,910 B2 | 12/2006 | Eisler et al. | |
| 7,250,226 B2 | 7/2007 | Tokito et al. | |
| 7,250,532 B2 | 7/2007 | Iwakuma et al. | |
| 7,470,379 B2 | 12/2008 | Anderson et al. | |
| 7,566,476 B2 | 7/2009 | Bawendi et al. | |
| 9,045,613 B2* | 6/2015 | Suzuki | C08K 5/0008 |
| 2001/0053462 A1 | 12/2001 | Mishima | |
| 2004/0002576 A1 | 1/2004 | Oguma et al. | |
| 2004/0076853 A1 | 4/2004 | Jarikov | |
| 2005/0258742 A1 | 11/2005 | Tsai et al. | |
| 2006/0045959 A1* | 3/2006 | Yasukawa | C09D 11/30 427/66 |
| 2006/0210830 A1 | 9/2006 | Funahashi et al. | |
| 2006/0222886 A1 | 10/2006 | Kwong et al. | |
| 2007/0087219 A1 | 4/2007 | Ren et al. | |
| 2007/0092753 A1 | 4/2007 | Begley et al. | |
| 2007/0208567 A1 | 9/2007 | Amento et al. | |
| 2007/0225402 A1 | 9/2007 | Choi et al. | |
| 2007/0252517 A1 | 11/2007 | Owczarczyk et al. | |
| 2008/0027220 A1 | 1/2008 | Stossel et al. | |
| 2008/0113101 A1 | 5/2008 | Inoue et al. | |
| 2008/0169753 A1 | 7/2008 | Skipor et al. | |
| 2008/0188063 A1 | 8/2008 | Alivisatos et al. | |
| 2008/0277626 A1 | 11/2008 | Yang et al. | |
| 2009/0053522 A1 | 2/2009 | Sekiguchi et al. | |
| 2009/0061681 A1 | 3/2009 | McMunigal et al. | |
| 2009/0130296 A1 | 5/2009 | Kwong et al. | |
| 2009/0134784 A1 | 5/2009 | Lin et al. | |
| 2010/0264371 A1 | 10/2010 | Nick | |
| 2010/0265307 A1 | 10/2010 | Linton et al. | |
| 2011/0180787 A1* | 7/2011 | Cho | C09D 11/52 257/40 |
| 2012/0004407 A1 | 1/2012 | Stoessel et al. | |
| 2012/0205637 A1 | 8/2012 | Cheon et al. | |
| 2012/0217869 A1 | 8/2012 | Adachi et al. | |
| 2014/0097406 A1 | 4/2014 | Cheon et al. | |
| 2014/0138655 A1* | 5/2014 | Sonoyama | C09D 11/36 257/40 |
| 2015/0044802 A1 | 2/2015 | Tregub et al. | |
| 2015/0075397 A1 | 3/2015 | Gresty et al. | |
| 2015/0079720 A1 | 3/2015 | Liu et al. | |
| 2015/0101665 A1 | 4/2015 | Liu et al. | |
| 2015/0132496 A1* | 5/2015 | Son | C08K 5/13 427/384 |
| 2018/0230321 A1* | 8/2018 | Pan | C09D 11/30 |
| 2018/0237691 A1* | 8/2018 | Pan | C01B 17/20 |
| 2018/0327622 A1* | 11/2018 | Pan | C09D 11/037 |
| 2019/0276696 A1* | 9/2019 | Pan | C09D 11/037 |

FOREIGN PATENT DOCUMENTS

| | | |
|---|---|---|
| CN | 1583691 A | 2/2005 |
| CN | 101180370 | 5/2008 |
| CN | 101222021 | 7/2008 |
| CN | 102282150 A1 | 12/2011 |
| CN | 102408776 A | 4/2012 |
| CN | 102504803 A | 6/2012 |
| CN | 102504804 A | 6/2012 |
| CN | 103173060 A | 6/2013 |
| CN | 103483332 A | 1/2014 |
| CN | 101878535 B | 3/2014 |
| CN | 102124588 B | 3/2014 |
| CN | 103824959 | 5/2014 |
| CN | 103824959 A | 5/2014 |
| CN | 104282834 A * | 1/2015 |
| CN | 104638198 A | 5/2015 |
| CN | 105038408 | 11/2015 |
| CN | 105038408 A | 11/2015 |
| CN | 105062193 A | 11/2015 |
| CN | 105153811 A | 12/2015 |
| DE | 102004020298 A1 | 11/2005 |
| DE | 102005058557 A1 | 6/2007 |
| DE | 102009023156.0 A1 | 12/2010 |
| DE | 102009023154.4 A1 | 6/2011 |
| EP | 1083775 A1 | 3/2001 |
| EP | 201345477 A2 | 9/2003 |
| EP | 2001344788 A1 | 9/2003 |
| EP | 1191613 B1 | 3/2006 |
| EP | 1957606 A1 | 8/2008 |
| EP | 1191614 B1 | 5/2009 |
| EP | 1191612 B1 | 9/2009 |
| GB | 2466842 A | 7/2010 |
| JP | 2913116 B2 | 6/1999 |
| JP | 2003338375 A | 11/2003 |
| JP | 2005108556 A | 4/2005 |
| JP | 2005285661 A | 10/2005 |
| JP | 2005328030 A | 11/2005 |
| JP | 2007059939 A | 3/2007 |
| JP | 2007197574 A | 8/2007 |
| JP | 2007211243 A | 8/2007 |
| JP | 8053397 A | 3/2008 |
| KR | 20050121443 A | 12/2005 |

(56) References Cited

FOREIGN PATENT DOCUMENTS

| | | |
|---|---|---|
| TW | 201309696 A | 3/2013 |
| TW | 201309778 A | 3/2013 |
| TW | 201340370 A | 10/2013 |
| TW | 201343874 A | 11/2013 |
| TW | 201350558 A | 12/2013 |
| WO | 200070655 A2 | 11/2000 |
| WO | 2001021729 A1 | 3/2001 |
| WO | 200141512 A1 | 6/2001 |
| WO | 200202714 A2 | 1/2002 |
| WO | 200215645 A1 | 2/2002 |
| WO | 2003020790 A2 | 3/2003 |
| WO | 2003051092 A1 | 6/2003 |
| WO | 03097904 A1 | 11/2003 |
| WO | 2003099901 A1 | 12/2003 |
| WO | 2004041901 A1 | 5/2004 |
| WO | 2004113412 A2 | 12/2004 |
| WO | 2005019373 A2 | 3/2005 |
| WO | 2005033174 A1 | 4/2005 |
| WO | 2005033244 A1 | 4/2005 |
| WO | 2005041322 A1 | 5/2005 |
| WO | 2005056633 A1 | 6/2005 |
| WO | 2005104264 A1 | 11/2005 |
| WO | 2006/000388 A1 | 1/2006 |
| WO | 2006/000389 A1 | 1/2006 |
| WO | 2006052457 A2 | 5/2006 |
| WO | 2006/058737 A1 | 6/2006 |
| WO | 2006062226 A1 | 6/2006 |
| WO | 2006/122630 A1 | 11/2006 |
| WO | 2006114364 A1 | 11/2006 |
| WO | 2006118345 A1 | 11/2006 |
| WO | 2006134599 A1 | 12/2006 |
| WO | 2007043495 A1 | 4/2007 |
| WO | 2007/065549 A1 | 6/2007 |
| WO | 2007/092606 A2 | 8/2007 |
| WO | 2007095118 A2 | 8/2007 |
| WO | 2007/115610 A1 | 10/2007 |
| WO | 2007/117672 A2 | 10/2007 |
| WO | 2007/117698 A2 | 10/2007 |
| WO | 2007/120877 A2 | 10/2007 |
| WO | 2007/140847 A1 | 12/2007 |
| WO | 2007/143197 A2 | 12/2007 |
| WO | 2008/006449 A1 | 1/2008 |
| WO | 2008013366 A1 | 1/2008 |
| WO | 2008/033388 A2 | 3/2008 |
| WO | 2008/063652 A1 | 5/2008 |
| WO | 2008/063653 A1 | 5/2008 |
| WO | 2008/070028 A2 | 6/2008 |
| WO | 2008/085210 A2 | 7/2008 |
| WO | 2008/108798 A2 | 9/2008 |
| WO | 2008/111947 A1 | 9/2008 |
| WO | 2008105792 A2 | 9/2008 |
| WO | 2009118087 A1 | 10/2009 |
| WO | 2009146770 A2 | 12/2009 |
| WO | 2010015307 A1 | 2/2010 |
| WO | 2010031485 A1 | 3/2010 |
| WO | 2010054728 A1 | 5/2010 |
| WO | 2010054731 A1 | 5/2010 |
| WO | 2010086089 A1 | 8/2010 |
| WO | 2010099852 A1 | 9/2010 |
| WO | 2010102709 A1 | 9/2010 |
| WO | 2010135519 A1 | 11/2010 |
| WO | 2011110277 A1 | 9/2011 |
| WO | 2011157339 A1 | 12/2011 |
| WO | 2012007086 A1 | 1/2012 |
| WO | 2012007087 A1 | 1/2012 |
| WO | 2012007088 A1 | 1/2012 |
| WO | 2013133359 A1 | 9/2013 |
| WO | 2013154064 A1 | 10/2013 |
| WO | 2016076213 A1 | 5/2016 |
| WO | 2017080317 A1 | 5/2017 |
| WO | 2017080323 A1 | 5/2017 |
| WO | 2017080324 A1 | 5/2017 |

OTHER PUBLICATIONS

PCT/CN2017/112702, "International Search Report", dated Dec. 27, 2017, 2 pages.

Dai et al., "Solution-processed, high-performance light-emitting diodes based on quantum dots", Nature, vol. 515 (2014) 96.

Yang et al., High-efficiency light-emitting devices based on quantum dots with tailored nanostructures, Nature Photonics, vol. 9 (2015) pp. 259-266.

Kipphan (Handbook of Print Media: Technologies and Production Methods), ISBN 3-540-67326-1,Chapter 1.3, pp. 40-67, Chapter 1.5, pp. 117-144, Chapter 5.5, pp. 711-730.

Murray et al., "Synthesis and Characterization of Monodisperse Nanocrystals and Close-Packed Nanocrystal Assemblies", Annu. Rev. Mater. Sci. vol. 30 (2000) pp. 545-610.

Lim et al. "Perspective on synthesis, device structures, and printing processes for quantum dot displays", Optical Materials Express., vol. 2 (2012) pp. 594-628.

Peng, An Essay on Synthetic Chemistry of Colloidal Nanocrystals, Nano Res vol. 2 (2009) pp. 425-447.

Artemyev et al., "Unidirectional Alignment of CdSe Nanorods", Nano Letters, 2003, vol. 3, No. 4, 509.

Kazes et al., "Lasing from Semiconductor Quantum Rods in a Cylindrical Microcavity", Adavanced Materials, 2002, 14, pp. 317-321.

Rothenberg et al.,"Electric Field Induced Switching of the Fluorescence of Single Semiconductor Quantum Rods", Nano Letter, vol. 5 (2005) 1581-1586.

Protesescu et al., Nanocrystals of Cesium Lead Halide Perovskites ($CsPbX_3$, X=Cl, Br, and I): Novel Optoelectronic Materials Showing Bright Emission with Wide Color Gamut, Nano Letters, 2015, 15, 3692-3696.

Zhang et al., "Brightly Luminescent and Color-Tunable Colloidal $CH_3NH_3PbX_3$ (X=Br, I, Cl) Quantum Dots: Potential Alternatives for Display Technology", ACS Nano, vol. 9 (2015) pp. 4533-4542.

Vreja et al., "Secondary-Ion Mass Spectrometry of Genetically Encoded Targets", Angew.andte Chem, 2015, 127(19): 5785-5788.

Li et al., "Efficient Light-Emitting Diodes Based on Nanocrystalline Perovskite in a Dielectric Polymer Matrix", Nano Letters, 2015, 15 (4), pp. 2640-2644.

Song, et al., "Anomalous NIR Luminescence in Mn 2+-Doped Fluoride Perovskite Nanocrystals", Advanced Optical Materials, 2014, 2, 670-678.

Di et al., "Size-dependent Photon Emission from Organometal Halide Perovskite Nanocrystals Embedded in an Organic Matrix", The Journal of Physical Chemistry Letters, 2015, 6(3): 446-450.

Gonzalez-Carrero et al., Approaching the top of the emissive properties of $CH_3NH_3PbBr_3$ perovskite nanoparticles, Journal of Materials Chemistry A, 2015,3, 9187-9193.

Hu et al., The Role of Oleic Acid: From Synthesis to Assembly of Perovskite Nanocuboid Two-Dimensional Arrays, Inorganic Chemistry, 2015, 54, 740-745.

Muthu et al., Luminescent Hybrid Perovskite Nanoparticles as a New Platform for Selective Detection of 2,4,6-Trinitrophenol, RSC Advances, 2014,4, 55908-55911.

Zhang et al., "3,3'-Dinitroamino-4,4'-azoxyfurazan and Its Derivatives: An Assembly of Diverse N—O Building Blocks for High-Performance Energetic Materials", Journal of the American Chemical Society, 2014, 136 (3), pp. 850-853.

González-Carrero, "Organometal Halide Perovskites: Bulk Low-Dimension Materials and Nanoparticles", Part. Part. Syst. Charact. 2015, doi: 10.1002/ppsc.201400214.

Nuraje, et al., "Perovskite ferroelectric nanomaterials", Nanoscale, 2013, 5(19): 8752-8780.

Xia et al., "Shape-Controlled Synthesis of Metal Nanocrystals: Simple Chemistry Meets Complex Physics", Angewandte Chemie Int. Ed. 2009, 48, 60-103.

Zhang et al., "Noble-Metal Nanocrystals with Concave Surfaces: Synthesis and Applications", Angewandte Chemie Int. Ed. (2012), 51, 7656-7673.

Xia, "One-Dimensional Nannostructures: Snythesis, Characterization, and Applications", Advanced Materials, (2003) vol. 15, No. 5, 353-389.

(56) References Cited

OTHER PUBLICATIONS

Sau et al., Nonspherical Noble Metal Nanoparticles: Colloid-Chemical Synthesis and Morphology Control, Advanced Materials, 2010, 22, 1781-1804.
Tao et al., "Shape Control of Colloidal Metal Nanocrystals", Small. 2008, 3, 310-325.
Xia et al., "Peptide Fragmentation Assisted by Surfaces Treated with a Low-Temperature Plasma in NanoESI", Angewandte Chemie Int. Ed. 2008, 47, 2-46.
Endo et. al., "Thermally Activated Delayed Fluorescence from Sn4p-Porphyrin Complexes and Their Application to Organic Light-Emitting Diodes—A Novel Mechanism for Electroluminescence", Adv. Mater., vol. 21 (2009) pp. 4802-4806.
Endo et. al., "Efficient up-conversion of triplet excitons into a singlet state and its application for organic light emitting diodes", Appl. Phys. Lett., vol. 98 (2011) pp. 083302-01-083302-03.
Lee et al., "High-efficiency organic light-emitting diodes utilizing thermally activated delayed fluorescence from triazine-based donor-acceptor hybrid molecules", vol. 101 Appl. Phys. Lett., vol. 101 (2012) 093306-01-093306-04.
Tanaka, "Efficient green thermally activated delayed fluorescence (TADF) from a phenoxazine-triphenyltriazine (PXZ-TRZ) derivative", Chem. Commun. vol. 48 (2012) 11392-11394.
Goushi et.al., "Organic light-emitting diodes employing efficient reverse intersystem crossing for triplet-to-singlet state conversion", Nature Photonics, vol. 6 (2012) pp. 253-258.
Uoyama et al., "Highly efficient organic light-emitting diodes from delayed fluorescence", Nature, vol. 492 (2012) pp. 234-238.
Zhang et.al., "Design of Efficient Thermally Activated Delayed Fluorescence Materials for Pure Blue Organic Light Emitting Diodes", J. Am. Chem. Soc, vol. 134 (2012) pp. 14706-14709.
Mehes et.al., "Enhanced Electroluminescence Efficiency in a Spiro-Acridine Derivative through Thermally Activated Delayed Fluorescence", Angew. Chem. Int. Ed, vol. 51 (2012) pp. 11311-11315.
Nakagawa et.al., "Electroluminescence based on thermally activated delayed fluorescence generated by a spirobifluorene donor-acceptor structure", Chem. Commun., vol. 48 (2012) 9580-9582.
Nasu et.al., "A highly luminescent spiro-anthracenone-based organic light-emitting diode exhibiting thermally activated delayed fluorescence", Chem. Commun., vol. 49 (2013), 10385-10387.
Li et.al., "Highly Efficient Organic Light-Emitting Diode Based on a Hidden Thermally Activated Delayed Fluorescence Channel in a Heptazine Derivative", Adv. Mater., vol. 25 (2013) pp. 1-5.
Dias et.al., "Triplet Harvesting with 100% Efficiency by Way of Thermally Activated Delayed Fluorescence in Charge Transfer OLED Emitters", Adv. Mater., vol. 25 (2013) pp. 3707-3714.
Komino et.al., "Suppression of Efficiency Roll-Off Characteristics in Thermally Activated Delayed Fluorescence Based Organic Light-Emitting Diodes Using Randomly Oriented Host Molecules", Chem. Mater., vol. 25 (2013) pp. 3038-3047.
Tanaka et.al., "Twisted Intramolecular Charge Transfer State for Long-Wavelength Thermally Activated Delayed Fluorescence", Chem. Mater., vol. 25, (2013) pp. 3766-3771.
Lee et.al., "Oxadiazole- and triazole-based highly-efficient thermally activated delayed fluorescence emitters for organic light-emitting diodes", J. Mater. Chem. C., vol. 1 (2013) pp. 4599-4605.
Ishimatsu et.al., "Solvent Effect on Thermally Activated Delayed Fluorescence by 1,2,3,5-Tetrakis(carbazol-9-yl)-4,6-dicyanobenzene", J. Phys. Chem. A., vol. 117 (2013) pp. 5607-5612.
Baldo, et al., "High-efficiency fluorescent organic light-emitting devices using a phosphorescent sensitizer", Nature vol. 403, (2000), pp. 750-753.
Adachi et al., "High-efficiency red electrophosphorescence devices", Appl. Phys. Lett. vol. 78 (2001), pp. 1622-1624.
Kido et. al., "Bright red lightemitting organic electroluminescent devices having a europium complex as an emitter", Appl. Phys. Lett. vol. 65 (1994), p. 2124-2126.
Kido et al., "Electroluminescence in a Terbium Complex", Chem. Lett. (1990) pp. 657-660.
Johnson et. al., "Luminescent Iridium(I), Rhodium(I), and Platinum(II) Dithiolate Complexes", JACS (1983) vol. 105, pp. 1795-1802.
Wrighton et al., "The Nature of the Lowest Excited State in Tricarbonylchloro-1, 10-phenanthrolinerhenium(I) and Related Complexes", JACS vol. 96 (1974) pp. 998-1003.
Ma, et. al., "Electroluminescence from triplet metal-ligand charge-transfer excited state of transition metal complexes", Synth. Metals vol. 94 (1998) pp. 245-248.
Bulovic et. al., "Transparent light-emitting devices", Nature, vol. 380 (1996) pp. 29.
Gu et. al., "Transparent organic light emitting device", Appl. Phys. Lett. vol. 68 (1996) pp. 2606-2608.
European Application No. 17874763.0, "European Search Report" dated Nov. 7, 2019, 8 pages.
CN Application No. 201780059200.6 "First Office Action and Search Report" dated Apr. 25, 2021, 25 pages.

* cited by examiner

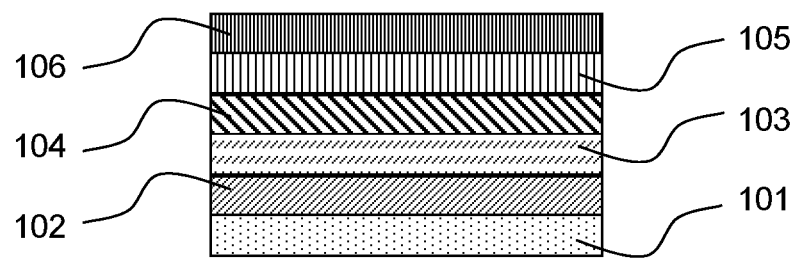

PRINTING INK FORMULATIONS, PREPARATION METHODS AND USES THEREOF

CROSS-REFERENCE TO RELATED APPLICATIONS

The present application is a national stage for International Application PCT/CN2017/112702, filed on Nov. 23, 2017, which claims priority benefit of Chinese Patent Application No. 201611051757.9, entitled "A Printing Electronic Formulation" and filed on Nov. 23, 2016, the entire content of both applications are incorporated herein for all purposes.

TECHNICAL FIELD

The present disclosure relates to the field of organic optoelectronic materials, and in particular to printing ink formulations, preparation methods thereof, and uses thereof.

BACKGROUND

The organic light-emitting diode (OLED), as a new generation display technology, is usually prepared by evaporation method. The manufacturing process has low material utilization rate, and requires a fine metal mask (FMM), thus having higher cost and lower yield. In order to solve the above problems, a technique for realizing high-resolution full-color display using a printing process has been received more and more attention. For example, inkjet printing, which may produce a functional material film in a large area and at low cost, and has lower energy consumption and lower water consumption thus being environment-friendly compared with conventional semiconductor production process, is a production technology with great advantages and potential. Quantum dot light-emitting diode (QLED), which is another new display technology, cannot be evaporated and must be prepared by printing. Therefore, to achieve printed display, it is necessary to break through key issues such as printing ink and related printing processes. Viscosity and surface tension are important parameters that affect the printing ink and printing processes. A promising printing ink needs to have the proper viscosity and surface tension.

Organic semiconductor materials have gained widespread attention and significant progress in their use in electronic and optoelectronic devices due to their solution processability. Solution process allows the organic functional material to be capable of forming thin films in the device by coating or printing techniques. Such technologies may effectively reduce the processing cost of electronic and optoelectronic devices, and meet the process requirements of large-area preparation. Currently, there are several companies reported the organic semiconductor material ink used for printing, for example: KATEEVA, INC. discloses an ester solvent-based organic small molecule material ink for printable OLED (US2015044802A1); UNIVERSAL DISPLAY CORPORATION discloses a printable organic small molecular material ink based on an aromatic ketone or an aromatic ether solvent (US20120205637); SEIKO EPSON CORPORATION discloses a printable organic polymer material ink based on a substituted benzene derivative solvent. Other examples relate to an organic functional material printing ink are: CN102408776A, CN103173060A, CN103824959A, CN1180049C, CN102124588B, US2009130296A1, US2014097406A1, etc.

Another kind of functional materials that are suitable for printing are inorganic nanomaterials, particularly quantum dots. Quantum dots are nano-sized semiconductor materials with quantum confinement effect. A quantum dot would emit fluorescence with specific energy when stimulated by light or electricity. The color (energy) of the fluorescence is determined by the chemical formulation and size of the quantum dot. Therefore, the control of the size and shape of quantum dot can effectively regulate its electrical and optical properties. Recently, electroluminescent device with quantum dots as light emitting layer (QLED) has been rapidly developed, and device lifetime thereof has been greatly improved, as reported in Peng et al., Nature Vol 515 96 (2015) and Qian et al., Nature Photonics Vol 9 259 (2015). Currently, several companies have reported quantum dot inks for printing: Nanoco Technologies Ltd. discloses a method for preparing printable ink formulation comprising nanoparticles (CN101878535B), the printable nanoparticle ink and the corresponding nanoparticle-containing film are obtained by selecting suitable solvents such as toluene and dodecyl selenol; Samsung Electronics discloses a quantum dot ink for inkjet printing (U.S. Pat. No. 8,765,014B2) containing a concentration of quantum dot material, organic solvent, and alcohol polymer additive having a high viscosity, by printing the ink, a quantum dot film is obtained and a quantum dot electroluminescent device is prepared; QD Vision, Inc. discloses a quantum dot ink formulation comprising a host material, a quantum dot material and an additive (US2010264371A1).

Other patents relating to quantum dot printing inks comprise: US2008277626A1, US2015079720A1, US2015075397A1, TW201340370A, US2007225402A1, US2008169753A1, US2010265307A1, US2015101665A1, WO2008105792A2. In these published patents, in order to regulate the physical parameters of the ink, these quantum dot inks contain other additives such as alcohol polymers. The introduction of polymer additives with insulating properties tends to reduce the charge transport capability of the film, which has a negative impact on the optoelectronic properties of the device, and limits its wide application in optoelectronic devices.

In addition, in the process of inkjet printing and drying process, it is often accompanied by a "coffee ring effect", that is, the solute material is easily deposited on the edge of the droplet, resulting in the dried thin film having a thick edge and a thin center. This is because during the drying process, the solvent mainly evaporates from the edge of the droplet, and the volume change of the solution mainly occurs at the center of the droplet, which in turn causes the solution to flow from the center to the edge. The obtained film having a non-uniform thickness is extremely disadvantageous for further processing of the optoelectronic devices and device performance. Therefore, the search for a suitable solvent system to reduce the "coffee ring effect" of inkjet printed films is particularly important for improving the uniformity of the film and device performance.

SUMMARY

In accordance with various embodiments of the present application, a printing ink formulation, a preparation method thereof, and uses thereof are provided that solves one or more of the problems involved in the background.

A printing ink formulation comprises a functional material and a solvent, the solvent could be evaporable from the printing ink formulation to form a functional material film;

the solvent is formed by mixing at least two organic solvents including a first solvent and a second solvent, the first solvent and the second solvent are miscible, at least one of the first solvent and the second solvent has a boiling point of >160° C., the second solvent has a surface tension less than that of the first solvent and a viscosity greater than that of the first solvent, the difference in surface tension between the second solvent and the first solvent is at least 2 dyne/cm, and the difference in viscosity between the second solvent and the first solvent is at least 2 cPs.

A method for preparing the above formulation comprises:

1) dissolving any solid component contained in the functional material into the first solvent, and 2) adding the second solvent to the first solvent in which the solid component has been dissolved to form a mixed solution.

An electronic device comprises a functional layer, which is a functional material film prepared from the printing ink formulation described above, is also provided.

BRIEF DESCRIPTION OF THE DRAWINGS

The FIGURE is a schematic view of an electronic device according to an embodiment.

DETAILED DESCRIPTION OF THE EMBODIMENTS

The objects, technical solution and advantages of the present application will become more apparent and understandable by further describing the present disclosure in detail with reference to the accompanying drawings and embodiments. It should be noted that, the specific embodiment illustrated herein is merely for the purpose of explanation, and should not be deemed to limit the disclosure.

In the present disclosure, terms of "formulation", "printing ink formulation" and "printing ink" or "ink" have the same meaning and are interchangeable.

In the present disclosure, terms of "host material" or "matrix material" or "Host" or "Matrix" have the same meaning and are interchangeable.

In the present disclosure, terms of "metal organic clathrate", "metal organic complexes", and "organometallic complexes" have the same meaning and are interchangeable.

In the present disclosure, "@ 25° C." means that the measurement is carried out at 25° C.

A printing ink formulation, comprises a functional material and a solvent, the solvent could be evaporable from the printing ink formulation to form a functional material film;

the solvent is formed by mixing at least two organic solvents including a first solvent and a second solvent, the first solvent and the second solvent are miscible, at least one of the first solvent and the second solvent has a boiling point of ≥160° C., the second solvent has a surface tension less than that of the first solvent and a viscosity greater than that of the first solvent, the difference in surface tension between the second solvent and the first solvent is at least 2 dyne/cm, and the difference in viscosity between the second solvent and the first solvent is at least 2 cPs.

In an embodiment, at least one of the first solvent and the second solvent has a boiling point of ≥160° C.; in an embodiment, at least one of the first solvent and the second solvent has a boiling point of ≥180° C.; in some embodiments, at least one of the first solvent and the second solvent has a boiling point of ≥200° C.; in another embodiment, at least one of the first solvent and the second solvent has a boiling point of ≥250° C.; in another embodiment, at least one of the first solvent and the second solvent has a boiling point of ≥275° C.; in another embodiment, at least one of the first solvent and the second solvent has a boiling point of ≥300° C.

In an embodiment, both the first solvent and the second solvent have a boiling point of ≥160° C.; in an embodiment, both the first solvent and the second solvent have a boiling point of ≥180° C.; in an embodiment, both the first solvent and the second solvent have a boiling point of ≥200° C.; in an embodiment, both the first solvent and the second solvent have a boiling point of ≥220° C.; in an embodiment, both the first solvent and the second solvent have a boiling point of ≥240° C.

Selecting a solvent having a boiling point within the above range may prevent clogging of the nozzle of the inkjet print head.

In an embodiment, a formulation comprising at least two organic solvents, at least one of which has a viscosity in the range of 1 cPs to 100 cPs @25° C. That is, at 25° C., at least one of the first solvent and the second solvent has a viscosity from 1 cPs to 100 cPs.

In an embodiment, at least one of the first solvent and the second solvent has a viscosity from 1 cPs to 50 cPs; in an embodiment, at least one of the first solvent and the second solvent has a viscosity from 1 cPs to 40 cPs; in an embodiment, at least one of the first solvent and the second solvent has a viscosity from 1 cPs to 30 cPs; in an embodiment, at least one of the first solvent and the second solvent has a viscosity from 1.5 cPs to 20 cPs. The viscosity herein refers to the viscosity at the time of printing at ambient temperature, in an embodiment, in the range from 15° C. to 30° C.; in an embodiment, in the range from 18° C. to 28° C.; in an embodiment, in the range from 20° C. to 25° C.; in an embodiment, in the range from 23° C. to 25° C. The formulation so formulated will be particularly suitable for inkjet printing.

In some embodiments, in the formulation according to the present disclosure, at least one of the first solvent and the second solvent has a surface tension from 19 dyne/cm to 50 dyne/cm at 25° C.

Specific substrate and specific printing methods require suitable surface tension parameters of formulations. For example, for inkjet printing, in an embodiment, at least one of the two organic solvents has a surface tension from 19 dyne/cm to 50 dyne/cm at 25° C.; in an embodiment, at least one of the two organic solvents has a surface tension from 22 dyne/cm to 35 dyne/cm at 25° C.; in an embodiment, at least one of the two organic solvents has a surface tension from 25 dyne/cm to 33 dyne/cm at 25° C.

In another embodiment, both the organic solvents have a surface tension from 19 dyne/cm to 50 dyne/cm at 25° C.; in another embodiment, both the organic solvents have a surface tension from 22 dyne/cm to 35 dyne/cm at 25° C.; in another embodiment, both the organic solvents have a surface tension from 25 dyne/cm to 33 dyne/cm at 25° C.

In an embodiment, the printing ink formulation has a surface tension in the range from 19 dyne/cm to 50 dyne/cm at 25° C.; in an embodiment, the printing ink formulation has a surface tension in the range from 22 dyne/cm to 35 dyne/cm at 25° C.; in an embodiment, the printing ink formulation has a surface tension in the range from 25 dyne/cm to 33 dyne/cm at 25° C.

A solvent system comprising at least two organic solvents satisfying the above boiling point and viscosity parameters is comprised in the printing ink formulation to form a functional material film with uniform thickness and formulation property.

In addition, a printing ink formulation comprises at least two organic solvents, a first solvent and a second solvent, the second solvent having a less surface tension than that of the first solvent, and the second solvent having a greater viscosity than that of the first solvent, resulting in a film of functional material having a uniform thickness distribution during inkjet printing and drying.

In an embodiment, the first solvent is a good solvent for the functional material.

In an embodiment, both the first solvent and the second solvent are good solvents for the functional material.

The good solvent means that the solubility is ≥1.0 wt %, further ≥1.5 wt %, still further ≥2.0 wt %, even further ≥2.2 wt %.

The disclosure also relates to a method for preparing the printing ink formulation as described above.

According to the method, a method for preparing the formulation as described above comprises the following steps:

1) dissolving any solid component contained in the functional material into a first solvent, and 2) adding a second solvent to the first solvent in which the solid component has been dissolved to form a mixed solution.

According to the above method, an ink of functional material capable of suppressing edge flow and improving the uniformity of the inkjet-printed film can be obtained.

According to this method, the first solvent used has a relatively good solubility to the functional material, ensuring sufficient solubility and stability of the functional material in the solution. The first solvent used has a higher boiling point to prevent clogging of the nozzle during printing and to ensure stability during injection of the solution.

During the process of inkjet printing and drying into a film, it is often accompanied by a "coffee ring effect", that is, the solute material is easily deposited on the edge of the droplet, resulting in the dried thin film having a thick edge and a thin center. This is because during the drying process, the solvent mainly evaporates from the edge of the droplet, and the volume change of the solution mainly occurs at the center of the droplet, which in turn causes the solution to flow from the center to the edge. To this end, the dual solvent system of the present invention needs to simultaneously satisfy:

(1) at least one of the first solvent and the second solvent has a boiling point of ≥160° C.;

(2) the second solvent has a surface tension less than that of the first solvent and a viscosity greater than that of the first solvent.

The possible mechanisms by which it suppresses the "coffee ring effect" are as follows:

(1) during the drying process of inkjet printing the formulation to the substrate, at least one high boiling point solvent may prolonged the drying time of the droplets of solution, increase the time during which the solute is freely diffused from the high concentration region to the low concentration region in the droplets, reduce the uneven distribution of the solute during the drying process, and improve the uniformity of the inkjet-printed deposited film;

(2) the high flow resistance due to the high viscosity of the second solvent can effectively reduce the edge flow strength of the solution and suppress the edge deposition of the solute, thereby improving the uniformity of the inkjet-printed deposited film and effectively suppressing the "coffee ring" effect;

Further, since the surface tension of the second solvent is smaller than that of the first solvent, a tendency of an increase in the surface tension from the edge to the center may be formed on the surface of the solution droplet during drying of the ink ejected to the substrate, thereby driving the surface solution to flow from the edge to the center. This creates an annular convection with the flow from the center to the edge inside the solution. Such annular convection is beneficial to the uniform distribution of functional materials during the drying process, which can effectively reduce the deposition of functional materials at the edges and weaken the "coffee ring effect", so that the dried functional material film has good uniformity and flatness.

In an embodiment, the printing ink formulation as described above, in which the second solvent has a less surface tension than that of the first solvent, and the second solvent has a greater viscosity than that of the first solvent.

In order to achieve the above-described high flow resistance to suppress the "coffee ring" effect, in an embodiment, the difference in viscosity between the second solvent and the first solvent is at least 2 cPs.

In an embodiment, the difference in viscosity between the second solvent and the first solvent is at least 4 cPs.

In an embodiment, the difference in viscosity between the second solvent and the first solvent is at least 6 cPs.

In an embodiment, the difference in viscosity between the second solvent and the first solvent is at least 8 cPs.

In an embodiment, the difference in viscosity between the second solvent and the first solvent is at least 10 cPs.

In an embodiment, the difference in surface tension between the second solvent and the first solvent is at least 2 dyne/cm.

In an embodiment, the difference in surface tension between the second solvent and the first solvent is at least 4 dyne/cm.

In an embodiment, the difference in surface tension between the second solvent and the first solvent is at least 6 dyne/cm.

In an embodiment, the difference in surface tension between the second solvent and the first solvent is at least 8 dyne/cm.

In an embodiment, the difference in surface tension between the second solvent and the first solvent is at least 2 dyne/cm, while the difference in viscosity between the second solvent and the first solvent is at least 2 cPs.

In an embodiment, the difference in surface tension between the second solvent and the first solvent is at least 4 dyne/cm, while the difference in viscosity between the second solvent and the first solvent is at least 4 cPs.

In an embodiment, the difference in surface tension between the second solvent and the first solvent is at least 6 dyne/cm, while the difference in viscosity between the second solvent and the first solvent is at least 6 cPs.

In an embodiment, the difference in surface tension between the second solvent and the first solvent is at least 8 dyne/cm, while the difference in viscosity between the second solvent and the first solvent is at least 8 cPs.

In the printing ink formulation as described above, the first solvent is present in an amount from 30% to 90% of the total weight of the solvent, and the second solvent is present in an amount from 10% to 70% of the total weight of the solvent. In an embodiment, the second solvent is present in an amount from 20% to 60% of the total weight of the solvent; in an embodiment, the second solvent is present in an amount from 20% to 50% of the total weight of the solvent, in an embodiment, the second solvent is present in an amount from 20% to 40% of the total weight of the solvent.

In an embodiment, the second solvent having a boiling point higher than that of the first solvent.

In an embodiment, the second solvent having a boiling point at least 10° C. higher than that of the first solvent. In an embodiment, the second solvent having a boiling point at least 20° C. higher than that of the first solvent. In an embodiment, the second solvent having a boiling point at least 30° C. higher than that of the first solvent. In an embodiment, the second solvent having a boiling point at least 40° C. higher than that of the first solvent. In an embodiment, the second solvent having a boiling point at least 50° C. higher than that of the first solvent. In an embodiment, the second solvent having a boiling point at least 60° C. higher than that of the first solvent.

In another embodiment, the first solvent has a higher boiling point than that of the second solvent. In an embodiment, the first solvent having a boiling point at least 10° C. higher than that of the second solvent. In an embodiment, the first solvent having a boiling point at least 20° C. higher than that of the second solvent. In an embodiment, the first solvent having a boiling point at least 30° C. higher than that of the second solvent.

In an embodiment, at least one of the two organic solvents comprised in the formulation according to the present disclosure is based on an aromatic or heteroaromatic solvent.

In another embodiment, the printing ink formulation comprises at least two organic solvents, in which at least one of the organic solvents is represented by the following formula:

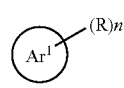

(I)

wherein, $Ar^1$ is an aromatic containing 5 to 10 ring atoms or heteroaromatic containing 5 to 10 ring atoms, n≥1 and R is a substituent.

In some embodiments, in the organic solvent is represented by the formula (I), $Ar^1$ is an aromatic containing 5 to 9 ring atoms or heteroaromatic containing 5 to 9 ring atoms. The aromatic group refers to a hydrocarbyl comprising at least one aromatic ring, including monocyclic group and polycyclic ring system. A heteroaromatic group refers to a hydrocarbyl group (containing a heteroatom) containing at least one heteroaromatic ring, including a monocyclic group and a polycyclic ring system. Such polycyclic rings may have two or more rings in which two carbon atoms are shared by two adjacent rings, i.e., a fused ring. At least one of such polycyclic rings is aromatic or heteroaromatic.

Specifically, examples of the aromatic group include: benzene, naphthalene, anthracene, phenanthrene, perylene, tetracene, pyrene, benzopyrene, triphenylene, acenaphthene, fluorene, and derivatives thereof.

Specifically, examples of the heteroaromatic group include: furan, benzofuran, thiophene, benzothiophene, pyrrole, pyrazole, triazole, imidazole, oxazole, oxadiazole, thiazole, tetrazole, indole, carbazole, pyrroloimidazole, pyrrolopyrrole, thienopyrrole, thienothiophene, furopyrrole, furofuran, thienofuran, benzisoxazole, benzisothiazole, benzimidazole, pyridine, pyrazine, pyridazine, pyrimidine, triazine, quinoline, isoquinoline, cinnoline, quinoxaline, phenanthridine, perimidine, quinazoline, quinazolinone, and derivatives thereof.

In an embodiment, the formulation comprises an organic solvent represented by the formula (I), and it may be further represented by the following formula (II) to formula (VI):

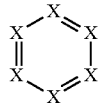

(II)

(III)

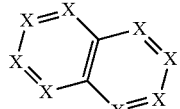

(IV)

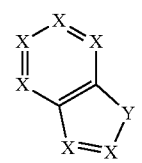

(V)

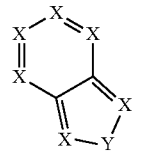

(VI)

wherein,

X is $CR^1$ or N;

Y is selected from $CR^2R^3$, $SiR^4R^5$, $NR^6$ or C(=O), S, or O.

$R^1, R^2, R^3, R^4, R^5, R^6$ are independently selected from the group consisting of H, D, or a linear alkyl containing 1 to 10 C atoms, linear alkoxy containing 1 to 10 C atoms or linear thioalkoxy group containing 1 to 10 C atoms, or a branched or cyclic alkyl containing 3 to 10 C atoms, branched or cyclic alkoxy containing 3 to 10 C atoms or branched or cyclic thioalkoxy group containing 3 to 10 C atoms or silyl group containing 3 to 10 C atoms, or a substituted ketone group containing 1 to 10 C atoms, or an alkoxycarbonyl group containing 2 to 10 C atoms, or an aryloxycarbonyl group containing 7 to 10 C atoms, or a cyano group (—CN), a carbamoyl group (—C(=O)NH2), a haloformyl group (—C(=O)—X wherein X represents a halogen atom), a formyl group (—C(=O)—H), an isocyano group, an isocyanate group, an thiocyanate group or an isothiocyanate group, an hydroxyl group, an nitro group, an $CF_3$ group, Cl, Br, F, a crosslinkable group or a substituted or unsubstituted aromatic ring system containing 5 to 10 ring atoms or substituted or unsubstituted heteroaromatic ring system containing 5 to 10 ring atoms, or an aryloxy group containing 5 to 10 ring atoms or heteroaryloxy group containing 5 to 10 ring atoms, or a combination thereof.

Wherein, one or more of the groups $R^1, R^2, R^3, R^4, R^5, R^6$ may form a monocyclic or polycyclic aliphatic or aromatic ring system with each other and/or with a ring bonded thereto.

In an embodiment, $R^1, R^2, R^3, R^4, R^5, R^6$ are independently selected from the group consisting of H, D, or a linear alkyl containing 1 to 6 C atoms, linear alkoxy containing 1 to 6 C atoms or linear thioalkoxy group containing 1 to 6 C atoms, or a branched or cyclic alkyl containing 3 to 6 C atoms, branched or cyclic alkoxy containing 3 to 6 C atoms or branched or cyclic thioalkoxy group containing 3 to 6 C atoms or silyl group containing 3 to 6 C atoms, or a substituted ketone group containing 1 to 6 C atoms, or an alkoxycarbonyl group containing 2 to 6 C atoms, or an aryloxycarbonyl group containing 7 to 10 C atoms, or a cyano group (—CN), a carbamoyl group (—C(=O)NH2), a haloformyl group (—C(=O)—X wherein X represents a halogen atom), a formyl group (—C(=O)—H), an isocyano group, an isocyanate group, an thiocyanate group or an isothiocyanate group, an hydroxyl group, an nitro group, an $CF_3$ group, Cl, Br, F, a crosslinkable group or a substituted or unsubstituted aromatic ring system containing 5 to 8 ring atoms or substituted or unsubstituted heteroaromatic ring system containing 5 to 8 ring atoms, or an aryloxy group containing 5 to 8 ring atoms or heteroaryloxy group containing 5 to 8 ring atoms, or a combination of these groups. The groups $R^1, R^2, R^3, R^4, R^5, R^6$ may form a monocyclic or polycyclic aliphatic or aromatic ring system with each other and/or with a ring bonded thereto.

In an embodiment, $Ar^1$ in formula (I) is selected from following structural units:

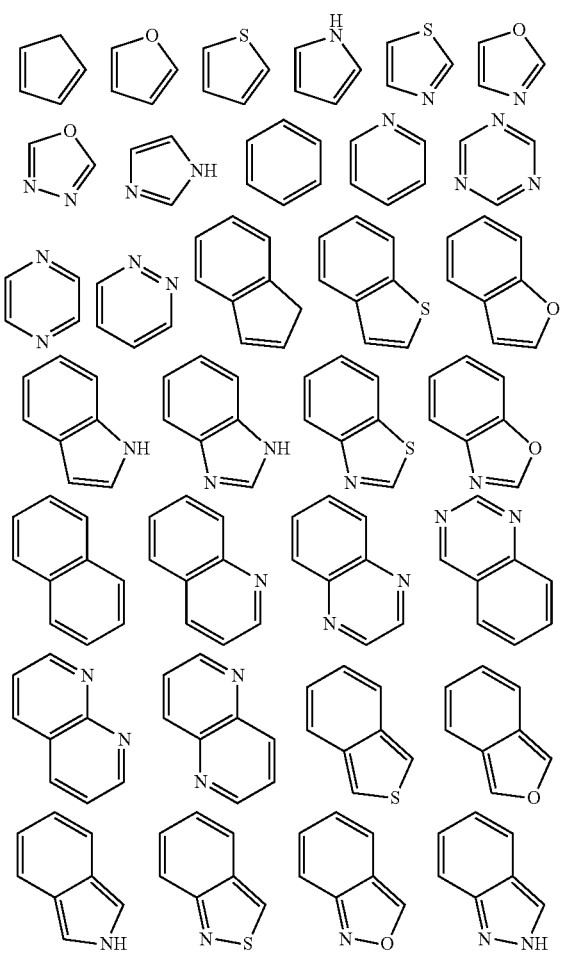

In some embodiments, at least one substituent R in formula (I) is selected from the group consisting of a linear alkyl containing 1 to 10 C atoms, linear alkoxy containing 1 to 10 C atoms or linear thioalkoxy group containing 1 to 10 C atoms, or a branched or cyclic alkyl containing 3 to 10 C atoms, branched or cyclic alkoxy containing 3 to 10 C atoms or branched or cyclic thioalkoxy group containing 3 to 10 C atoms or silyl group containing 3 to 10 C atoms, or a substituted ketone group containing 1 to 10 C atoms, or an alkoxycarbonyl group containing 2 to 10 C atoms, or an aryloxycarbonyl group containing 7 to 10 C atoms, or a cyano group (—CN), a carbamoyl group (—C(=O)NH2), a haloformyl group (—C(=O)—X wherein X represents a halogen atom), a formyl group (—C(=O)—H), an isocyano group, an isocyanate group, an thiocyanate group or an isothiocyanate group, an hydroxyl group, an nitro group, an $CF_3$ group, Cl, Br, F, a crosslinkable group or a substituted or unsubstituted aromatic ring system containing 5 to 10 ring atoms or substituted or unsubstituted heteroaromatic ring system containing 5 to 10 ring atoms, or an aryloxy group containing 5 to 10 ring atoms or heteroaryloxy group containing 5 to 10 ring atoms, or a combination of these groups. R may form a monocyclic or polycyclic aliphatic or aromatic ring system with each other and/or with a ring bonded thereto.

In an embodiment, at least one substituent R in formula (I) is selected from the group consisting of a linear alkyl containing 1 to 6 C atoms, linear alkoxy containing 1 to 6 C atoms or linear thioalkoxy group containing 1 to 6 C atoms, or a branched or cyclic alkyl containing 3 to 6 C atoms, branched or cyclic alkoxy containing 3 to 6 C atoms or branched or cyclic thioalkoxy group containing 3 to 6 C atoms or silyl group containing 3 to 6 C atoms, or a substituted ketone group containing 1 to 6 C atoms, or an alkoxycarbonyl group containing 2 to 6 C atoms, or an aryloxycarbonyl group containing 6 to 7 C atoms, or a cyano group (—CN), a carbamoyl group (—C(=O)NH2), a haloformyl group (—C(=O)—X wherein X represents a halogen atom), a formyl group (—C(=O)—H), an isocyano group, an isocyanate group, an thiocyanate group or an isothiocyanate group, an hydroxyl group, an nitro group, an $CF_3$ group, Cl, Br, F, a crosslinkable group or a substituted or unsubstituted aromatic ring system containing 5 to 8 ring atoms or substituted or unsubstituted heteroaromatic ring system containing 5 to 8 ring atoms, or an aryloxy group containing 5 to 8 ring atoms or heteroaryloxy group containing 5 to 8 ring atoms, or a combination of these groups. One or more of group R may form a monocyclic or polycyclic aliphatic or aromatic ring system with each other and/or with a ring bonded thereto.

In an embodiment, the aromatic or heteroaromatic solvent is selected from the group consisting of p-diisopropylbenzene, pentylbenzene, tetrahydronaphthalene, cyclohexylbenzene, chloronaphthalene, 1,4-dimethylnaphthalene, 3-isopropylbiphenyl, p-methylisopropylbenzene, dipentylbenzene, o-diethylbenzene, m-diethylbenzene, p-diethylbenzene, 1,2,3,4-tetramethylbenzene, 1,2,3,5-tetramethylbenzene, 1,2,4,5-tetramethylbenzene, butylbenzene, dodecylbenzene 1-methylnaphthalene, 1,2,4-trichlorobenzene, 1,3-dipropoxybenzene, 4,4-difluorodiphenylmethane, 1,2-dimethoxy-4-(1-propenyl)benzene, diphenylmethane, 2-phenylpyridine, 3-phenylpyridine, N-methyldiphenylamine, 4-isopropylbiphenyl, α,α-dichlorodiphenylmethane, 4-(3-phenylpropyl)pyridine, benzyl benzoate, 1,1-bis(3,4-dimethylphenyl)ethane, 2-isopropylnaphthalene, dibenzyl ether, 2-isopropyl naphthalene, quinoline, isoquinoline, 8-hydroxyquinoline, methyl 2-furancarboxylate, ethyl 2-furancarboxylate and the like.

In an embodiment, at least one of the two organic solvents comprised in the formulation is an organic solvent based on an aromatic ketone.

In an embodiment, the aromatic ketone solvent is tetralone, such as 1-tetralone and 2-tetralone.

In other embodiments, the tetralone solvent comprises a derivative of 1-tetralone and 2-tetralone, i.e., tetralone substituted by at least one substituent. These substituents include an aliphatic group, an aryl group, a heteroaryl group, a halogen, and the like.

In an embodiment, the aromatic ketone solvent is selected from 2-(phenyl epoxy)tetralone or 6-(methoxy) tetralone.

In other embodiments, the aromatic ketone solvent is selected from acetophenone, propiophenone, benzophenone, and derivatives thereof.

In an embodiment, the solvent of the aromatic ketone is selected from the group consisting of 4-methylacetophenone, 3-methylacetophenone, 2-methylacetophenone, 4-methylpropiophenone, 3-methylpropiophenone, and 2-methylpropiophenone.

In other embodiments, at least one of the two organic solvents comprised in the printing ink formulation is a ketone solvent that do not contain aromatic or heteroaromatic groups, such as isophorone, 2,6,8-trimethyl-4-nonanone, camphor, and fenchone.

In an embodiment, at least one of the two organic solvents comprised in the formulation is an organic solvent based on an aromatic ether.

The aromatic ether solvent is selected from the group consisting of 3-phenoxytoluene, butoxybenzene, benzyl butylbenzene, p-anisaldehyde dimethyl acetal, tetrahydro-2-phenoxy-2H-pyran, 1,2-dimethoxy-4-(1-propenyl)benzene, 1,4-benzodioxane, 1,3-dipropylbenzene, 2,5-dimethoxytoluene, 4-ethylphenetole, 1,2,4-trimethoxybenzene, 4-(1-propenyl)-1,2-dimethoxybenzene, 1,3-dimethoxybenzene, glycidyl phenyl ether, dibenzyl ether, 4-tert-butylanisole, trans-p-propenyl anisole, 1,2-dimethoxybenzene, 1-methoxynaphthalene, diphenyl ether, 2-phenoxymethyl ether, 2-phenoxytetrahydrofuran, and ethyl-2-naphthyl ether.

In an embodiment, the aromatic ether solvent is 3-phenoxytoluene.

In an embodiment, at least one of the two organic solvents comprised in the formulation is an organic solvent based on an ester.

The ester solvent is selected from the group consisting of alkyl octanoate, alkyl sebacate, alkyl stearate, alkyl benzoate, alkyl phenylacetate, alkyl cinnamate, alkyl oxalate, alkyl maleate, alkyl lactone, alkyl oleate, and the like.

In some embodiments, the ester solvent is octyl octanoate or diethyl sebacate.

In other embodiments, at least one of the two organic solvents comprised in the printing ink formulation is selected from aliphatic ketone solvents.

In other embodiments, at least one of the two organic solvents comprised in the printing ink formulation is selected from aliphatic ether solvents.

The aliphatic ketone organic solvent may be selected from the group consisting of 2-nonanone, 3-nonanone, 5-nonanone, 2-decanone, 2,5-hexanedione, 2,6,8-trimethyl-4-nonanone, phorone, di-n-pentyl ketone, or the like.

The aliphatic ether organic solvent may be selected from the group consisting of pentyl ether, hexyl ether, dioctyl ether, ethylene glycol dibutyl ether, diethylene glycol diethyl ether, diethylene glycol butyl methyl ether, diethylene glycol dibutyl ether, triethylene glycol dimethyl ether, triethylene glycol ethyl methyl ether, triethylene glycol butyl methyl ether, tripropylene glycol dimethyl ether, tetraethylene glycol dimethyl ether or the like.

In still other embodiments, at least one of the two organic solvents comprised in the printing ink formulation is selected from alicyclic solvents.

The cycloaliphatic solvent is selected from the group consisting of tetrahydronaphthalene, cyclohexylbenzene, decahydronaphthalene, 2-phenoxytetrahydrofuran, 1,1'-bicyclohexane, butylcyclohexane, ethyl rosinate, benzyl rosinate, ethylene glycol carbonate, styrene oxide, isophorone, 3,3,5-trimethylcyclohexanone, cycloheptanone, fenchone, 1-tetralone, 2-tetralone, 2-(phenyl epoxy)tetralone, 6-(methoxy)tetralone, γ-butyrolactone, γ-valerolactone, 6-caprolactone, N,N-diethyl cyclohexylamine, sulfolane, and 2,4-dimethyl sulfolane.

In an embodiment, at least one of the two organic solvents comprised in the printing ink formulation is selected from inorganic ester solvents.

The inorganic ester solvent is selected from the group consisting of tributyl borate, tripentyl borate, trimethyl phosphate, triethyl phosphate, tributyl phosphate, tris(2-ethylhexyl) phosphate, triphenyl phosphate, diethyl phosphate, dibutyl phosphate, di(2-ethylhexyl)phosphate, or the like.

Compared with the conventional solvents (such as toluene, xylene, chloroform, chlorobenzene, dichlorobenzene, n-heptane, etc.) for dissolving functional materials, the above solvent systems containing at least two organic solvents may more effectively dissolve the functional materials without adding an additive, and may also effectively prevent the occurrence of "coffee ring effect", so that a film having uniform thickness and a strong electron transmission capability can be obtained, which is suitable for use in photovoltaic devices.

The parameters of boiling point, surface tension and viscosity of some of the above solvent examples are listed below, but are not limited thereto:

| name | Structural formula | Boiling point (° C.) | Surface tension @RT (dyne/cm) | Viscosity @RT (cPs) |
|---|---|---|---|---|
| 1-tetralone | 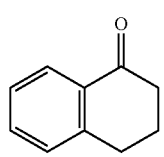 [SMILES: O=C1CCCc2ccccc21] | 256 | 42 | 8.6 |

-continued

| name | Structural formula | Boiling point (° C.) | Surface tension @RT (dyne/cm) | Viscosity @RT (cPs) |
|---|---|---|---|---|
| 3-phenoxytoluene | | 272 | 37.4 | 5 |
| acetophenone | | 202 | 39 | 1.6 |
| 1-methoxynaphthalene | | 270 | 43 | 7.2 |
| p-diisopropylbenzene | | 210 | 28.3 | 1.2 |
| pentylbenzene | | 205 | 30.4 | 1.3 |
| tetrahydronaphthalene | | 207 | 35.9 | 2 |
| cyclohexylbenzene | | 238 | 34 | 4 |
| chloronaphthalene | | 260 | 43 | 3 |
| 1,4-dimethylnaphthalene | | 268 | 40 | 6 |
| 3-isopropylbiphenyl | | 296 | 34 | 9 |

-continued

| name | Structural formula | Boiling point (° C.) | Surface tension @RT (dyne/cm) | Viscosity @RT (cPs) |
|---|---|---|---|---|
| p-methyl cumene | | 177 | 28.8 | 3.4 |
| dipentylbenzene | | 255-280 | 30 | 4.7 |
| o-diethylbenzene | | 183 | 30 | 3.8 |
| m-diethylbenzene | | 181 | 29 | 1.24 |
| p-diethylbenzene | | 183 | 29 | 3.6 |
| 1,2,3,4-tetramethylbenzene | | 205 | 29 | 2 |
| 1,2,3,5-tetramethylbenzene | | 205 | 29 | 2 |
| 1,2,4,5-tetramethylbenzene | | 197 | 29 | 2 |
| butylbenzene | $C_4H_9$ | 183 | 29.23 | 1 |
| dodecylbenzene | $C_{12}H_{25}$ | 331 | 30.12 | 5.4 |

-continued

| name | Structural formula | Boiling point (° C.) | Surface tension @RT (dyne/cm) | Viscosity @RT (cPs) |
| --- | --- | --- | --- | --- |
| 1-methylnaphthalene | | 240 | 38 | 3 |
| 1,2,4-trichlorobenzene | | 214 | 31 | 1.6 |
| diphenyl ether | | 257 | 38 | 3.5 |
| diphenylmethane | | 265 | 37 | 1.5 |
| 4-isopropylbiphenyl | | 298 | 34 | 9 |
| benzyl benzoate | | 324 | 44 | 8.3 |
| 1,1-bis(3,4-dimethylphenyl)ethane | | 333 | 34 | 10 |
| 2-isopropylnaphthalene | | 268 | 36 | 4 |
| dibenzyl ether | | 298 | 39 | 8.7 |
| octyl octanoate | | 307 | 30.1 | 4.56 |
| diethyl sebacate | | 312 | 32.9 | 6 |

-continued

| name | Structural formula | Boiling point (° C.) | Surface tension @RT (dyne/cm) | Viscosity @RT (cPs) |
|---|---|---|---|---|
| diallyl phthalate | | 290 | 39.2 | 9~13 |
| isononyl isononanoate | | 285 | 27.8 | 7 |
| decahydronaphthalene | | 196 | 29 | 3.4 |
| 1,1'-bicyclohexane | | 239 | 33 | 3.75 |
| butylcyclohexane | | 181 | 27 | 1.2 |
| butyrolactone | | 204 | 35 | 1.7 |
| ethylene glycol carbonate | | 238 | 37 | 2 |
| styrene oxide | | 194 | 43 | 2 |
| isophorone | | 215 | 32 | 2.6 |
| cycloheptanone | | 181 | 31.5 | 2.6 |
| fenchone | | 193 | 31 | 3.6 |

-continued

| name | Structural formula | Boiling point (° C.) | Surface tension @RT (dyne/cm) | Viscosity @RT (cPs) |
|---|---|---|---|---|
| □-valerolactone | | 207 | 29 | 3.4 |
| 6-caprolactone | | 215 | 32 | 1.1 |
| sulfolane | | 287 | 35 | 10 |
| 2,4-dimethyl sulfolane | | 280 | 28 | 7.9 |
| quinoline | | 237 | 45 | 4.3 |
| isoquinoline | | 243 | 46 | 3.3 |
| tributyl borate | | 234 | 24.5 | 1.2 |
| tripentyl borate | | 275 | 27.3 | 2.88 |
| triethyl phosphate | | 215 | 30.2 | 1.6 |
| triphenyl phosphate | | 245 | 40 | 11 |

The embodiments of the dual solvent system are shown in the following table, but not limited thereto.

| First solvent | Second solvent | Weight ratio |
|---|---|---|
| quinoline | 1-tetralone | 40:60 to 80:20 |
| isoquinoline |  | 40:60 to 80:20 |
| chloronaphthalene | 3-phenoxytoluene | 40:60 to 80:20 |
| styrene oxide |  | 40:60 to 80:20 |
| quinoline |  | 40:60 to 80:20 |
| isoquinoline |  | 40:60 to 80:20 |
| 3-phenoxytoluene | 3-isopropylbiphenyl | 40:60 to 80:20 |
| acetophenone |  | 40:60 to 80:20 |
| tetrahydronaphthalene |  | 40:60 to 80:20 |
| chloronaphthalene |  | 40:60 to 80:20 |
| 1,4-dimethylnaphthalene |  | 40:60 to 80:20 |
| 1-methylnaphthalene |  | 40:60 to 80:20 |
| diphenyl ether |  | 40:60 to 80:20 |
| diphenylmethane |  | 40:60 to 80:20 |
| 2-isopropylnaphthalene |  | 40:60 to 80:20 |
| styrene oxide |  | 40:60 to 80:20 |
| quinoline |  | 40:60 to 80:20 |
| isoquinoline |  | 40:60 to 80:20 |
| 3-phenoxytoluene | isononyl isononanoate | 40:60 to 80:20 |
| acetophenone |  | 40:60 to 80:20 |
| pentylene |  | 40:60 to 80:20 |
| tetrahydronaphthalene |  | 40:60 to 80:20 |
| cyclohexylbenzene |  | 40:60 to 80:20 |
| chloronaphthalene |  | 40:60 to 80:20 |
| o-diethylbenzene |  | 40:60 to 80:20 |
| dodecylbenzene |  | 40:60 to 80:20 |
| diphenyl ether |  | 40:60 to 80:20 |
| diphenylmethane |  | 40:60 to 80:20 |
| 2-isopropylbenzene |  | 40:60 to 80:20 |
| octyl octanoate |  | 40:60 to 80:20 |
| 1,1-bicyclohexane |  | 40:60 to 80:20 |
| butyrolactone |  | 40:60 to 80:20 |
| isophorone |  | 40:60 to 80:20 |
| cycloheptanone |  | 40:60 to 80:20 |
| triethyl phosphate |  | 40:60 to 80:20 |
| 3-phenoxytoluene | sulfolane | 40:60 to 80:20 |
| acetophenone |  | 40:60 to 80:20 |
| chloronaphthalene |  | 40:60 to 80:20 |
| 1,4-dimethylnaphthalene |  | 40:60 to 80:20 |
| 1-methylnaphthalene |  | 40:60 to 80:20 |
| diphenyl ether |  | 40:60 to 80:20 |
| ethylene glycol carbonate |  | 40:60 to 80:20 |
| quinoline |  | 40:60 to 80:20 |
| isoquinoline |  | 40:60 to 80:20 |
| acetophenone | dodecylbenzene | 40:60 to 80:20 |
| tetrahydronaphthalene |  | 40:60 to 80:20 |
| chloronaphthalene |  | 40:60 to 80:20 |
| 1-methylnaphthalene |  | 40:60 to 80:20 |
| diphenylmethane |  | 40:60 to 80:20 |
| butyrolactone |  | 40:60 to 80:20 |
| isophorone |  | 40:60 to 80:20 |
| isoquinoline |  | 40:60 to 80:20 |
| 3-phenoxytoluene | 2,4-dimethyl sulfolane | 40:60 to 80:20 |
| acetophenone |  | 40:60 to 80:20 |
| pentylene |  | 40:60 to 80:20 |
| cyclohexylbenzene |  | 40:60 to 80:20 |
| chloronaphthalene |  | 40:60 to 80:20 |
| diethylbenzene |  | 40:60 to 80:20 |
| xylene |  | 40:60 to 80:20 |
| dichlorobenzene |  | 40:60 to 80:20 |
| dodecylbenzene |  | 40:60 to 80:20 |
| trichlorobenzene |  | 40:60 to 80:20 |
| diphenyl ether |  | 40:60 to 80:20 |
| diphenylmethane |  | 40:60 to 80:20 |
| 2-isopropylnaphthalene |  | 40:60 to 80:20 |
| 1,1-bicyclohexane |  | 40:60 to 80:20 |
| butyrolactone |  | 40:60 to 80:20 |
| cycloheptanone |  | 40:60 to 80:20 |
| quinoline |  | 40:60 to 80:20 |
| isoquinoline |  | 40:60 to 80:20 |
| triethyl phosphate |  | 40:60 to 80:20 |

In an embodiment, the second solvent is 1-tetralone and the first solvent is quinoline.

In an embodiment, the second solvent is 3-phenoxytoluene and the first solvent is chloronaphthalene.

In an embodiment, the second solvent is 3-isopropylbiphenyl and the first solvent is acetophenone.

In an embodiment, the second solvent is isononyl isononanoate and the first solvent is pentylbenzene.

In an embodiment, the second solvent is sulfolane and the first solvent is 3-phenoxytoluene.

In an embodiment, the second solvent is dodecylbenzene and the first solvent is tetrahy dronaphthalene.

In other embodiments, the solvent comprising the two organic solvents further comprises another organic solvent selected from the group consisting of methanol, ethanol, 2-methoxyethanol, dichloromethane, trichloromethane, chlorobenzene, o-dichlorobenzene, tetrahydrofuran, anisole, morpholine, toluene, o-xylene, m-xylene, p-xylene, 1,4-dioxane, acetone, methyl ethyl ketone, 1,2-dichloroethane, 3-phenoxytoluene, 1,1,1-trichloroethane, 1,1,2,2-tetrachloroethane, ethyl acetate, butyl acetate, dimethylformamide, dimethylacetamide, dimethyl sulfoxide, tetrahydronaphthalene, decalin, indene, and/or mixtures thereof.

The printing ink formulation may further comprise one or more other components, such as a surfactant compound, a lubricant, a wetting agent, a dispersant, a hydrophobic agent, a binder, to adjust the viscosity and the film forming property and to improve the adhesion property.

The printing ink formulation can be deposited into a functional film by a variety of printing or coating techniques. The appropriate printing technology or coating technology includes, but is not limited to inkjet printing, nozzle printing, typography, screen printing, dip coating, spin coating, blade coating, roller printing, twist roller printing, lithography, flexography, rotary printing, spray coating, brush coating or transfer printing, or slot die coating, and the like. Further, printing techniques are inkjet printing, nozzle printing and gravure printing. For more information about printing technologies and relevant requirements thereof on related inks, such as solvents and concentration, viscosity, etc., see Helmut Kipphan, et al., Handbook of Print Media: Technologies and Production Methods, ISBN 3-540-67326-1, edited by Helmut Kipphan. In general, different printing techniques have different requirements for the characteristics of the inks used. For example, a printing ink suitable for inkjet printing require adjustment of the surface tension, viscosity and wettability of the ink so that the ink can be sprayed through the nozzle well at the printing temperature (such as room temperature, 25° C.) without drying on the nozzle or clogging the nozzle, or can form a continuous, flat and defect-free film on a specific substrate.

A printing ink formulation according to the present disclosure comprises at least one functional material.

The functional material may be an organic material or an inorganic material.

The viscosity can also be adjusted by adjusting the concentration of the functional material in the formulation. The solvent system of the present disclosure comprising at least two organic solvents can facilitate the adjustment of the printing ink in an appropriate range according to the printing method used.

In an embodiment, the weight ratio of the functional material in the formulation is from 0.3 wt % to 30 wt %;

In an embodiment, the weight ratio of the functional material in the formulation is from 0.5 wt % to 20 wt %;

In an embodiment, the weight ratio of the functional material in the formulation is from 0.5 wt % to 15 wt %;

In an embodiment, the weight ratio of the functional material in the formulation is from 0.5 wt % to 10 wt %.

In an embodiment, the functional material can be a material having some optoelectronic functions including, but not limited to, a hole injection function, a hole transport function, an electron transport function, an electron injection function, an electron blocking function, a hole blocking function, a light emitting function, a host function and a light absorption function. The corresponding functional materials are referred to as a hole injection material (HIM), hole transport material (HTM), electron transport material (ETM), electron injection material (EIM), electron blocking material (EBM), hole blocking material (HBM), emitter, host material, and organic dye.

In an embodiment, the functional material comprised in the printing ink formulation is an inorganic nanomaterial.

In an embodiment, the inorganic nanomaterial in the printing ink formulation is an inorganic semiconductor nanoparticle material.

In an embodiment, the inorganic nanomaterial has an average particle size in the range from about 1 to 1000 nm. In another embodiment, the inorganic nanomaterial has an average particle size in the range from about 1 to 100 nm. In another embodiment, the inorganic nanomaterial has an average particle size in the range from about 1 to 20 nm. In another embodiment, the inorganic nanomaterial has an average particle size in the range from about 1 to 10 nm.

The inorganic nanomaterial may be in different shapes, and may have different nanotopography such as a sphere, a cube, a rod, a disk or a branched structure, and may be a mixture of particles of various shapes.

In an embodiment, the inorganic nanomaterial is a quantum dot material having a very narrow, monodisperse size distribution, i.e., the size difference between the particles is very small. Further, the root mean square deviation in the size of the monodisperse quantum dots is less than 15% rms; still further, the root mean square deviation in the size of the monodisperse quantum dots is less than 10% rms; even further, the root mean square deviation in the size of the monodisperse quantum dots is less than 5% rms.

In an embodiment, the inorganic nanomaterial is a light-emitting material.

In an embodiment, the light-emitting inorganic nanomaterial is a quantum dot light-emitting material.

Light-emitting quantum dots can emit light at wavelengths between 380 nanometers and 2500 nanometers. For example, the quantum dots with CdS cores have an emission wavelength in the range of about 400 nm to 560 nm; the quantum dots with CdSe cores have an emission wavelength in the range of about 490 nm to 620 nm; the quantum dots with CdTe cores have an emission wavelength in the range of about 620 nm to 680 nm; the quantum dots with InGaP cores have emission wavelengths in the range of about 600 nanometers to 700 nanometers; the quantum dots with PbS cores have emission wavelengths in the range of about 800 nanometers to 2500 nanometers; the quantums with PbSe cores have emission wavelength in the range of about 1200 nm to 2500 nm; the quantums with CuInGaS cores have emission wavelength in the range of about 600 nm to 680 nm; the quantums with ZnCuInGaS cores have emission wavelength in the range of about 500 nm to 620 nm; the quantums with CuInGaSe cores have emission wavelength in the range of about 700 nm to 1000 nm.

In an embodiment, the quantum dot materials comprise blue light having a peak emission wavelength from 450 nm to 460 nm, or a green light having a peak emission wavelength from 520 nm to 540 nm, or a red light having a peak emission wavelength from 615 nm to 630 nm, or mixtures thereof.

The quantum dots contained can be selected from those of particular chemical formulations, topographical structures, and/or size dimensions to obtain light that emits a desired wavelength under electric excitation. The relationship between the luminescent properties of quantum dots and their chemical formulation, morphology structure and/or size dimensions can be found in Annual Review of Material Sci., 2000, 30, 545-610; Optical Materials Express., 2012, 2, 594-628; Nano Res, 2009, 2, 425-447. The entirety of the patent documents listed above are hereby incorporated herein by reference.

The narrow particle size distribution of quantum dots enables quantum dots to have a narrower luminescence spectrum (J. Am. Chem. Soc., 1993, 115, 8706; US 20150108405). In addition, depending on the chemical formulation and structure used, the size of the quantum dots needs to be adjusted within the above-mentioned size range to obtain the luminescent properties of the desired wavelength.

In an embodiment, the light-emitting quantum dots are semiconductor nanocrystals. In an embodiment, the size of the semiconductor nanocrystals is in the range of about 2 nanometers to about 15 nanometers. In addition, depending on the chemical formulation and structure used, the size of the quantum dots needs to be adjusted within the above-mentioned size range to obtain the luminescent properties of the desired wavelength.

The semiconductor nanocrystals include at least one semiconductor material, wherein the semiconductor material may be selected from binary or multiple semiconductor compounds or mixtures thereof of Group IV, II-VI, II-V, III-V, III-VI, IV-VI, I-III-VI, II-IV-VI, II-IV-V of the periodic table.

The semiconductor material may be selected from the group consisting of group IV semiconductor compounds composed of elemental Si, Ge, and binary compounds SiC, SiGe; or group II-VI semiconductor compounds composed of binary compounds including CdSe, CdTe, and CdO, CdS, CdSe, ZnS, ZnSe, ZnTe, ZnO, HgO, HgS, HgSe, HgTe, and ternary compounds include CdSeS, CdSeTe, CdSTe, CdZnS, CdZnSe, CdZnTe, CgHgS, CdHgSe, ZnSeS, ZnSeTe, ZnSTe, HgSeS, HgSeTe HgSTe, HgZnS, HgSeSe, and quaternary compounds include CgHgSeS, CdHgSeTe, CgHgSTe, CdZnSeS, CdZnSeTe, HgZnSeTe, HgZnSTe, CdZnSTe, HgZnSeS; or group III-V semiconductor compounds composed of binary compounds including AlN, AlP, AlAs, AlSb, GaN, GaP, GaAs, GaSb, InN, InP, InAs, InSb, and ternary compounds including AlNP, AlNAs, AlNSb, AlPAs, AlPSb, GaNP, GaNAs, GaNSb, GaPAs, GaPSb, InNP, InNAs, InNSb, InPAs, InPSb, and quaternary compounds include GaAlNAs, GaAlNSb, GaAlPAs, GaInNP, GaInNAs, GaInNSb, GaInPAs, GaInPSb, InAlNP, InAlNAs, InAlNSb, InAlPAs, InAlPSb; or group IV-VI semiconductors compounds composed of binary compounds including SnS, SnSe, SnTe, PbSe, PbS, PbTe, and ternary compounds including SnSeS, SnSeTe, SnSTe, SnPbS, SnPbSe, SnPbTe, PbSTe, PbSeS, PbSeTe, and quaternary compounds including SnPbSSe, SnPbSeTe, SnPbSTe.

In an embodiment, the light-emitting quantum dots comprise group II-VI semiconductor materials, particularly are selected from the group consisting of CdSe, CdS, CdTe, ZnO, ZnSe, ZnS, ZnTe, HgS, HgSe, HgTe, CdZnSe and any combination thereof. In an embodiment, the synthesis of CdSe, CdS is relatively mature and these materials are used as light-emitting quantum dots for visible light.

In another embodiment, the light-emitting quantum dots comprise group III-V semiconductor materials, further are selected from the group consisting of InAs, InP, InN, GaN, InSb, InAsP, InGaAs, GaAs, GaP, GaSb, AlP, AlN, AlAs, AlSb, CdSeTe, ZnCdSe, and any combination thereof.

In another embodiment, the light-emitting quantum dots comprise group IV-VI semiconductor material, further are selected from the group consisting of PbSe, PbTe, PbS, PbSnTe, $Tl_2SnTe_5$, and any combination thereof.

In an embodiment, the quantum dot is in a core-shell structure. The core and the shell respectively include the same or different one or more semiconductor materials.

The core of the quantum dot may be selected from the group consisting of a binary or multiple semiconductor compounds or mixtures thereof of Group IV, II-VI, II-V, III-V, III-VI, IV-VI, I-III-VI, II-IV-VI, II-IV-V of the periodic table. Specific examples for the core of the quantum dot comprise: ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InSb, AlAs, AlN, AlP, AlSb, PbO, PbS, PbSe, PbTe, Ge, Si, and an alloy or mixture of any combination thereof.

The shell of the quantum dot contains a semiconductor material that is the same as or different from the core. The semiconductor materials that can be used for the shell include binary or multiple semiconductor compounds or mixtures thereof of Group IV, II-VI, II-V, III-V, III-VI, IV-VI, I-III-VI, II-IV-VI, II-IV-V of the periodic table. Specific examples for the core of the quantum dot comprise: ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InSb, AlAs, AlN, AlP, AlSb, PbO, PbS, PbSe, PbTe, Ge, Si, and an alloy or mixture of any combination thereof.

In a quantum dot with a core-shell structure, the shell may include a monolayer or a multilayer structure. The shell includes one or more semiconductor materials that are the same or different from the core. In an embodiment, two or more shells are comprised on the surface of a quantum dot core. In an embodiment, the shell has a thickness from about 1 to 20 layers. In a further embodiment, the shell has a thickness from about 5 to 10 layers.

In an embodiment, the semiconductor material used for the shell has a larger bandgap than the core. Preferably, the core and the shell has a structure with type I semiconductor heterojunction.

In another embodiment, the semiconductor material used for the shell has a smaller bandgap than the core.

In an embodiment, the semiconductor material used for the shell has an atomic crystal structure that is the same as or similar to that of the core. Such selection is beneficial to reduced the stress between the core and shell, making the quantum dots more stable.

Examples of light-emitting quantum dots using suitable core-shell structures are (but not limited to):
red light: CdSe/CdS, CdSe/CdS/ZnS, CdSe/CdZnS, etc.
green light: CdZnSe/CdZnS, CdSe/ZnS, etc.
blue light: CdS/CdZnS, CdZnS/ZnS, etc.

In an embodiment, the method for preparing the quantum dots is a gelatinous growth method. In an embodiment, the method for preparing monodisperse quantum dots is selected from hot-inject and/or heating-up. The preparation method is contained in the document Nano Res, 2009, 2, 425-447; Chem. Mater., 2015, 27 (7), pp 2246-2285. The entirety of the documents listed above are hereby incorporated herein by reference.

In an embodiment, an organic ligand is comprised on the surface of the quantum dot. The organic ligands can control the growth process of quantum dots, regulate the appearance of quantum dots and reduce surface defects of quantum dots to improve the luminous efficiency and stability of quantum dots. The organic ligand may be selected from the group consisting of pyridine, pyrimidine, furan, amine, alkylphosphine, alkylphosphine oxide, alkylphosphonic acid or alkylphosphinic acid, alkyl mercaptan and the like. Specific examples of organic ligands include, but are not limited to, tri-n-octylphosphine, tri-n-octylphosphine oxide, trihydroxypropylphosphine, tributylphosphine, tris(dodecyl) phosphine, dibutyl phosphite, tributyl phosphite, octadecyl phosphite, trilauryl phosphite, tris(dodecyl)phosphite, triisodecyl phosphite, bis(2-ethylhexyl)phosphate, tris(tridecyl) phosphate, hexadecylamine, oleylamine, octadecylamine, bisoctadecylamine, trioctadecylamine, bis(2-ethylhexyl) amine, octylamine, dioctylamine, trioctylamine, dodecylamine, bisdodecylamine, tridodecylamine, hexadecylamine, phenylphosphoric acid, hexylphosphoric acid, tetradecylphosphoric acid, octylphosphoric acid, n-octadecylphosphoric acid, propylene diphosphate, dioctyl ether, diphenyl ether, octyl mercaptan or dodecyl mercaptan.

In another embodiment, an inorganic ligand is comprised on the surface of the quantum dot. Quantum dots protected by the inorganic ligands can be obtained by ligand exchange of organic ligands on the surface of quantum dots. Examples of specific inorganic ligands include, but are not limited to: $S^{2-}$, $HS^-$, $Se^{2-}$, $HSe^-$, $Te^{2-}$, $HTe^-$, $TeS_3^{2-}$, $OH^-$, $NH_2^-$, $PO_4^{3-}$, $MoO_4^{2-}$, and so on. Examples of such inorganic ligand quantum dots can be found in J. Am. Chem. Soc. 2011, 133, 10612-10620; ACS Nano, 2014, 9, 9388-9402. The entirety of the documents listed above are hereby incorporated herein by reference.

In some embodiments, one or more of the same or different ligands are present on the surface of the quantum dot.

In an embodiment, the luminescence spectrum exhibited by the monodisperse quantum dots has a symmetrical peak shape and a narrow peak width at half height. In general, the better the monodispersity of quantum dots is, the more symmetric the luminescence peak is and the narrower the peak width at half height is. Particularly, the quantum dots have a peak width at half height of light emission of less than 70 nanometers; further, the quantum dots have a peak width at half height of light emission of less than 40 nanometers; still further, the quantum dots have a peak width at half height of light emission of less than 30 nanometers.

In an embodiment, the quantum dots have a luminescence quantum efficiency of greater than 10%; in an embodiment, the quantum dots have a luminescence quantum efficiency of greater than 50%; in an embodiment, the quantum dots have a luminescence quantum efficiency of greater than 60%; in an embodiment, the quantum dots have a luminescence quantum efficiency of greater than 70%.

Other materials, techniques, methods, applications and other information related to quantum dots useful for the present disclosure are described in the following patent documents: WO2007/117698, WO2007/120877, WO2008/108798, WO2008/105792, WO2008/111947, WO2007/092606, WO2007/117672, WO2008/033388, WO2008/085210, WO2008/13366, WO2008/063652, WO2008/063653, WO2007/143197, WO2008/070028, WO2008/063653, U.S. Pat. Nos. 6,207,229, 6,251,303, 6,319,426, 6,426,513, 6,576,291, 6,607,829, 6,861,155, 6,921,496, 7,060,243, 7,125,605, 7,138,098, 7,150,910, 7,470,379, 7,566,476, WO2006134599A1. The entirety of the patent documents listed above are hereby incorporated herein by reference.

In another embodiment, the light-emitting semiconductor nanocrystals are nanorods. The properties of the nanorods are different from those of spherical nanocrystals. For example, the luminescence of nanorods is polarized along the long rod axis, while the luminescence of spherical grains is unpolarized (see Woggon et al, Nano Lett., 2003, 3, p 509). Nanorods have excellent optical gain characteristics that make them useful as a laser gain material (see Banin et al. Adv. Mater. 2002, 14, p 317). In addition, the luminescence of the nanorods can be reversibly turned on and off under the control of an external electric field (see Banin et al., Nano Lett. 2005, 5, p 1581). These characteristics of the nanorods can be preferentially incorporated into the device of the present disclosure under some circumstances. Examples of the preparation of the semiconductor nanorods are disclosed in WO03097904A1, US2008188063A1, US2009053522A1, and KR20050121443A. The entirety of the patent documents listed above are hereby incorporated herein by reference.

In another embodiment, in the formulation according to the disclosure, the inorganic nanomaterial is perovskite nanoparticle material, in particular light-emitting perovskite nanoparticle material.

The perovskite nanoparticle material has the general structural formula of $AMX_3$, wherein A may be selected from an organic amine or an alkali metal cation, M may be selected from a metal cation, and X may be selected from an oxygen or a halogen anion. Specific examples include, but are not limited to $CsPbCl_3$, $CsPb(Cl/Br)_3$, $CsPbBr_3$, $CsPb(I/Br)_3$, $CsPbI_3$, $CH_3NH_3PbCl_3$, $CH_3NH_3Pb(Cl/Br)_3$, $CH_3NH_3PbBr_3$, $CH_3NH_3Pb(I/Br)_3$, $CH_3NH_3PbI_3$, and the like. The literatures on perovskite nanoparticle materials comprise Nano Lett., 2015, 15, 3692-3696; ACS Nano, 2015, 9, 4533-4542; Angewandte Chemie, 2015, 127(19): 5785-5788; Nano Lett., 2015, 15 (4), pp 2640-2644; Adv. Optical Mater. 2014, 2, 670-678; The Journal of Physical Chemistry Letters, 2015, 6(3): 446-450; J. Mater. Chem. A, 2015, 3, 9187-9193; Inorg. Chem. 2015, 54, 740-745; RSC Adv., 2014, 4, 55908-55911; J. Am. Chem. Soc., 2014, 136 (3), pp 850-853; Part. Part. Syst. Charact. 2015, doi: 10.1002/ppsc.201400214; Nanoscale, 2013, 5(19): 8752-8780. The entirety of the patent documents listed above are hereby incorporated herein by reference.

In another embodiment, in the formulation according to the disclosure, the inorganic nanomaterial is a metal nanoparticle material, particularly a light-emitting metal nanoparticle material.

The metal nanoparticles include, but are not limited to, nanoparticles of chromium (Cr), molybdenum (Mo), tungsten (W), ruthenium (Ru), rhodium (Rh), nickel (Ni), silver (Ag), copper (Cu), zinc (Zn), palladium (Pd), gold (Au), osmium (Os), rhenium (Re), iridium (Ir), and platinum (Pt). The types, morphologies and synthetic methods of common metal nanoparticles can be found in Angew. Chem. Int. Ed. 2009, 48, 60-103; Angew. Chem. Int. Ed. 2012, 51, 7656-7673; Adv. Mater. 2003, 15, No. 5, 353-389; Adv. Mater. 2010, 22, 1781-1804; Small. 2008, 3, 310-325; Angew. Chem. Int. Ed. 2008, 47, 2-46 and the like, and the literatures cited therein. The entirety of the patent documents listed above are hereby incorporated herein by reference.

In another embodiment, the inorganic nanomaterial has charge transporting property.

In an embodiment, the inorganic nanomaterial has electron transporting capability. Further, such an inorganic nanomaterial is selected from n-type semiconductor materials. Examples of n-type inorganic semiconductor materials include, but are not limited to, metal chalcogen compounds, metal phosphorus family compounds, or elemental semiconductors, such as metal oxides, metal sulfides, metal selenides, metal tellurides, metal nitrides, metal phosphide, or metal arsenide. The preferred n-type inorganic semiconductor material is selected from the group consisting of ZnO, ZnS, ZnSe, $TiO_2$, ZnTe, GaN, GaP, AlN, CdSe, CdS, CdTe, CdZnSe, and any combination thereof.

In some embodiments, the inorganic nanomaterial has a hole transporting capability. Further, such inorganic nanomaterials are selected from p-type semiconductor materials. The inorganic p-type semiconductor material may be selected from the group consisting of NiOx, WOx, MoOx, RuOx, VOx, CuOx, and any combination thereof.

In an embodiment, a printing ink formulation comprises at least two or more inorganic nanomaterials.

In another embodiment, a formulation comprises at least one organic functional material.

The organic functional materials comprise the hole (also known as electronic hole) injection or the transport materials (HIM/HTM), the hole blocking materials (HBM), the electron injection or transport materials (EIM/ETM), the electron blocking materials (EBM), the organic host materials, the singlet emitters (fluorescent emitters), the thermal activated delayed fluorescent material (TADF) and the triplet emitters (phosphorescence emitters), particularly the luminescent organometallic complexes and the organic dyes. Various organic functional materials are described in detail, for example, in WO2010135519A1, US20090134784A1, and WO2011110277A1, the entire contents of which are hereby incorporated herein by reference.

In an embodiment, the organic functional material has a solubility in the above solvent of at least 0.2 wt %;

In an embodiment, the organic functional material has a solubility in the above solvent of at least 0.3 wt %;

In an embodiment, the organic functional material has a solubility in the above solvent of at least 0.6 wt %;

In an embodiment, the organic functional material has a solubility in the above solvent of at least 1.0 wt %;

In an embodiment, the organic functional material has a solubility in the above solvent of at least 1.5 wt %.

The organic functional material may be a small molecule material or a high polymer material. In the present disclosure, the small molecule organic material means a material having a molecular weight of at most 4000 g/mol, and a material having a molecular weight higher than 4000 g/mol is collectively referred to as a high polymer.

In an embodiment, the functional material comprised in a printing ink formulation is an organic small molecule material.

In an embodiment, the organic functional material in a printing ink formulation comprises at least one host material and at least one emitter.

In an embodiment, the organic functional material in a printing ink formulation comprises a host material and a singlet emitter.

In another embodiment, the organic functional material in a printing ink formulation comprises a host material and a triplet emitter.

In another embodiment, the organic functional material in a printing ink formulation comprises a host material and a thermal activated delayed fluorescent material.

In other embodiments, the organic functional material in a printing ink formulation comprises a hole transport material (HTM).

In other embodiments, the organic functional material in a printing ink formulation comprises a hole transport material (HTM), and the HTM comprising a crosslinkable group.

The organic small molecule functional materials described in the appropriate preferred embodiments will be described in some detail below (but are not limited thereto).

1. HIM/HTM/EBM

Suitable organic HIM/HTM materials may be selected from the compounds containing the following structural units: phthalocyanine, porphyrin, amine, aromatic amine, biphenyl triarylamine, thiophene, fused thiophene such as dithienothiophene and bithiophene, pyrrole, aniline, carbazole, indolocarbazole, and derivatives thereof. In addition, suitable HIMs also include fluorocarbon-containing polymers, conductivity-doped polymers, conductive polymers such as PEDOT:PSS.

The electron blocking layer (EBL) is used to block electrons from the adjacent functional layers, particularly the light emitting layers. The presence of the EBL generally leads to an increase in luminous efficiency, comparing to a light emitting device without the blocking layer. The electron blocking material (EBM) of the electron blocking layer (EBL) requires a higher LUMO than the adjacent functional layer such as light emitting layer.

In an embodiment, EBM has a larger excited state energy level such as singlet state or triplet state than the adjacent light emitting layer, depending on the emitter; at the same time, the EBM has a hole transport function. Generally, HIM/HTM materials, which have high LUMO energy level, can be used as EBM.

Examples of derivative compounds of cyclic aromatic amines that can be used as HIM, HTM, or EBM, include but are not limited to the following general structures:

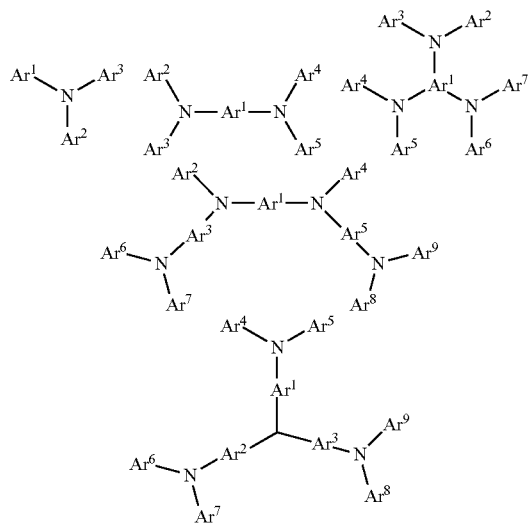

Each of $Ar^1$ to $Ar^9$ may be independently selected from the group consisting of cyclic aromatic hydrocarbon compound such as benzene, biphenyl, triphenyl, benzo, naphthalene, anthracene, phenalene, phenanthrene, fluorene, pyrene, chrysene, perylene, azulene; and aromatic heterocycle compound such as dibenzothiophene, dibenzofuran, furan, thiophene, benzofuran, benzothiophene, carbazole, pyrazole, imidazole, triazole, isoxazole, thiazole, oxadiazole, oxytriazole, dioxazole, thiadiazole, pyridine, pyridazine, pyrimidine, pyrazine, triazine, oxazine, oxathiazine, oxadiazine, indole, benzimidazole, indazole, indolizine, benzoxazole, benzisoxazole, benzothiazole, quinoline, isoquinoline, cinnoline, quinazoline, quinoxaline, naphthalene, phthalein, pteridine, xanthene, acridine, phenazine, phenothiazine, phenoxazine, dibenzoselenophene, benzoselenophene, benzofuropyridine, indolocarbazole, pyridylindole, pyrrolodipyridine, furodipyridine, benzothieopyridine, thienopyridine, benzoselenophenepyridine and selenophenodipyridine; and groups containing 2 to 10 ring structures, which may be the same or different types of cyclic aromatic hydrocarbyl groups or aromatic heterocyclic groups, and linked to each other directly or through at least one of the following groups: such as oxygen atom, nitrogen atom, sulfur atom, silicon atom, phosphorus atom, boron atom, chain structure unit, and aliphatic ring group. Wherein, each Ar may be further substituted, the substituent may be selected from the group consisting of hydrogen, alkyl, alkoxy, amino, alkenyl, alkynyl, aralkyl, heteroalkyl, aryl and heteroaryl.

In one aspect, $Ar^1$ to $Ar^9$ can be independently selected from the group comprising:

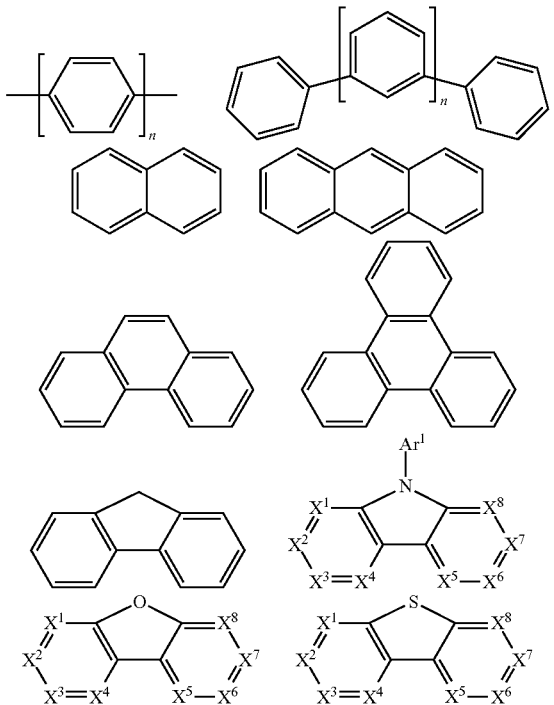

n is an integer from 1 to 20; $X^1$ to $X^8$ is CH or N; $Ar^1$ is as defined above.

Additional examples of cyclic aromatic amine-derived compounds can be seen in U.S. Pat. Nos. 3,567,450, 4,720,432, 5,061,569, 3,615,404 and 5,061,569.

Examples of metal clathrate that can be used as HTM or HIM include but are not limited to the following general structures:

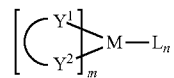

wherein M is a metal with an atomic weight greater than 40; $(Y^1-Y^2)$ is a bidentate ligand, $Y^1$ and $Y^2$ are independently selected from the group consisting of C, N, O, P and S; L is an auxiliary ligand; m is an integer whose value is from 1 to the maximum coordination number of this metal; m+n is the maximum coordination number of this metal.

In an embodiment, $(Y^1-Y^2)$ is 2-phenylpyridine derivative.

In another embodiment, $(Y^1-Y^2)$ is a carbene ligand.

In another embodiment, M is selected from Ir, Pt, Os, and Zn.

In another aspect, the metal complex has a HOMO greater than −5.5 eV (relative to vacuum level).

In an embodiment, a compound selected from any of the following compounds is used as a compound of HIM/HTM:

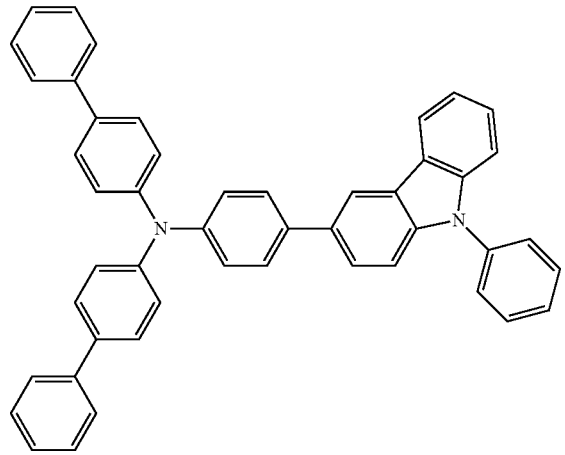

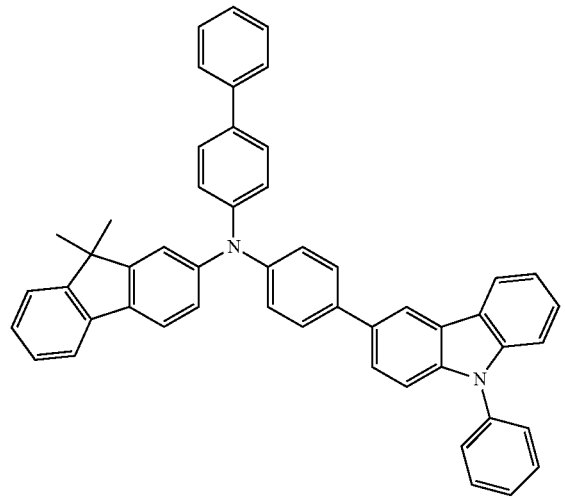

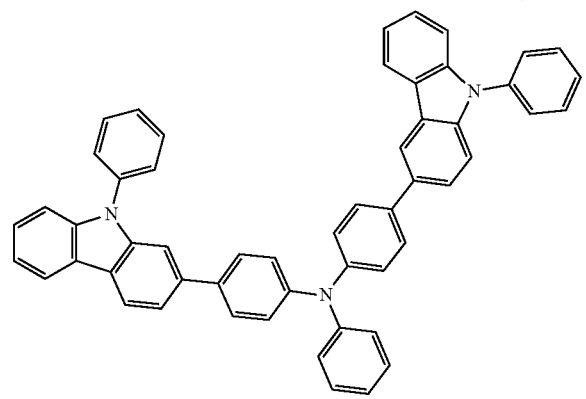

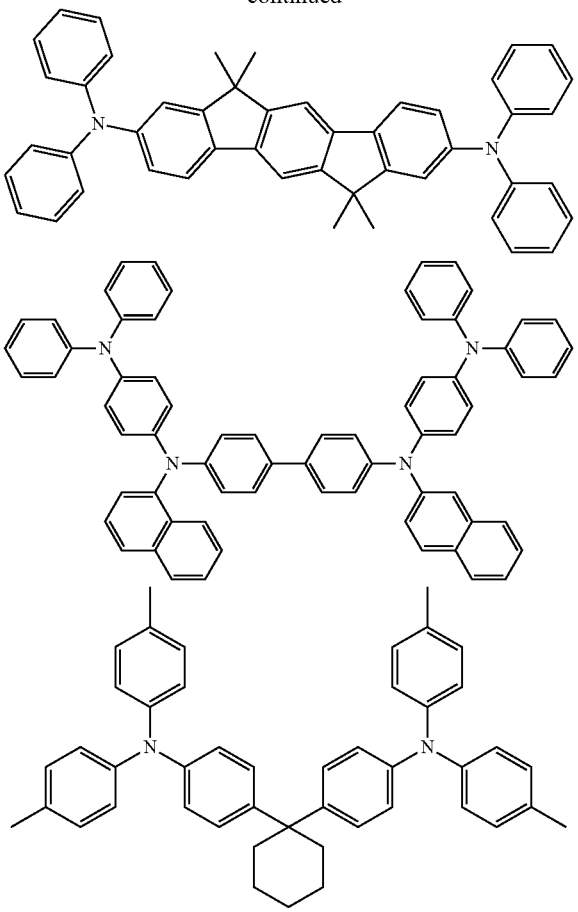

2. Triplet Host Material

The example of a triplet host material is not particularly limited, and any metal complex or organic compound may be used as a host material as long as its triplet energy is higher than that of a light emitter, particularly a triplet light emitter or a phosphorescent light emitter. An example of metal complex that can be used as a triplet host includes, but are not limited to, the following general structures:

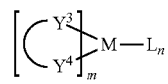

wherein M is a metal; $(Y^3-Y^4)$ is a bidentate ligand, $Y^3$ and $Y^4$ are independently selected from C, N, O, P or S; L is an auxiliary ligand; m is an integer whose value is from 1 to the maximum coordination number of this metal; m+n is the maximum coordination number of this metal.

In an embodiment, the metal complex that can be used as the triplet host is in the following form:

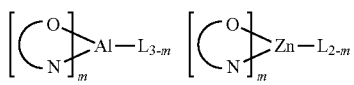

wherein, (O—N) is a bidentate ligand in which the metal is coordinated with O and N atoms.

In one of the embodiments, M is selected from Ir or Pt.

Examples of organic compounds that can be used as a triplet host are selected from the group consisting of cyclic aromatic compound such as benzene, biphenyl, triphenyl, benzo, fluorene; and a compound containing an aromatic heterocyclic group such as dibenzothiophene, dibenzofuran, dibenzoselenophen, furan, thiophene, benzofuran, benzothiophene, benzoselenophen, carbazole, indolocarbazole, pyridine indole, pyrrole dipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, oxazole, dibenzoxazole, benzisoxazole, benzothiazole, quinoline, isoquinoline, cinnoline, quinazoline, quinoxaline, naphthalene, phthalein, pteridine, xanthene, acridine, phenazine, phenothiazine, phenoxazine, benzofuropyridine, furopyridine, benzothiophene pyridine, thiophene pyridine, benzoselenophenepyridine and selenophenodipyridine; and a group containing 2 to 10 ring structures which may be the same or different types of cyclic aromatic or aromatic heterocyclic groups, and linked each other directly or through at least one the following groups: an oxygen atom, a nitrogen atom, a sulfur atom, a silicon atom, a phosphorus atom, a boron atom, a chain structure unit, and an aliphatic ring group. Wherein, each compound may be further substituted, the substituent may be selected from the group consisting of hydrogen, alkyl, alkoxy, amino, alkenyl, alkynyl, aralkyl, heteroalkyl, aryl and heteroaryl.

In an embodiment, the triplet host material may be selected from compounds comprising at least one of the following groups:

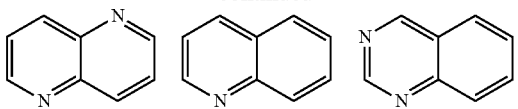
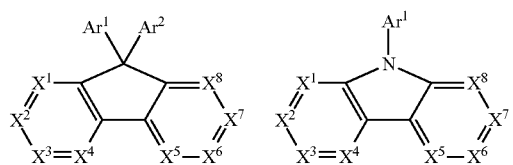
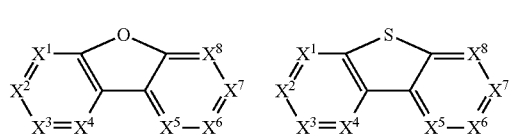
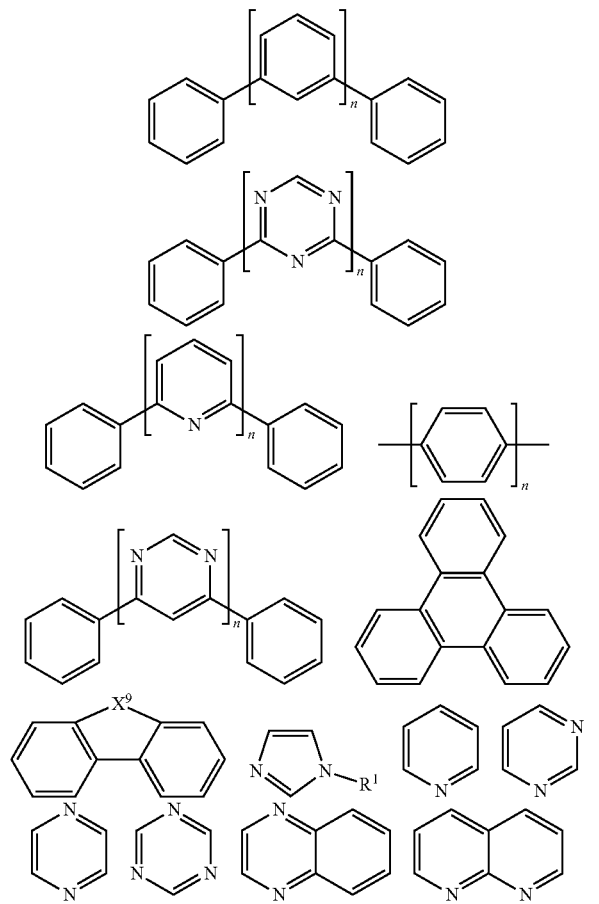
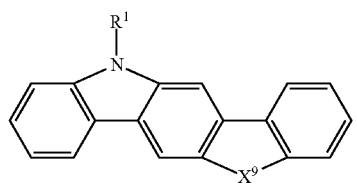
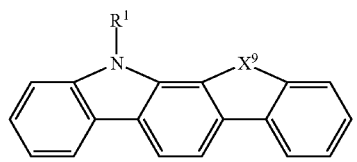
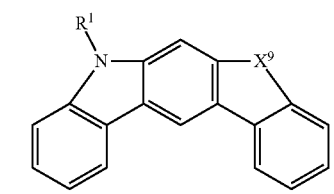
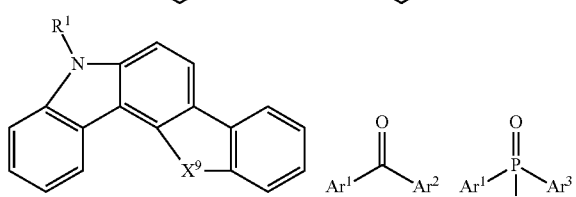
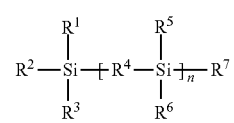

wherein $R^1$ to $R^7$ are mutually independently selected from the group consisting of hydrogen, alkyl, alkoxy, amino, alkene, alkyne, aralkyl, heteroalkyl, aryl or heteroaryl. $R^1$ to $R^7$ have the same meaning as $Ar^1$ and $Ar^2$ described above when $R^1$ to $R^7$ are aryl or heteroaryl; n is an integer from 0 to 20; $X^1$ to $X^8$ is selected from CH or N; $X^9$ is selected from $CR^1R^2$ or $NR^1$.

In an embodiment, the triplet host material is selected from the following compounds:

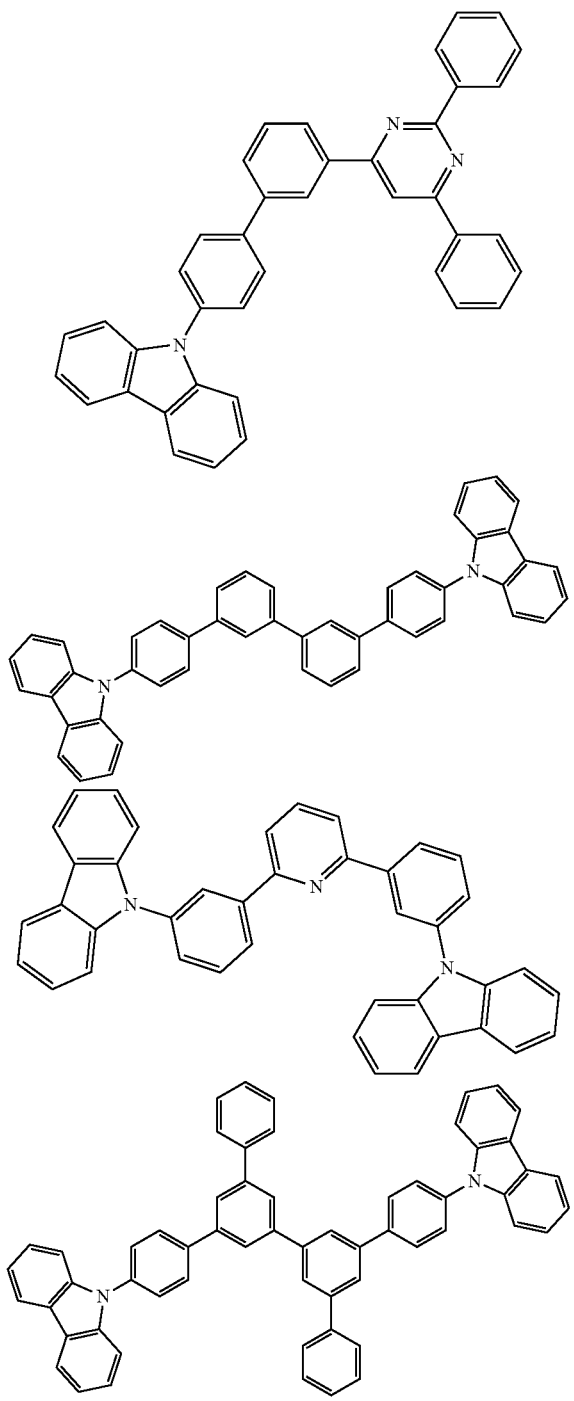

3. Singlet Host Material:

The example of the singlet host material is not particularly limited, any organic compound can be used as the host as long as its singlet energy is higher than that of the emitter, particularly that of the singlet emitter or the fluorescent emitter.

Examples of organic compounds used as singlet host material are selected from the group consisting of: cyclic aromatic hydrocarbon compounds such as benzene, biphenyl, triphenyl, benzo, naphthalene, anthracene, phenalene, phenanthrene, fluorene, pyrene, chrysene, perylene, azulene; and aromatic heterocycles compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, isoxazole, thiazole, oxadiazole, oxytriazole, dioxazole, thiadiazole, pyridine, pyridazine, pyrimidine, pyrazine, triazine, oxazine, oxathiazine, oxadiazine, indole, benzimidazole, indazole, indolizine, benzoxazole, benzoxazole, benzothiazole, quinoline, isoquinoline, cinnoline, quinazoline, quinoxaline, naphthalene, phthalein, pteridine, xanthene, acridine, phenazine, phenothiazine, phenoxazine, benzofuropyridine, furan dipyridine, benzothiophene pyridine, thiophenyldipyridine, benzoselenophenepyridine and selenophenodipyridine; and groups containing 2 to 10 ring structures, which may be the same or different types of cyclic aromatic hydrocarbyl groups or aromatic heterocyclic groups, and linked to each other directly or through at least one of the following groups: oxygen atom, nitrogen atom, sulfur atom, silicon atom, phosphorus atom, boron atom, chain structure unit, and aliphatic ring group.

In an embodiment, the singlet host material may be selected from compounds comprising at least one of the following groups:

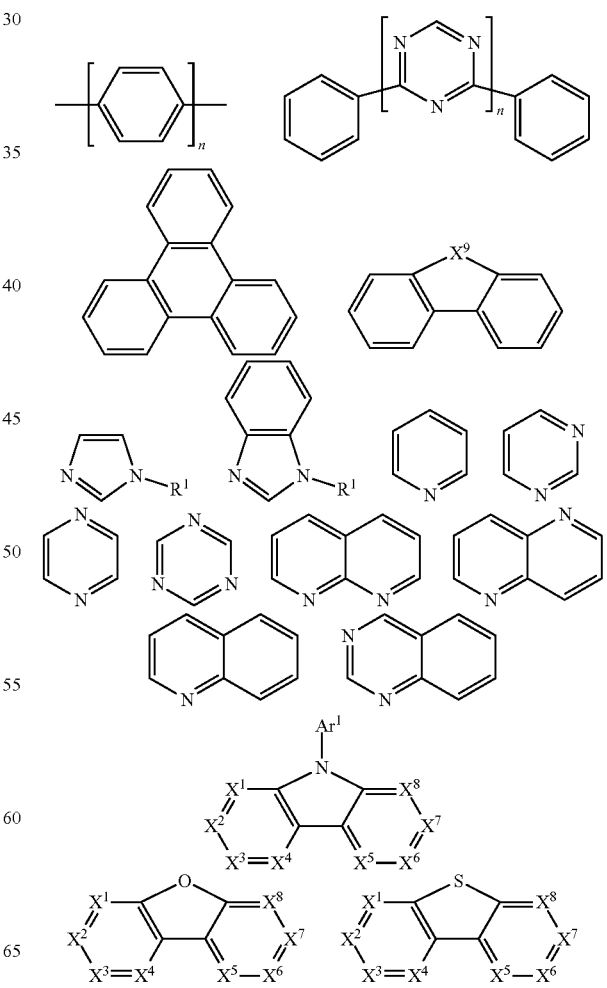

-continued

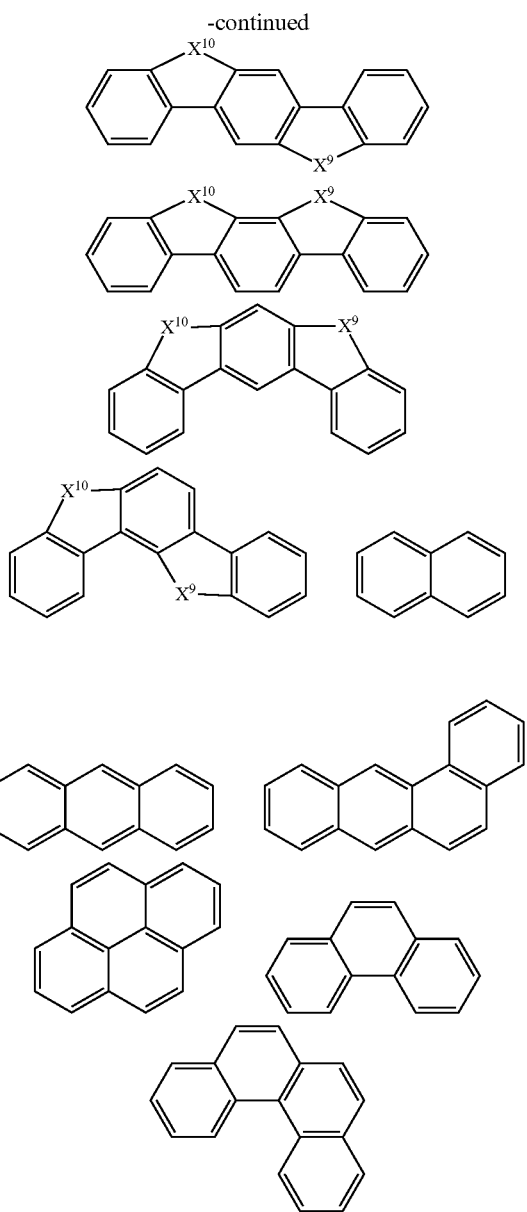

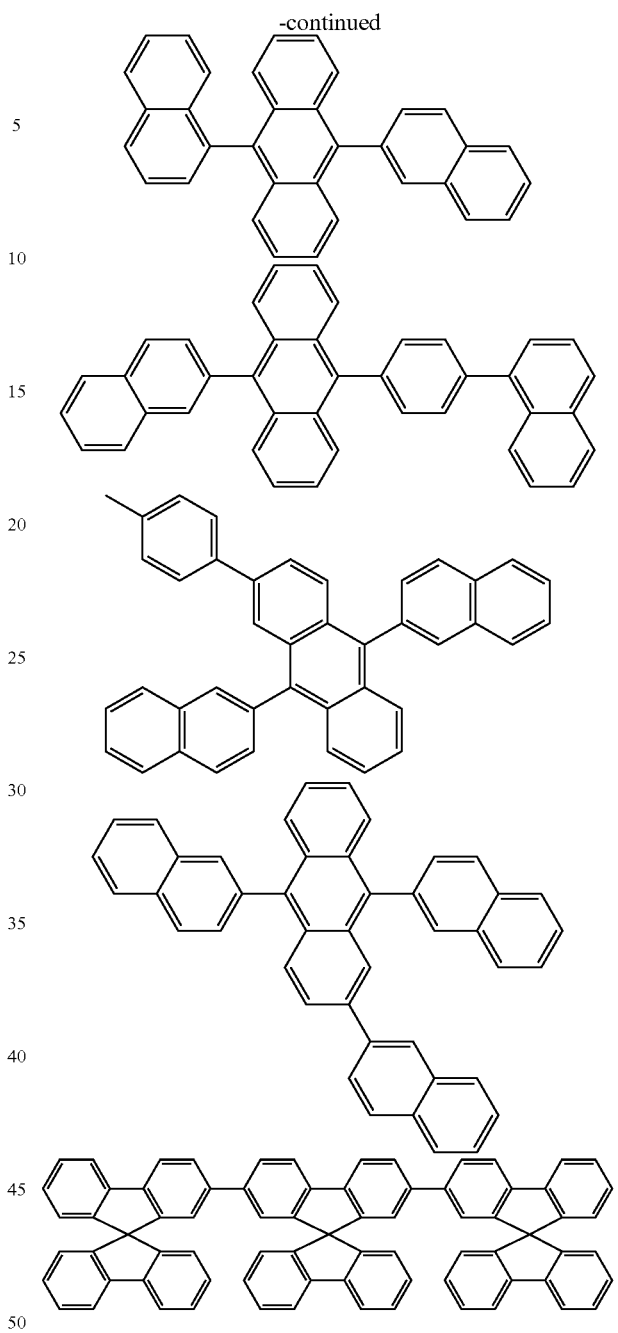

wherein $R^1$ may be independently selected from the group consisting of hydrogen, alkyl, alkoxy, amino, alkene, alkynyl, aralkyl, heteroalkyl, aryl and heteroaryl; $Ar^1$ is aryl or heteroaryl, and has the same meaning as $Ar^1$ defined in the above HTM; n is an integer from 0 to 20; $X^1$ to $X^8$ is selected from CH or N; $X^9$ and $X^{10}$ is selected from $CR^1R^2$ or $NR^1$.

In an embodiment, the fluorenyl singlet host material is selected from the following compounds:

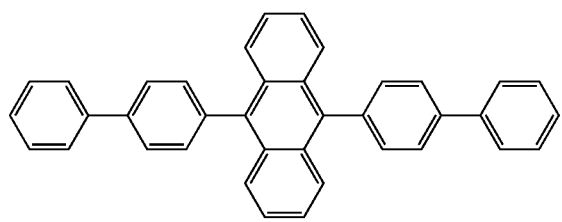

4. Singlet Emitter

The singlet emitter usually has longer conjugated 21 electron system. To date, there have been many examples, such as, styrylamine and derivatives thereof disclosed in JP2913116B and WO2001021729A1, and indenofluorene and derivatives thereof disclosed in WO2008/006449 and WO2007/140847.

In an embodiment, the singlet emitter can be selected from mono-styrylamine, di-styrylamine,tri-styrylamine, tetra-styrylamine, styryl phosphine, styryl ether, or arylamine.

A mono-styrylamine is a compound comprising an unsubstituted or substituted styryl group and at least one amine, particularly an aromatic amine. A di-styrylamine is a compound comprising two unsubstituted or substituted styryl groups and at least one amine, particularly an aromatic amine. A tri-styrylamine is a compound comprising three unsubstituted or substituted styryl groups and at least one amine, particularly an aromatic amine. A tetra-styrylamine is a compound comprising four unsubstituted or substituted styryl groups and at least one amine, particularly an aromatic amine. A particularly d styrene is stilbene, which may be further substituted. The definitions of the corresponding phosphines and ethers are similar to those of amines. An aryl amine or aromatic amine refers to a compound comprising three unsubstituted or substituted aromatic ring or heterocyclic systems directly coupled to nitrogen. In an embodiment, at least one of these aromatic or heterocyclic ring systems has fused ring systems, and the fused system particularly has at least 14 aromatic ring atoms. Wherein, examples in an embodiment are aromatic anthramine, aromatic anthradiamine, aromatic pyrenamine, aromatic pyrenediamine, aromatic chryseneamine or aromatic chrysenediamine. An aromatic anthramine refers to a compound in which a diarylamino group is directly coupled to anthracene, particularly at position 9. An aromatic anthradiamine refers to a compound in which two diarylamino groups are directly coupled to anthracene, particularly at positions 9, 10. Aromatic pyrene amine, aromatic pyrene diamine, aromatic chrysene amine and aromatic chrysene diamine are similarly defined, wherein the diarylarylamino group is particularly attached to position 1 or 1 and 6 of pyrene.

The examples of singlet emitter based on vinylamine and arylamine can be found in the following patent documents: WO 2006/000388, WO 2006/058737, WO 2006/000389, WO 2007/065549, WO 2007/115610, U.S. Pat. No. 7,250, 532 B2, DE 102005058557 A1, CN 1583691 A, JP 08053397 A, U.S. Pat. No. 6,251,531 B1, US 2006/210830 A, EP 1 957 606 A1 and US 2008/0113101 A1, the entirety of the patent documents listed above are hereby incorporated herein by reference.

Examples of singlet emitters based on distyrylbenzene and derivatives thereof may be found in U.S. Pat. No. 5,121,029.

Further, singlet emitters may be selected from the group consisting of: indenofluorene-amine and indenofluorene-diamine disclosed in WO 2006/122630, benzoindenofluorene-amine and benzoindenofluorene-diamine disclosed in WO 2008/006449, dibenzoindenofluorene-amine and dibenzoindenofluorene-diamine disclosed in WO2007/140847.

Other materials that may be used as singlet emitters are polycyclic aromatic hydrocarbon compounds, particularly the derivatives of the following compounds: anthracene such as 9,10-di(2-naphthanthracene), naphthalene, tetracene, xanthene, phenanthrene, pyrene (such as 2,5,8,11-tetra-t-butylperylene), indenopyrene, phenylene (such as 4,4'-bis (9-ethyl-3-carbazovinylene)-1,1'-biphenyl), periflanthene, decacyclene, coronene, fluorene, spirobifluorene, arylpyrene (e.g., US20060222886), arylenevinylene (e.g., U.S. Pat. Nos. 5,121,029, 5,130,603), cyclopentadiene such as tetraphenylcyclopentadiene, rubrene, coumarine, rhodamine, quinacridone, pyrane such as 4(dicyanomethylene)-6-(4-dimethylaminostyryl-2-methyl)-4H-pyrane (DCM), thiapyran, bis (azinyl) imine-boron compound (US 2007/0092753 A1), bis (azinyl) methene compound, carbostyryl compound, oxazone, benzoxazole, benzothiazole, benzimidazole and diketopyrrolopyrrole. Examples of singlet emitter materials can be found in the following patent documents: US 20070252517 A1, U.S. Pat. Nos. 4,769,292, 6,020,078, US 2007/0252517 A1, US 2007/0252517 A1. The entirety of the patent documents listed above are hereby incorporated herein by reference.

In an embodiment, the singlet emitter is selected from the following compounds:

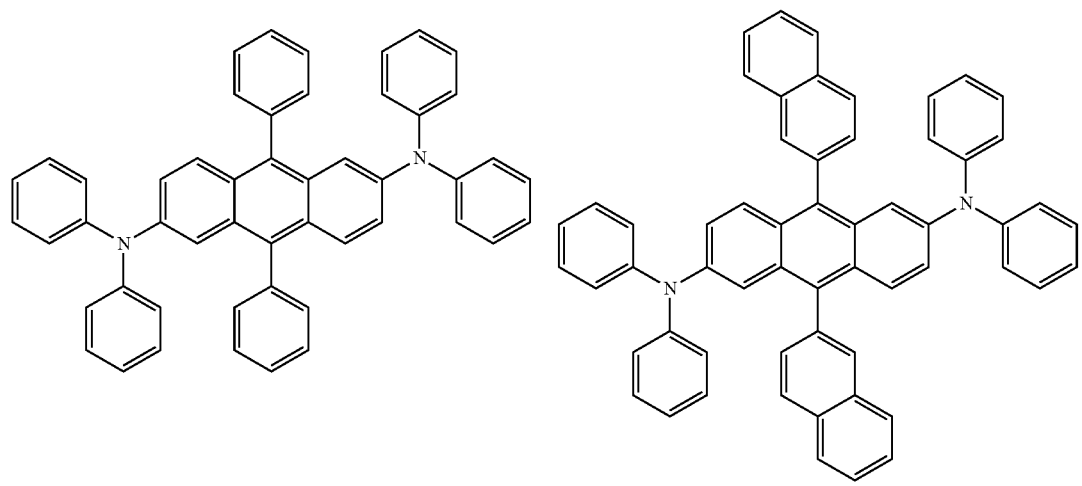

-continued
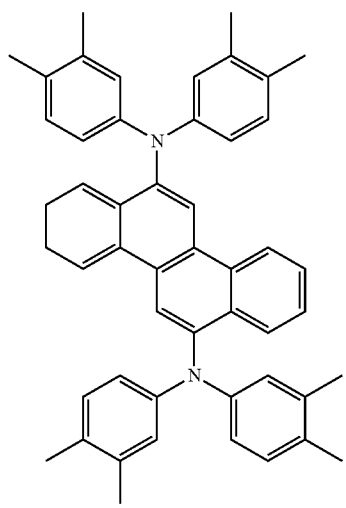
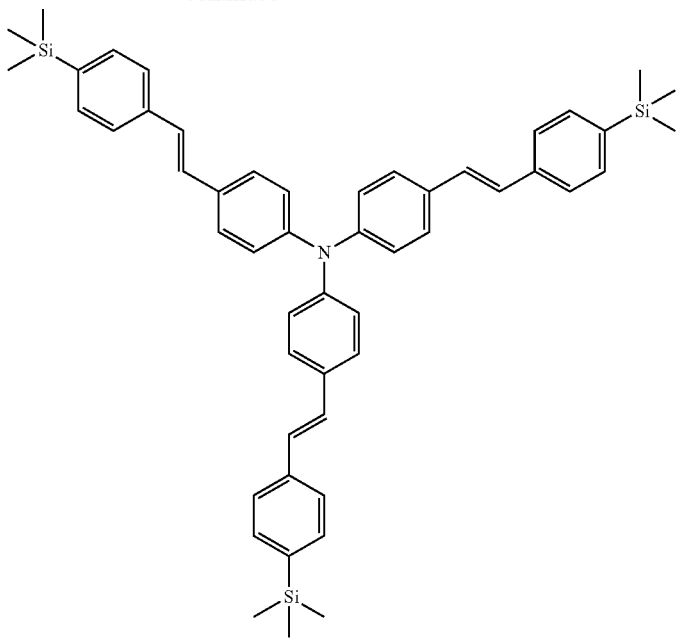
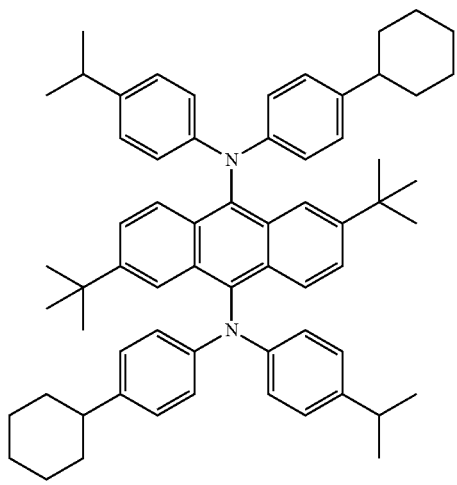
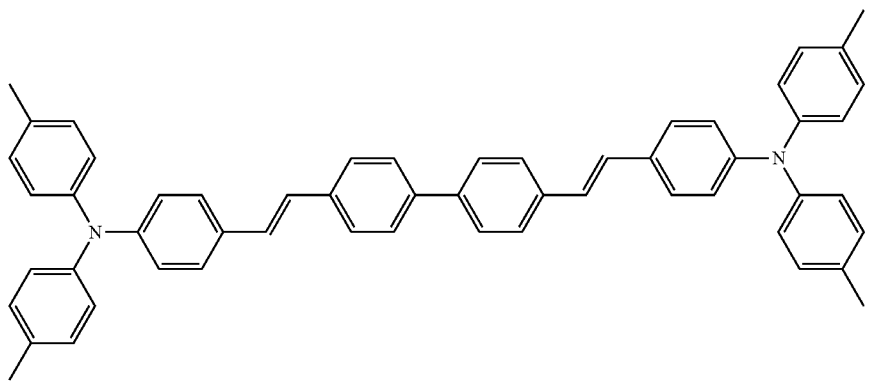

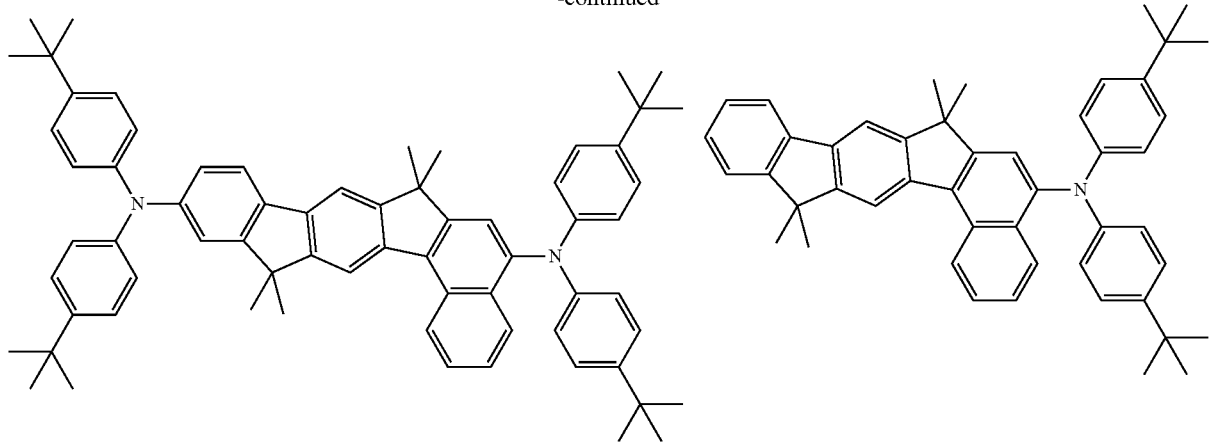

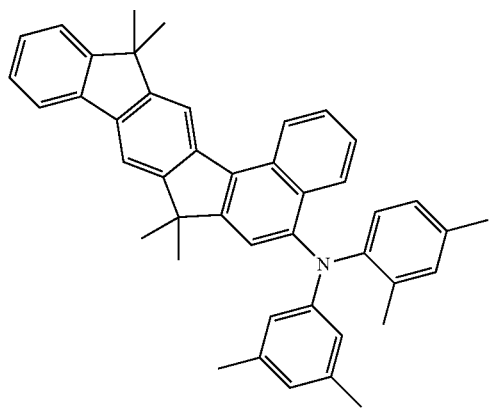

5. Thermally Activated Delayed Fluorescent Material (TADF):

A traditional organic fluorescent material can only emit light using 25% singlet exciton emission formed by electric excitation, and the device has a low internal quantum efficiency (up to 25%). Although the phosphorescent material enhances the intersystem crossing due to the strong spin-orbit coupling of the heavy atom center, the singlet exciton and the triplet exciton emission formed by the electric excitation can be effectively utilized, so that the internal quantum efficiency of the device can reach 100%. However, the application of phosphorescent material in OLEDs is limited by the problems such as high cost, poor material stability and serious roll-off of the device efficiency, etc. The thermally activated delayed fluorescent material is the third generation of organic light-emitting material developed after the organic fluorescent material and the organic phosphorescent material. This type of material generally has a small singlet-triplet excited state energy level difference ($\Delta Est$), and triplet excitons can be converted to singlet excitons by intersystem crossing, which can fully use singlet excitons and triplet excitons formed under electric excitation. The device can achieve 100% internal quantum efficiency.

TADF materials need to have a small singlet-triplet energy level difference ($\Delta Est$). In an embodiment, $\Delta Est<0.3$ eV; in an embodiment, $\Delta Est<0.2$ eV; in an embodiment, $\Delta Est<0.1$ eV; in an embodiment, $\Delta Est<0.05$ eV. In an embodiment, the TADF has better fluorescence quantum efficiency. Some TADF materials can be found in the following patent documents: CN103483332(A), TW201309696(A), TW201309778(A), TW201343874(A), TW201350558(A), US20120217869(A1), WO2013133359(A1), WO2013154064(A1), Adachi, et. al. Adv. Mater., 21, 2009, 4802, Adachi, et. al. Appl. Phys. Lett., 98, 2011, 083302, Adachi, et. al. Appl. Phys. Lett., 101, 2012, 093306, Adachi, et. al. Chem. Commun., 48, 2012, 11392, Adachi, et. al. Nature Photonics, 6, 2012, 253, Adachi, et. al. Nature, 492, 2012, 234, Adachi, et. al. J. Am. Chem. Soc, 134, 2012, 14706, Adachi, et. al. Angew. Chem. Int. Ed, 51, 2012, 11311, Adachi, et. al. Chem. Commun., 48, 2012, 9580, Adachi, et. al. Chem. Commun., 48, 2013, 10385, Adachi, et. al. Adv. Mater., 25, 2013, 3319, Adachi, et. al. Adv. Mater., 25, 2013, 3707, Adachi, et. al. Chem. Mater., 25, 2013, 3038, Adachi, et. al. Chem. Mater., 25, 2013, 3766, Adachi, et. al. J. Mater. Chem. C., 1, 2013, 4599, Adachi, et. al. J. Phys. Chem. A., 117, 2013, 5607. The entirety of the contents of the patents or article documents listed above are hereby incorporated herein by reference.

In an embodiment, the TADF material is selected from the following compounds:
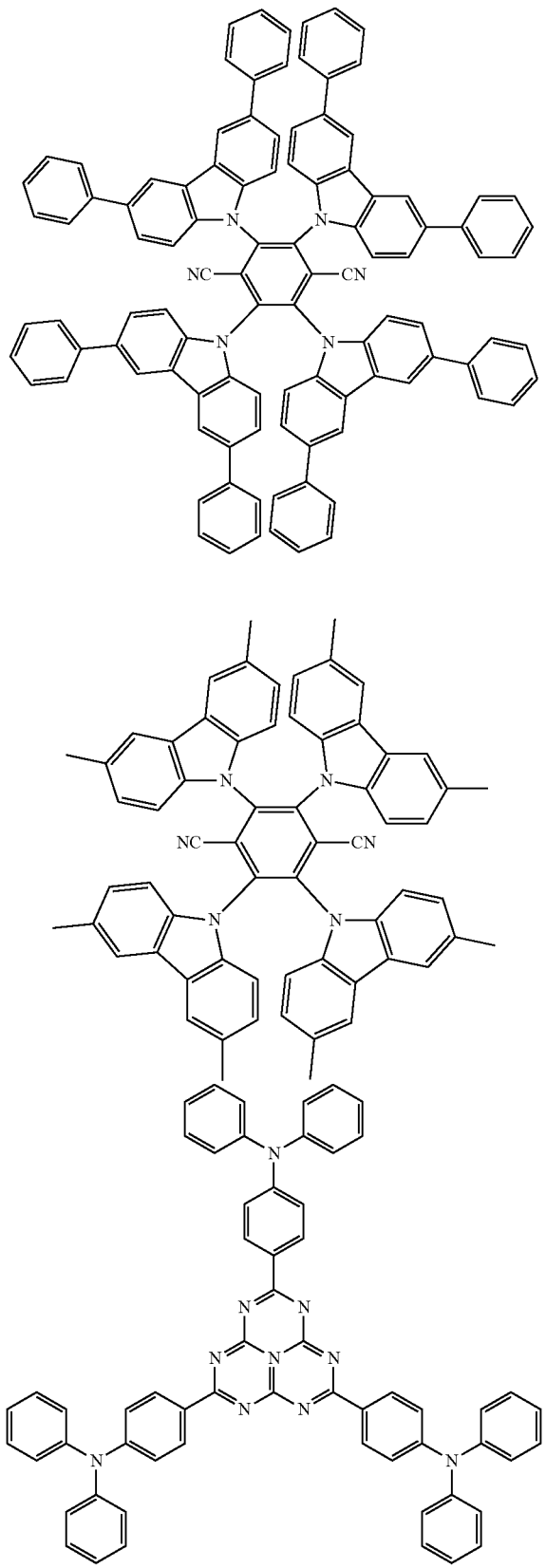
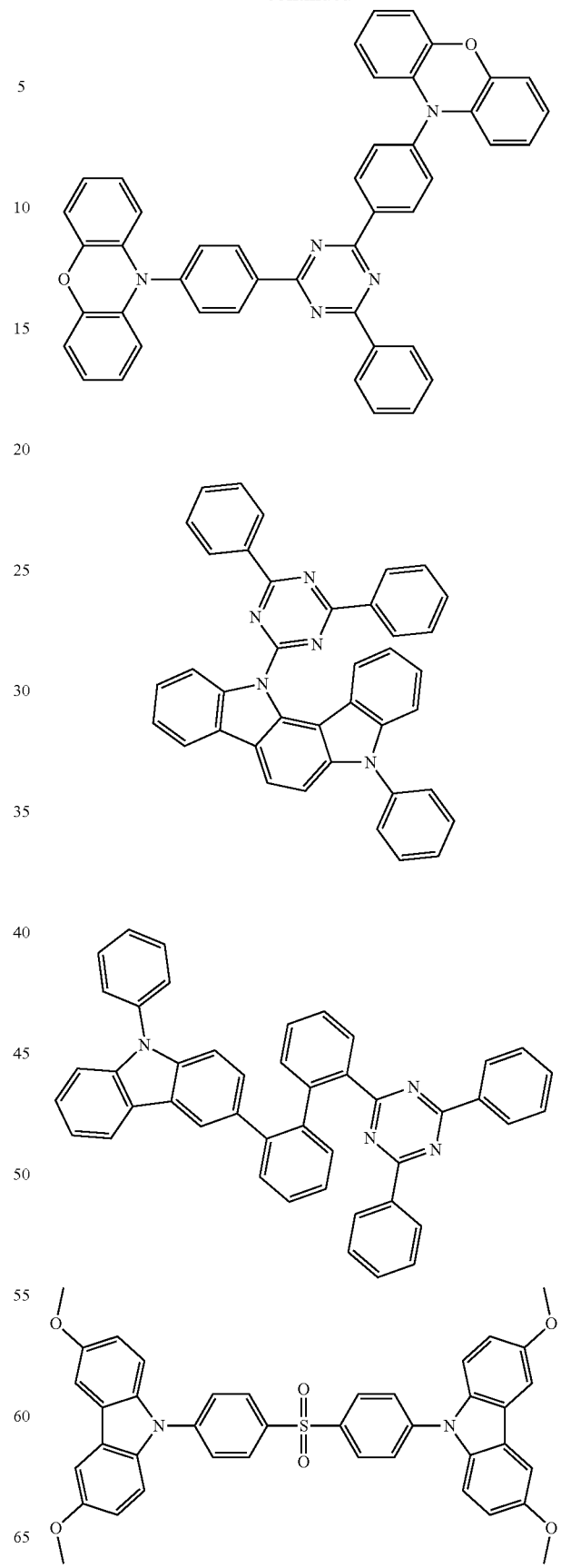

49
-continued
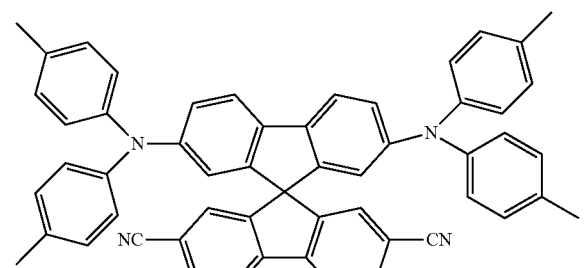
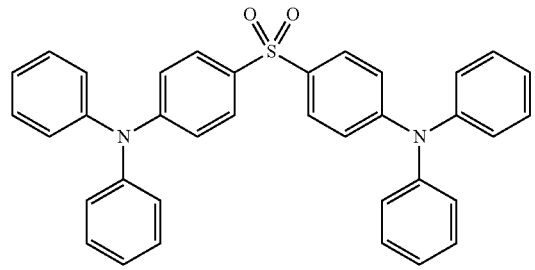
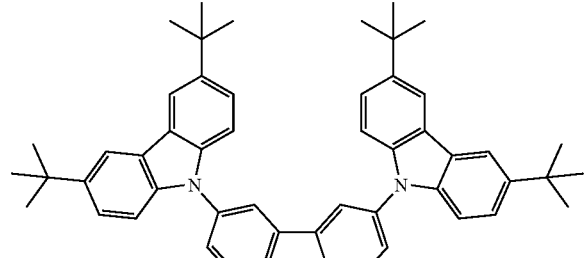
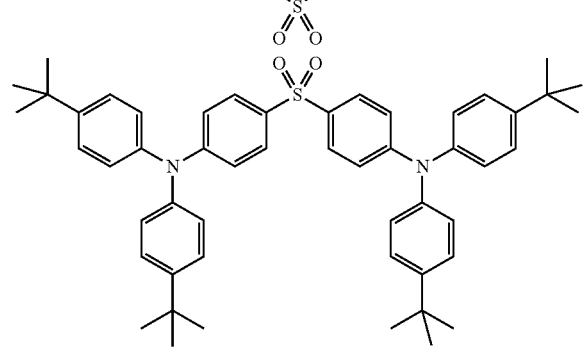
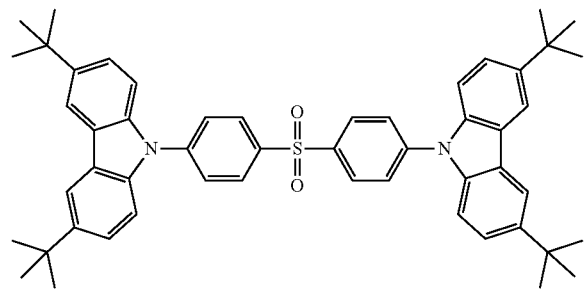
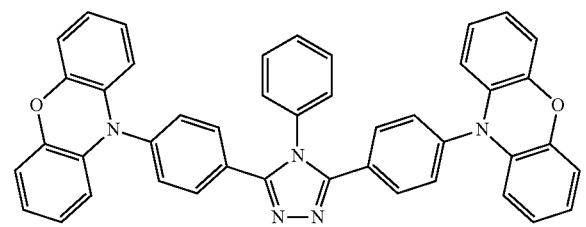
50
-continued
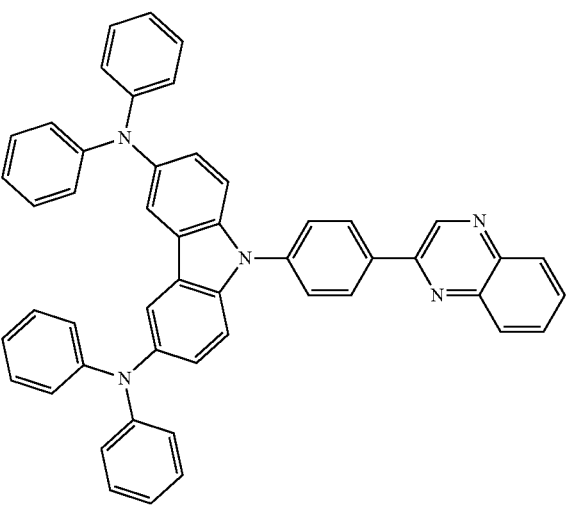
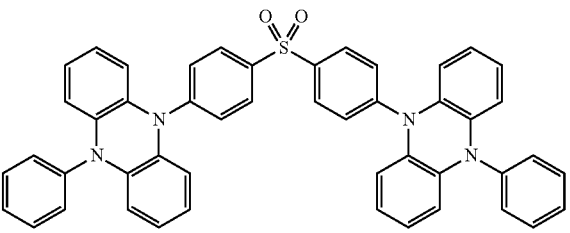
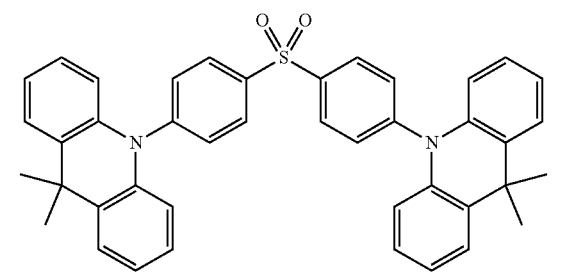
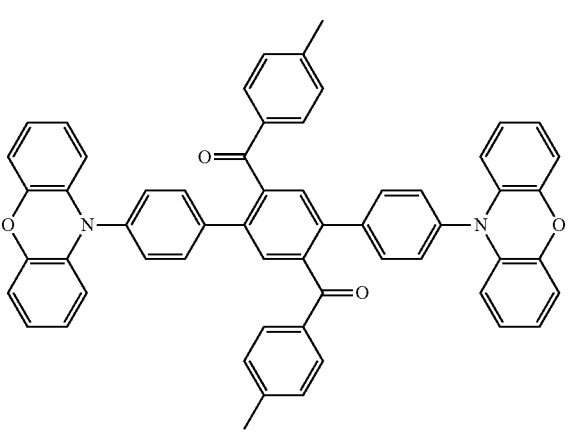

51
-continued
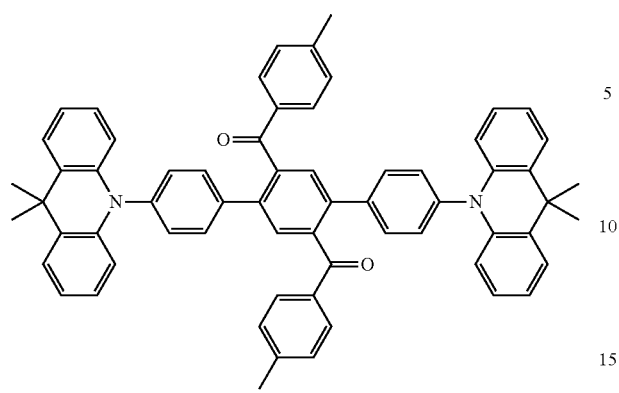
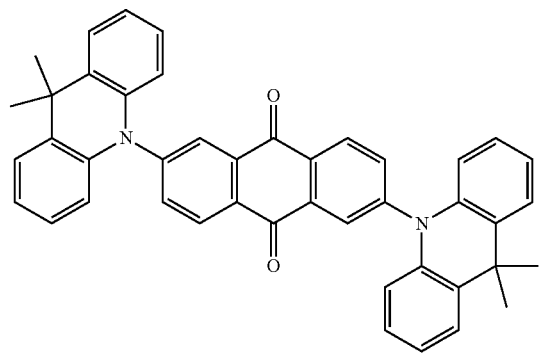
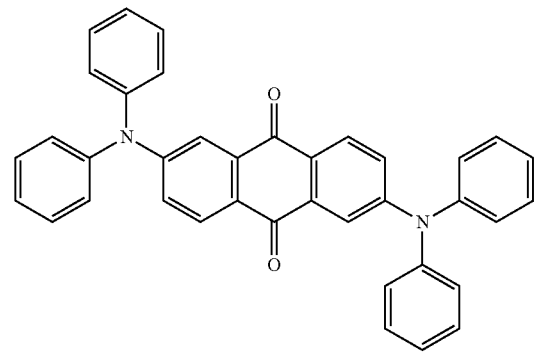
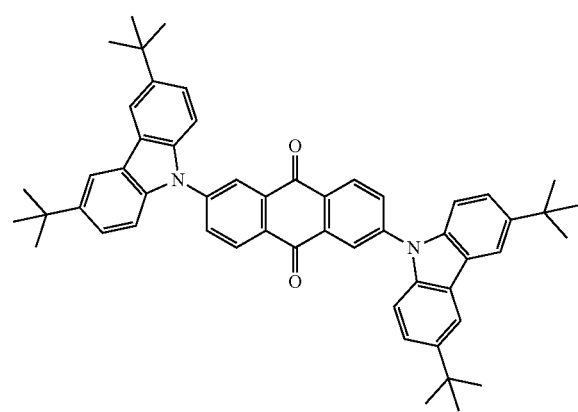
52
-continued
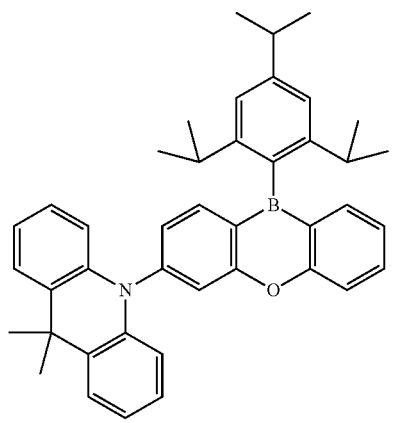
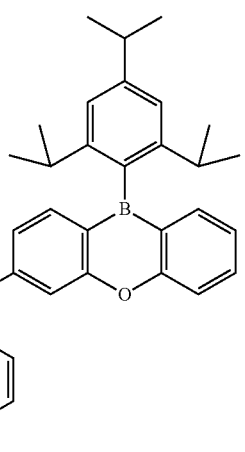
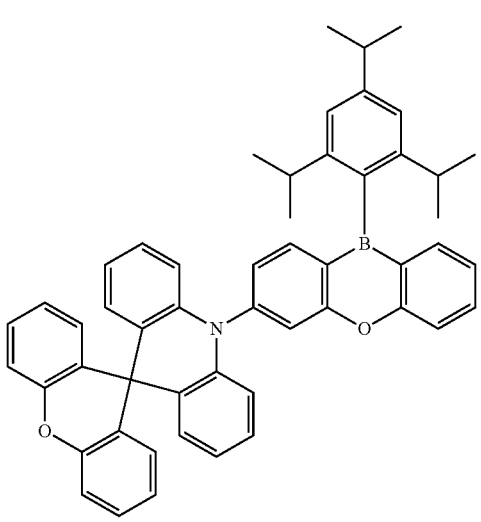
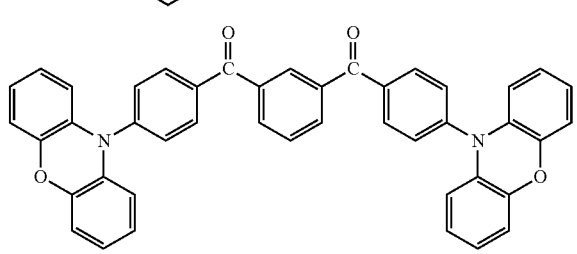

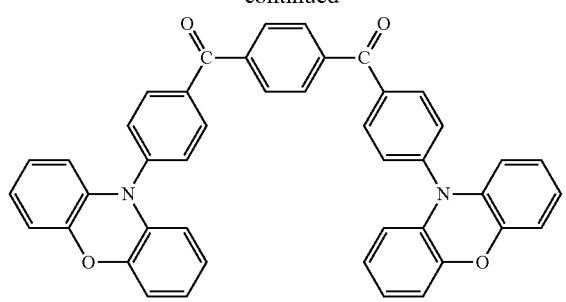

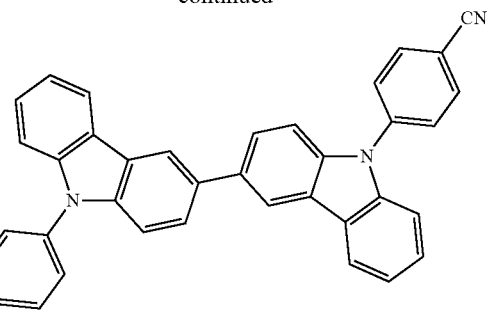

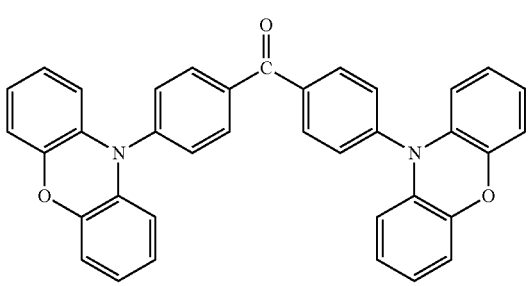

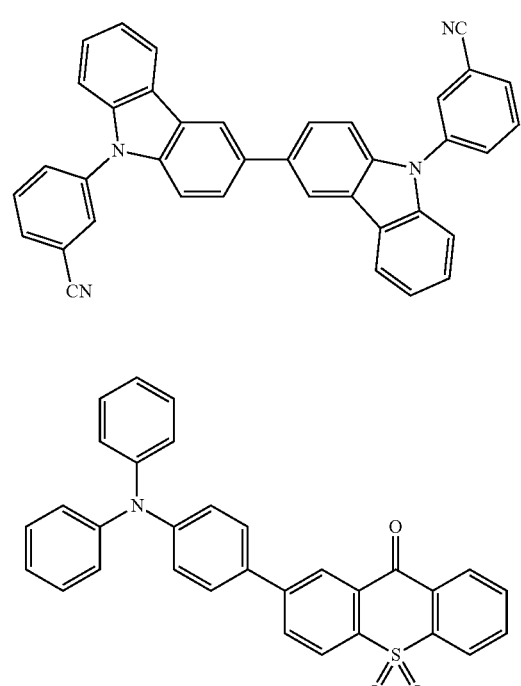

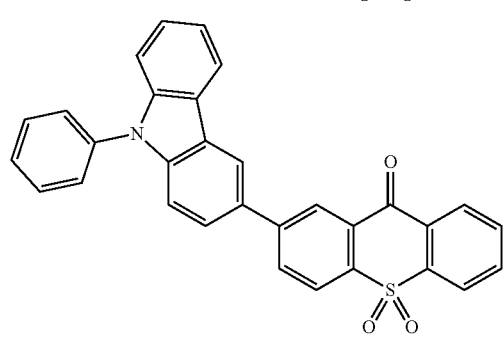

6. Triplet Emitter

The triplet emitter is also called phosphorescent material. In an embodiment, the triplet emitter is a metal complex containing a formula M(L)n. M is a metal atom, and each occurrence of L may be the same or different and is an organic ligand which is bonded or coordinated to the metal atom M through one or more positions; n is an integer greater than 1, particularly 1, 2, 3, 4, 5 or 6. Optionally, these metal complexes are attached to a polymer through one or more positions, especially through organic ligands.

In an embodiment, the metal atom M is selected from a transitional metal element, a lanthanoid element or a lanthanoid element, further selected from Ir, Pt, Pd, Au, Rh, Ru, Os, Sm, Eu, Gd, Tb, Dy, Re, Cu or Ag, still further selected from Os, Ir, Ru, Rh, Re, Pd, or Pt.

In an embodiment, the triplet emitter contains a chelating ligand (i.e., a ligand) that coordinates with the metal through at least two binding sites. Particularly, the triplet emitter contains two or three identical or different bidentate or multidentate ligands. The chelating ligand is advantageous for improve the stability of the metal complexes.

In an embodiment, the organic ligand is selected from the group consisting of phenylpyridine derivatives, 7,8-benzoquinoline derivatives, 2(2-thienyl) pyridine derivatives, 2(1-naphthyl) pyridine derivatives, or 2 phenylquinoline derivatives. All of these organic ligands may be substituted, for example, substituted by fluoromethyl or trifluoromethyl. Preferably, the ancillary ligand may be selected from acetone acetate or picric acid.

In an embodiment, the metal clathrates that can be used as triplet emitters have the following form:

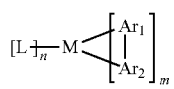

M is a metal and selected from transition metal elements, lanthanoid elements, or lanthanoid elements.

$Ar^1$ is a cyclic group which may be the same or different at each occurrence, and $Ar^1$ contains at least one donor atom, i.e. an atom containing a lone pair of electrons, such as nitrogen or phosphorus, coordinated to a metal thorough its cyclic group; $Ar^2$ is a cyclic group, which may be the same or different at each occurrence, and $Ar^2$ contains at least one C atom, which is linked to the metal through its cyclic group; $Ar^1$ and $Ar^2$ are covalently linked together and may each carry one or more substituted groups, which may in turn be linked together by a substituted group; L may be the same or different at each occurrence, and L is an auxiliary ligand, further a bidentate chelating ligand, still further a monoanionic bidentate chelate ligand; m is selected from 1, 2 or 3, further is 2 or 3, particularly is 3; m is selected from 0, 1 or 2, further is 0 or 1, particularly is 0.

Examples of triplet emitter materials and examples of applications thereof can be found in the following patent documents and references: WO 200070655, WO 200141512, WO 200202714, WO 200215645, EP 1191613, EP 1191612, EP 1191614, WO 2005033244, WO 2005019373, US 2005/0258742, WO 2009146770, WO 2010015307, WO 2010031485, WO 2010054731, WO 2010054728, WO 2010086089, WO 2010099852, WO 2010102709, US 20070087219 A1, US 20090061681 A1, US 20010053462 A1, Baldo, Thompson et al. Nature 403, (2000), 750-753, US 20090061681 A1, US 20090061681 A1, Adachi et al. Appl. Phys. Lett. 78 (2001), 1622-1624, J. Kido et al. Appl. Phys. Lett. 65 (1994), 2124, Kido et al. Chem. Lett. 657, 1990, US 2007/0252517A1, Johnson et al., JACS 105, 1983, 1795, Wrighton, JACS 96, 1974, 998, Ma et al., Synth. Metals 94, 1998, 245, U.S. Pat. Nos. 6,824,895, 7,029,766, 6,835,469, 6,830,828, US 20010053462 A1, WO 2007095118 A1, US 2012004407A1, WO 2012007088A1, WO2012007087A1, WO 2012007086A1, US 2008027220A1, WO 2011157339A1, CN 102282150A, WO 2009118087A1. The entire contents of the above listed patent documents and literatures are hereby incorporated by reference.

In an embodiment, the triplet emitter is selected from the following compounds:

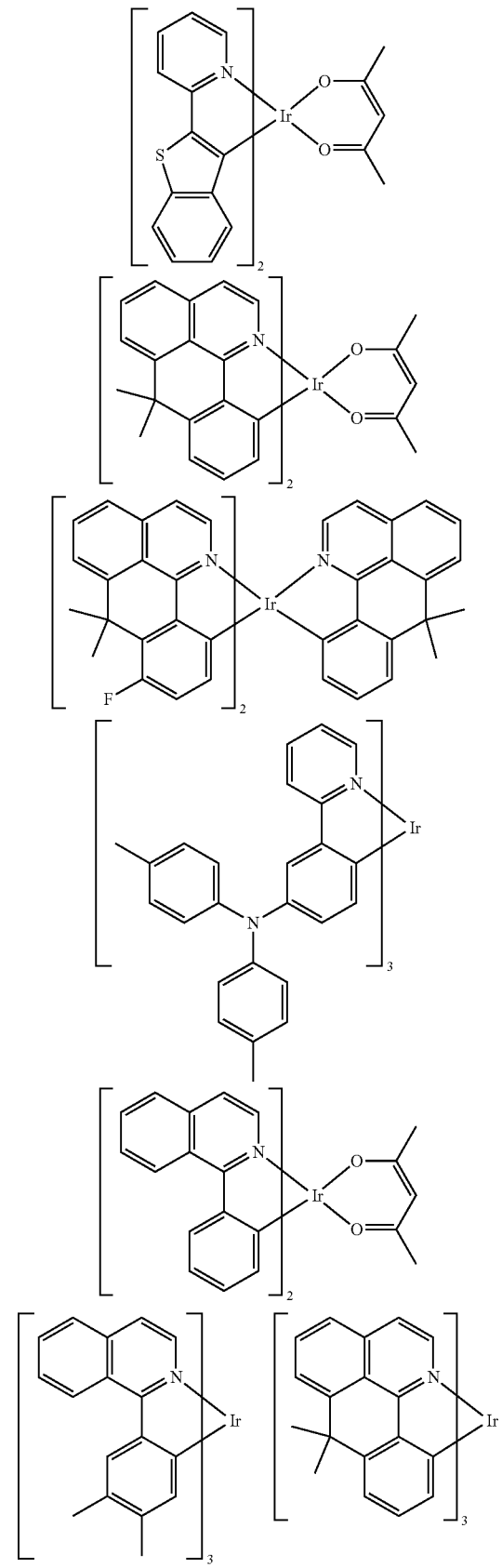

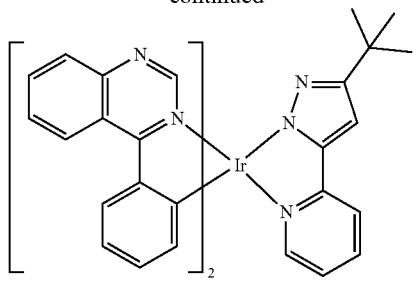
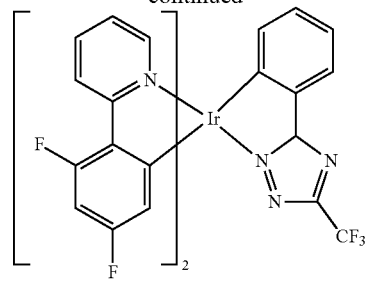
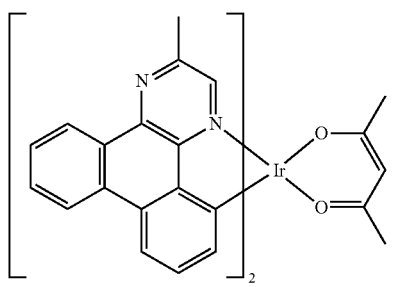
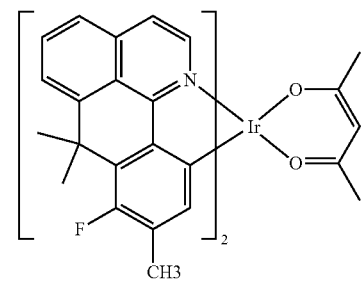
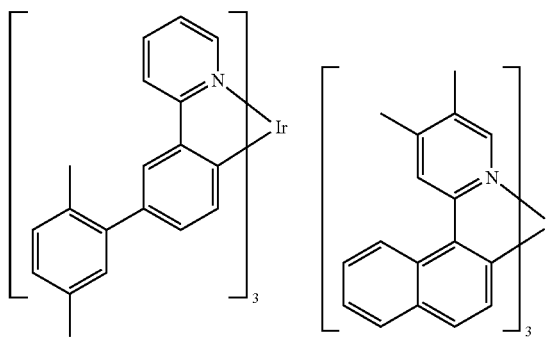
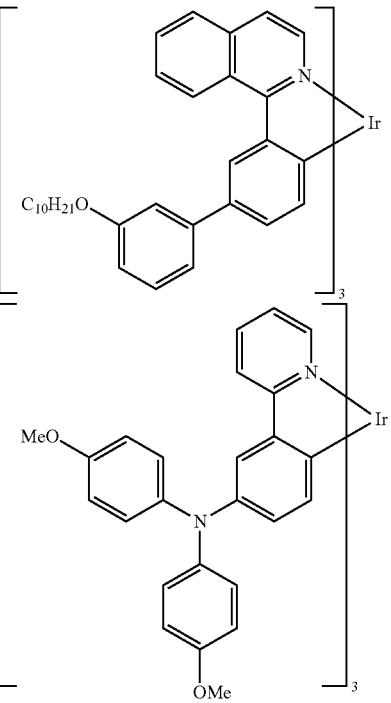
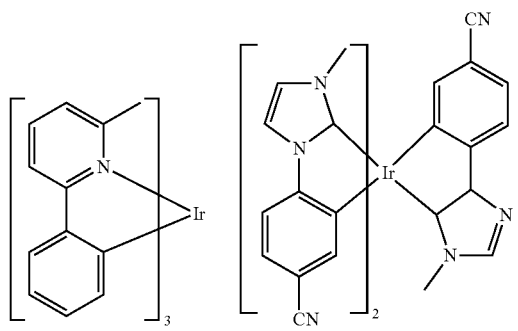
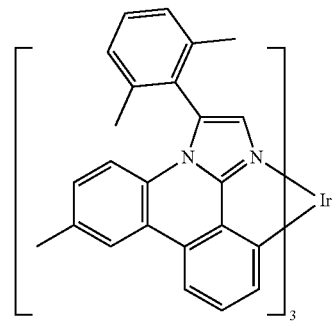
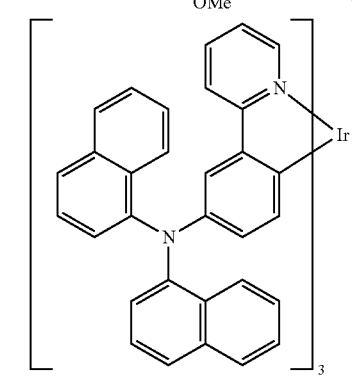

-continued
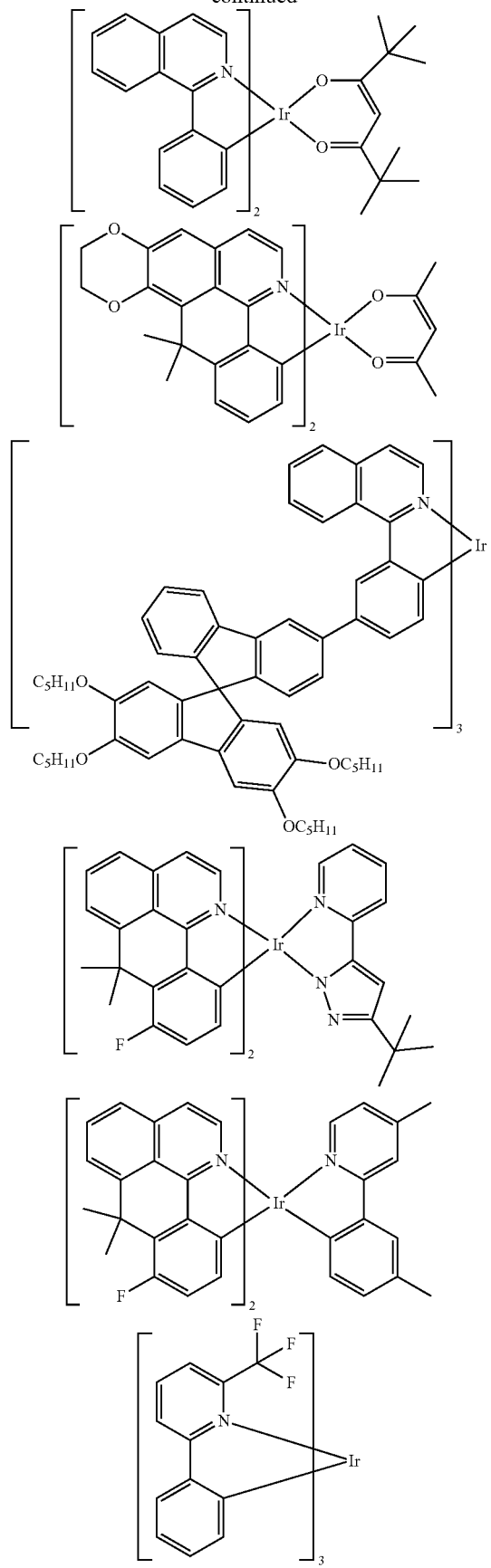
-continued
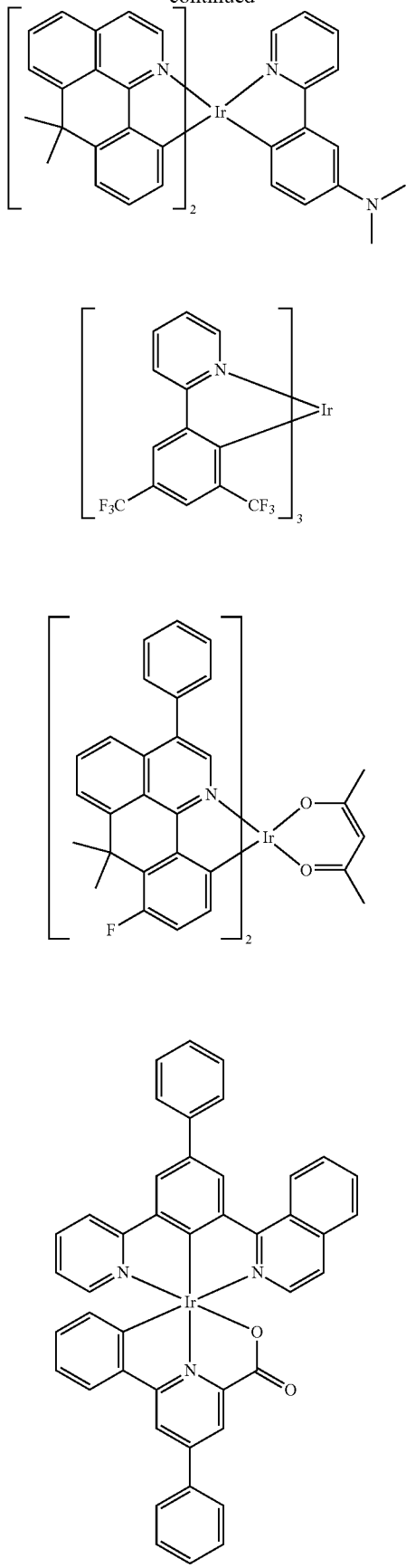

61
-continued
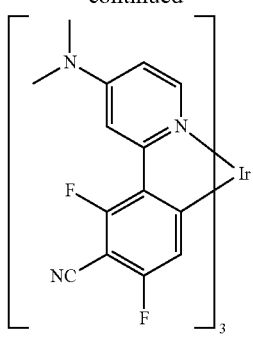
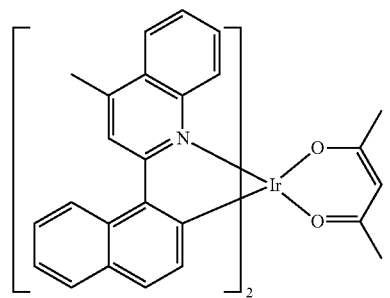
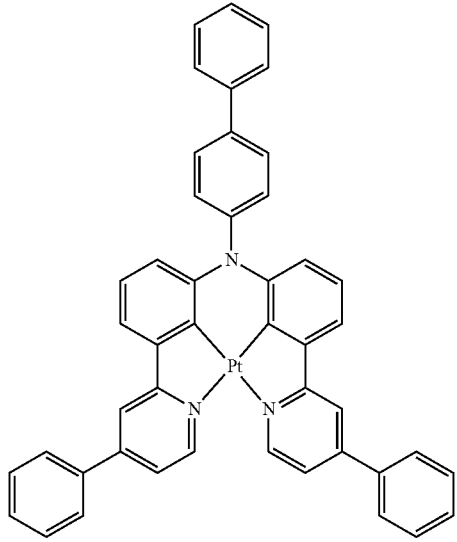
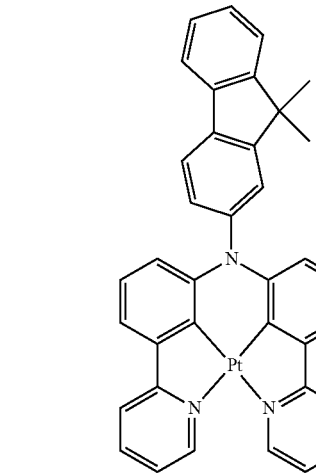
62
-continued
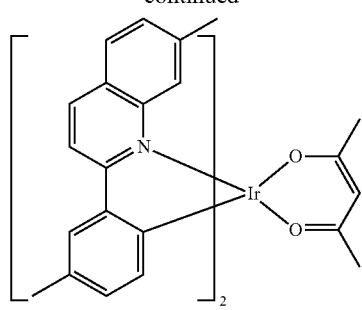
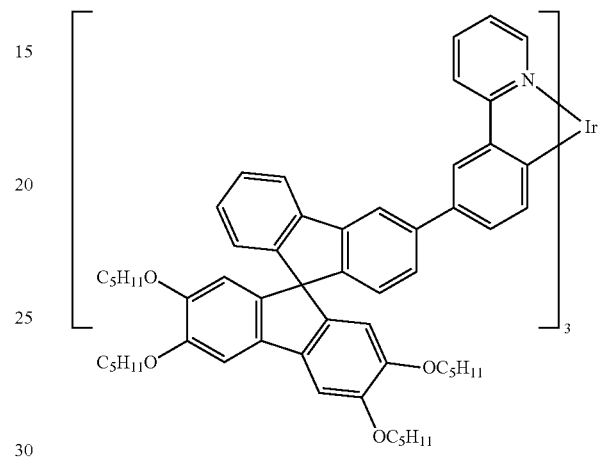
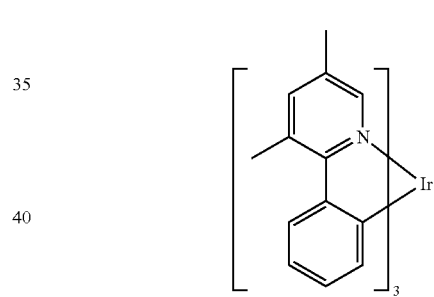
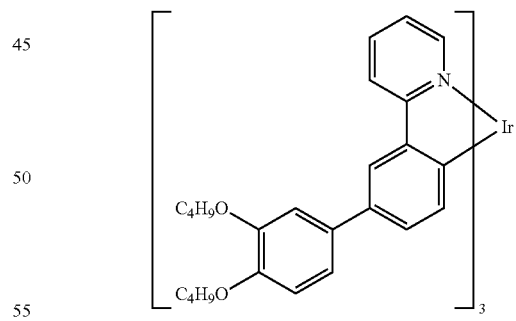
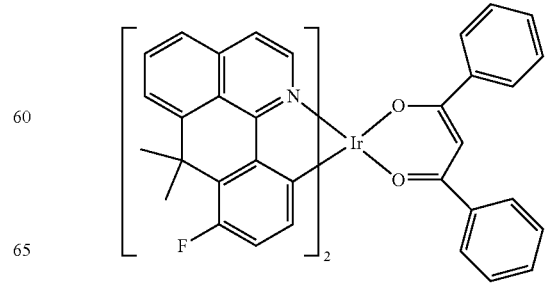

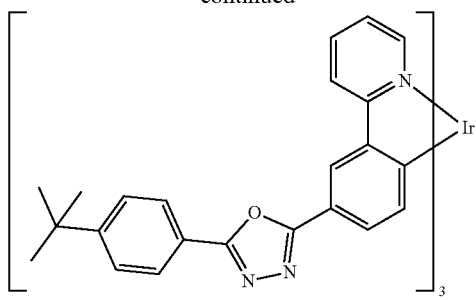
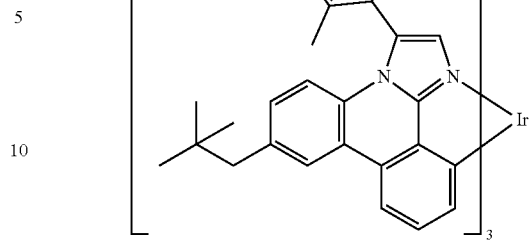
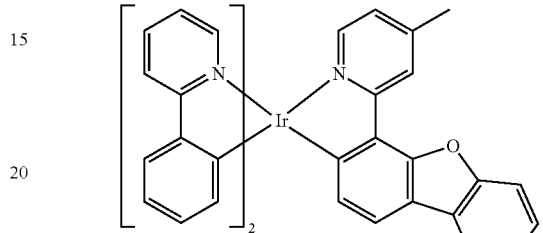
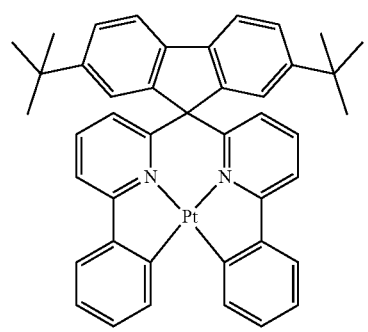
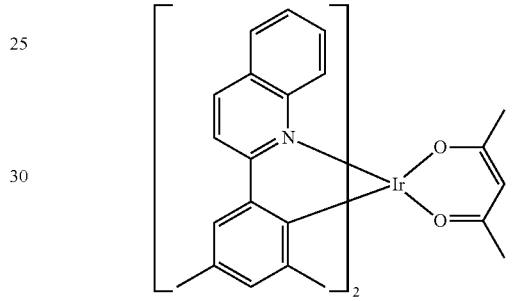
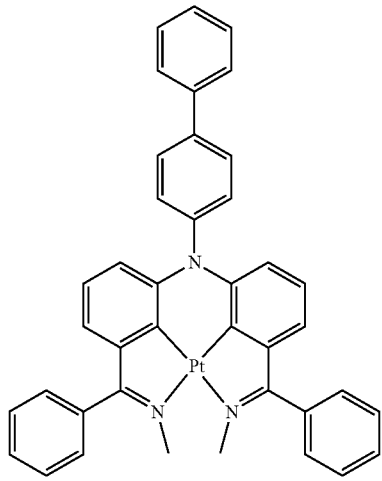

In an embodiment, the functional material comprised in the formulation is a polymer material.

The organic small molecule functional materials described above, including the HIM, the HTM, the ETM, the EIM, the host material, the fluorescent emitter, the phosphorescent emitter, and the TADF can all be included as repeating units in the polymer.

In an embodiment, the polymer suitable for the present disclosure is a conjugated polymer. Generally, conjugated polymers have the following formula:

Chemical formula 1

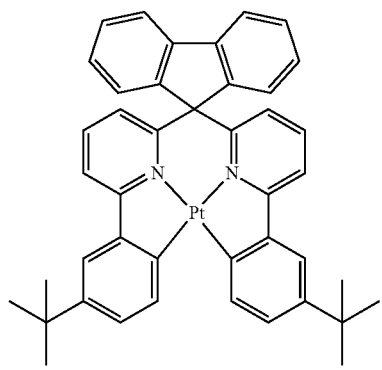

wherein B, A may be independently selected from the same or different structural units in multiple occurrences B: a π-conjugated structural unit having a large energy gap, also called a backbone unit, selected from a monocyclic or polycyclic aryl or heteroaryl group, and further, the unit form is benzene, biphenylene, naphthalene, anthracene, phenanthrene, dihydrophenanthrene, 9,10-dihydrophenanthrene, fluorene, difluorene, spirobifluorene, phenylenevinylene, trans-indenofluorenes, cis-indeno, dibenzo-indenofluorene, indenonaphthalene and a derivative thereof.

A: a π-conjugated structural unit having a less energy gap, also called a functional unit, selected from the structural units comprising the above-described hole injection or transport material (HIM/HTM), electronic injection or transport material (EIM/ETM), host material, singlet emitter (fluorescent emitter), triplet emitter (phosphorescent emitter). x, y: >0, and x+y=1;

In an embodiment, the functional material comprised in the formulation is a polymer HTM.

In an embodiment, the polymer HTM material is a homopolymer, further is polythiophene, polypyrrole, polyaniline, polybiphenyl triarylamine, polyvinylcarbazole, and derivatives thereof.

nocarbazole, indolocarbazole, pentacene, phthalocyanine, porphyrin and derivatives thereof.

x, y: >0, and x+y=1; generally, y≥0.10, further y≥0.15, still further y≥0.20, even further x=y=0.5.

In an embodiment, the conjugated polymer as HTM may be selected from the following compounds:

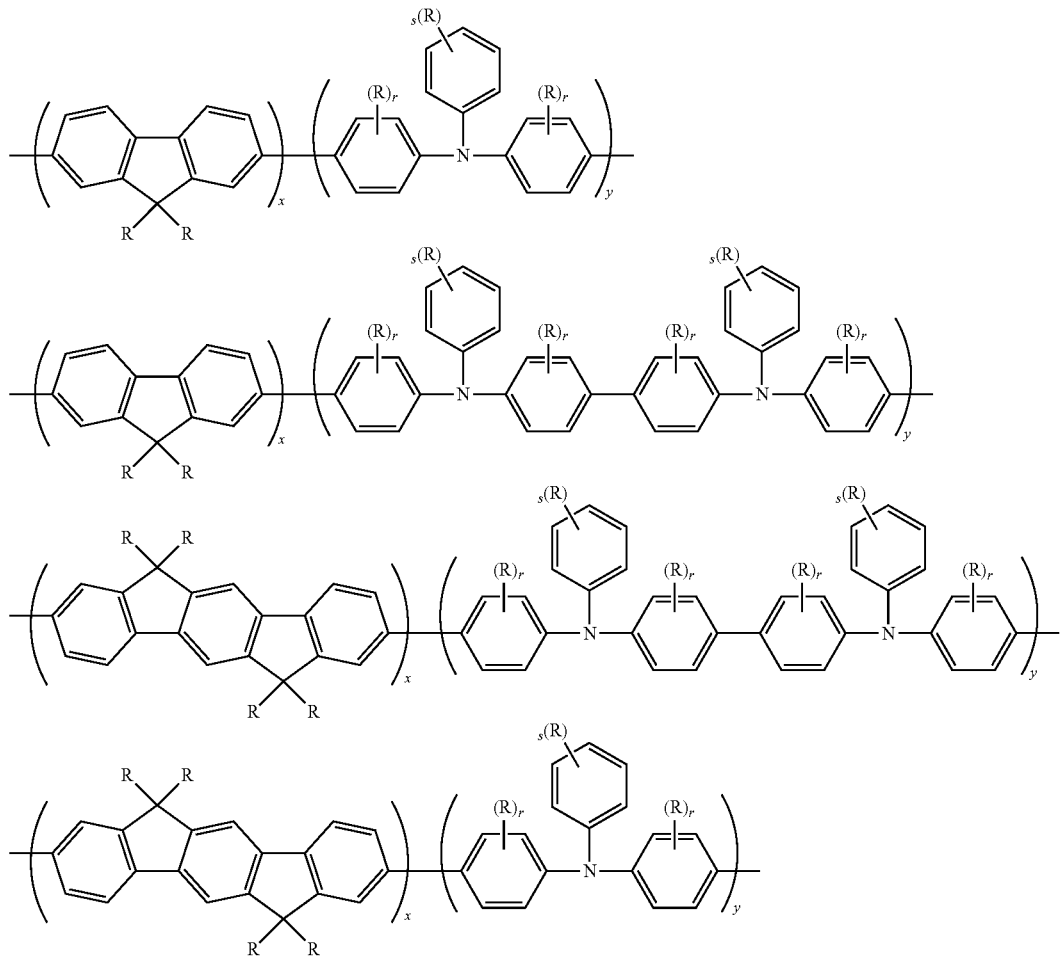

In a particularly embodiment, the polymer HTM material is a conjugated copolymer represented by Chemical Formula 1, wherein wherein B, A may be independently selected from the same or different structural units in multiple occurrences B: a π-conjugated structural unit having a large energy gap, also called a backbone unit, selected from a monocyclic or polycyclic aryl or heteroaryl group, and further, the unit form is benzene, biphenylene, naphthalene, anthracene, phenanthrene, dihydrophenanthrene, 9,10-dihydrophenanthrene, fluorene, difluorene, spirobifluorene, phenylenevinylene, trans-indenofluorenes, cis-indeno, dibenzoindenofluorene, indenonaphthalene and a derivative thereof.

A: a functional group having a hole transporting capability, which may be identically or differently selected from the structural unit containing the hole injection or transport material (HIM/HTM) described above; in a preferred embodiment, A is selected from amines, biphenyl 5 triarylamine, thiophene, thiophthene such as dithienothiophene and thiophthene, pyrrole, aniline, carbazole, indewherein, Rs are each independently selected from the group consisting of: hydrogen, a linear alkyl containing 1 to 20 C atoms, linear alkoxy containing 1 to 20 C atoms or linear thioalkoxy group containing 1 to 20 C atoms, or a branched or cyclic alkyl containing 3 to 20 C atoms, branched or cyclic alkoxy containing 3 to 20 C atoms or branched or cyclic thioalkoxy group containing 3 to 20 C atoms or silyl group containing 3 to 20 C atoms, or a substituted ketone group containing 1 to 20 C atoms, or an alkoxycarbonyl group containing 2 to 10 C atoms, or an aryloxycarbonyl group containing 7 to 20 C atoms, or a cyano group (—CN), a carbamoyl group (—C(═O)NH2), a haloformyl group (—C(═O)—X wherein X represents a halogen atom), a formyl group (—C(═O)—H), an isocyano group, an isocyanate group, an thiocyanate group or an isothiocyanate group, an hydroxyl group, an nitro group, an $CF_3$ group, Cl, Br, F, a crosslinkable group or a substituted or unsubstituted aromatic ring system containing 5 to 40 ring atoms or substituted or unsubstituted heteroaromatic ring system containing 5 to 40 ring atoms, or an aryloxy group containing 5 to 40 ring atoms or heteroaryloxy group containing 5 to 40 ring atoms, or a combination of these groups, wherein one or more of the groups Rs may form a monocyclic or polycyclic aliphatic or aromatic ring system with each other and/or a ring bonded thereto;

r is 0, 1, 2, 3 or 4;

s is 0, 1, 2, 3, 4 or 5;

x, y: >0, and x+y=1; generally y≥0.10, further y≥0.15, still further y≥0.20, even further x=y=0.5.

Another kind of organic functional material is polymers having electron transporting capability, including conjugated polymers and non-conjugated polymers.

In an embodiment, the selected polymer ETM material is a homopolymer, the homopolymer preferably selected from the group consisting of polyphenanthrene, polyphenanthroline, polyindenofluorene, polyspirobifluorene, polyfluorene and derivatives thereof.

In an embodiment, a polymer ETM material is a conjugated copolymer represented by Chemical Formula 1, wherein A may independently be selected from the same or different forms in multiple occurrences:

B: a π-conjugated structural unit having a large energy gap, also called a backbone unit, selected from a monocyclic or polycyclic aryl or heteroaryl group, and further, the unit form is benzene, biphenylene, naphthalene, anthracene, phenanthrene, dihydrophenanthrene, 9,10-dihydrophenanthrene, fluorene, difluorene, spirobifluorene, phenylenevinylene, trans-indenofluorenes, cis-indeno, dibenzoindenofluorene, indenonaphthalene and derivatives thereof.

A: a functional group having an electron transporting capability, further selected from the group consisting of tris(8-hydroxyquinoline)aluminum (AlQ3), benzene, diphenylene, naphthalene, anthracene, phenanthrene, dihydrophenanthrene, fluorene, difluorene, spirobifluorene, phenylenevinylene, pyrene, perylene, 9,10-dihydrophenanthrene, phenazine, phenanthroline, transindenofluorenes, cis-indeno, dibenzo-indenofluorene, indenonaphthalene, benzoanthracene and derivatives thereof.

x, y: >0, and x+y=1; generally, y≥0.10, further y≥0.15, still further y≥0.20, even further x=y=0.5.

In another embodiment, the functional material comprised in the formulation according to the disclosure is a light-emitting polymer.

In an embodiment, the light-emitting polymer is a conjugated polymer of the formula:

Chemical formula 2

B: Same as the definition of Chemical Formula 1.

A1: a functional group having a hole or electron transporting capability, which may be selected from structural units containing the above-described hole injection or transport material (HIM/HTM), or electron injection or transport material (EIM/ETM).

A2: a group having a light-emitting function, which may be selected from structural units containing the above-described singlet light emitter (fluorescent emitter) and heavy light emitter (phosphorescent emitter).

x, y, z: >0, and x+y+z=1;

Examples of light emitting polymers are disclosed in the following patent applications: WO2007043495, WO2006118345, WO2006114364, WO2006062226, WO2006052457, WO2005104264, WO2005056633, WO2005033174, WO2004113412, WO2004041901, WO2003099901, WO2003051092, WO2003020790, WO2003020790, US2020040076853, US2020040002576, US2007208567, US2005962631, EP 201345477, EP2001344788, DE102004020298. The entirety of the contents of the patent documents listed above are hereby incorporated herein by reference.

In another embodiment, the polymer suitable for the present disclosure is a non-conjugated polymer. This can be a polymer in which all of the functional groups are on the side chain and the backbone is non-conjugated. Some of such non-conjugated high polymers useful as phosphorescent host or phosphorescent light-emitting materials are disclosed in U.S. Pat. No. 7,250,226 B2, JP2007059939A, JP2007211243A2 and JP2007197574A2, and some useful as fluorescent light-emitting materials are disclosed in JP2005108556, JP2005285661, and JP2003338375. Alternatively, the non-conjugated high polymer may be a polymer in which the functional units conjugated to the main chain are linked by non-conjugated linking units. Examples of such high polymers are disclosed in DE102009023154.4 and DE102009023156.0. The entirety of the above patent documents are hereby incorporated herein by reference.

The present disclosure also relates to a method for forming the above-described printing ink formulation into a functional material film on a substrate, comprising the steps of:

applying a formulation to the substrate using a method of printing or coating; evaporating a solvent in the printing ink formulation.

That is, the present disclosure relates to a method for preparing a thin film comprising a functional material using a method of printing or coating.

The printing or coating method in which any of the formulations as described above is applied to a substrate by printing or coating may be selected from inkjet printing, nozzle printing, typography, screen printing, dip coating, spin coating, blade coating, roller printing, twist roller printing, lithography, flexography, rotary printing, spray coating, brush coating or transfer printing, or slot die coating, and the like.

In an embodiment, the film comprising the functional material is prepared using a method of inkjet printing. Inkjet printers that can be used to print inks in accordance with the present disclosure are commercially available printers and include drop-on-demand printheads. These printers are available from Fujifilm Dimatix (Lebanon, N.H.), Trident International (Brookfield, Conn.), Epson (Torrance, Calif.), Hitachi Data systems Corporation (Santa Clara, Calif.), Xaar PLC (Cambridge, United Kingdom), and Idanit Technologies, Limited (Rishon Le Zion, Isreal). For example, the present disclosure can be printed using Dimatix Materials Printer DMP-3000 (Fujifilm).

The disclosure further relates to an electronic device comprising a functional layer, which is a functional material film formed with the printing ink formulation described above. In addition, the electronic device may comprise one or more functional layers, that is, may comprise one or more layers of functional material film, the functional layers may be prepared by printing or coating method.

Suitable electronic devices include an quantum dot light-emitting diode (QLED), an quantum dot photovoltage (QPV), an quantum dot light-emitting electrochemical cell (QLEEC), an quantum dot field-effect transistor (QFET), an quantum dot light-emitting field-effect transistor, an quantum dot laser, an quantum dot sensor, an organic lightemitting diode (OLED), an organic photovoltage cell (OPV), an organic light-emitting electrochemical cell (OLEEC), an organic field-effect transistor (OFET), an organic light-emitting field-effect transistor, an organic laser, an organic sensor.

The FIGURE is a schematic diagram of an electronic device in an embodiment. The electronic device is an electroluminescent device or a photovoltaic cell, as shown in the FIGURE, comprising a substrate 101, an anode 102, at least one light emitting layer or a light absorption layer 104, and a cathode 106. The following description is only for the electroluminescent device.

The substrate 101 may be opaque or transparent. A transparent substrate can be used to fabricate a transparent light-emitting device. For example, see Bulovic et al. Nature 1996, 380, p 29 and Gu et al. Appl. Phys. Lett. 1996, 68, p 2606. The substrate may be rigid or elastic. The substrate may be plastic, metal, a semiconductor wafer or glass. Especially the substrate has a smooth surface. The substrate without any surface defects is a particular desirable choice. In an embodiment, the substrate may be selected from polymer thin film or plastic which have the glass transition temperature Tg larger than 150° C., further larger than 200° C., still further larger than 250° C., even further larger than 300° C. Suitable examples of the substrate are poly(ethylene terephthalate) (PET) and polyethylene(2,6-naphthalate) (PEN).

The anode 102 may comprise a conductive metal or a metal oxide, or a conductive polymer. The anode can easily inject holes into the HIL or HTL or the light emitting layer. In an embodiment, the absolute value of the difference between the work function of the anode and the HOMO energy level or the valence band energy level of the p-type semiconductor material as the HIL or HTL is less than 0.5 eV, further less than 0.3 eV, still further less than 0.2 eV. Examples of the anode material include, but are not limited to, Al, Cu, Au, Ag, Mg, Fe, Co, Ni, Mn, Pd, Pt, ITO, aluminum-doped zinc oxide (AZO), and the like. Other suitable anode materials are known and may be easily selected by one of ordinary skilled in the art. The anode material may be deposited by any suitable technologies, such as the suitable physical vapor deposition method which includes radio frequency magnetron sputtering, vacuum thermal evaporation, electron beam, and the like.

In some embodiments, the anode is patterned and structured. Patterned ITO conductive substrates are commercially available and can be used to prepare the device according to the present disclosure.

Cathode 106 may comprise a conductive metal or metal oxide. The cathode can easily inject electrons into the EIL or ETL or directly into the light emitting layer. In an embodiment, the absolute value of the difference between the work function of the cathode and the LUMO energy level or the conduction band energy level of the n-type semiconductor material as the EIL or ETL or HBL is less than 0.5 eV, further less than 0.3 eV, still further less than 0.2 eV. In principle, all materials that can be used as cathodes for OLED can be used as cathode materials for the devices of the disclosure. Examples of the cathode material include: Al, Au, Ag, Ca, Ba, Mg, LiF/Al, MgAg alloy, BaF2/Al, Cu, Fe, Co, Ni, Mn, Pd, Pt, ITO and the like. The cathode material may be deposited by any suitable technologies, such as the suitable physical vapor deposition method which includes radio frequency magnetron sputtering, vacuum thermal evaporation, electron beam, and the like.

The light-emitting layer 104 includes at least one light-emitting functional material, which has a thickness between 2 nm and 200 nm. In an embodiment, in the light-emitting device according to the disclosure, the light emitting layer is prepared by printing the printing ink of the disclosure, wherein the printing ink comprises at least one light-emitting functional material as described above, in particular quantum dots or an organic functional material.

In an embodiment, a light emitting device according to the present disclosure further comprises a hole injection layer (HIL) or hole transport layer (HTL) 103 comprising an organic HTM or inorganic p-type material as described above. In a preferred embodiment, the HIL or HTL may be prepared by printing the printing ink of the present disclosure, wherein the printing ink contains a functional material having hole transporting capability, particularly quantum dots or an organic HTM material.

In another embodiment, a light emitting device according to the present disclosure further comprises an electron injection layer (EIL) or electron transport layer (ETL) 105 comprising an organic ETM or inorganic n-type material as described above. In some embodiments, the EIL or ETL can be prepared by printing the printing ink of the present disclosure, wherein the printing ink contains functional materials having electron transport capability, particularly quantum dots or organic ETM materials.

The disclosure further relates to the use of a light emitting device according to the disclosure in various applications, including, but not limited to, various display devices, backlights, illumination sources, and the like.

The present disclosure will be described with reference to the preferred embodiments thereof, but the present disclosure is not limited to the examples described below. It is to be understood that the appended claims are intended to cover the scope of the disclosure. Under the guidance of the inventive concept, those skilled in the art should be aware that some modifications of the various embodiments of the disclosure are intended to be covered by the scope of the appended claims.

EXAMPLES

Example 1: Preparation of Blue Light Quantum Dots (CdZnS/ZnS)

0.0512 g of S and 2.4 mL of octadecene (ODE) were added in a 25 mL single-necked flask, which was then heated in an oil pan to 80° C. to dissolve S for use, hereafter referred to as Solution 1; 0.1280 g of S and 5 mL of oleylamine (OA) were added in a 25 mL single-necked flask, which was then heated in an oil pan to 90° C. to dissolve S for use, hereinafter referred to as Solution 2; 0.1028 g of CdO, 1.4680 g of zinc acetate and 5.6 mL of OA were added in a 50 mL three-necked flask. In a 150 mL heating mantle the three-necked flask was placed with two side necks plugged with rubber plugs and top neck connected to a condenser connected to a double tube, and was heated to 150° C., evacuated for 40 min, and then filled with nitrogen gas; 12 mL of ODE were added to the three-necked flask using a syringe, and three-necked flask was heated to 310° C., once the temperature was reached, 1.92 mL of Solution 1 was rapidly added into the three-necked flask using a syringe. after 12 min, with a syringe 4 mL of Solution 2 was added dropwise to the three-necked flask with dropping rate of approximately 0.5 mL/min, and the reaction was performed for 3 h. After the reaction is stopped, the three-necked flask immediately was put into water to cool down to 150° C.;

An excess of n-hexane was added to the three-necked flask, and then the liquid in the three-necked flask was transferred to a plurality of 10 mL centrifuge tubes, centrifuged to remove the lower layer precipitate, and repeated three times; acetone was added to the liquid after the post-treatment 1 until precipitation occurred, the tubes were centrifuged to remove the supernatant and leave a precipitate; the precipitate was then dissolved with n-hexane, acetone was added until precipitation occurred, and the tubes were centrifuged to remove the supernatant and leave a precipitate, this process was repeated for three times; Finally, the precipitate was dissolved in toluene, and the result was transferred to a glass bottle for storage.

Example 2: Preparation of Green Light Quantum Dots (CdZnSeS/ZnS)

0.0079 g of selenium and 0.1122 g of sulfur and 2 mL of trioctylphosphine (TOP) were added and stirred in a 25 mL single-necked flask which was filled with nitrogen gas, hereinafter referred to as Solution 1; 0.0128 g of CdO and 0.3670 g of zinc acetate and 2.5 mL of OA were added in a 25 mL three-necked flask. In a 50 mL heating mantle the three-necked flask was placed with two side necks plugged with rubber plugs and top neck connected to a condenser connected to a double tube, and was evacuated, and then filled with nitrogen gas, heated to 150° C., and evacuated for 30 min before 7.5 mL of ODE injected thereinto, and three-necked flask was heated to 300° C., once the temperature was reached, 1 mL of Solution 1 was rapidly injected. After 10 min, the reaction is stopped, the three-necked flask immediately was put into water to cool down.

5 mL of n-hexane was added to the three-necked flask, and the mixture was added to a plurality of 10 mL centrifuge tubes, acetone was added until precipitation occurred, and centrifugation was carried out. The precipitate was taken, the supernatant was removed, the precipitate was dissolved with n-hexane, acetone was added until precipitation occurred, and centrifugation was carried out. This process was repeated for three times. The final precipitate was dissolved in a small amount of toluene, and the result transferred to a glass bottle for storage.

Example 3: Preparation of Red Light Quantum Dots (CdSe/CdS/ZnS)

1 mmol of CdO, 4 mmol of OA and 20 ml of ODE were added to a 100 ml three-necked flask, which was then filled with nitrogen and heated to 300° C. to formed a $Cd(OA)_2$ precursor. At this temperature, 0.25 mL of TOP dissolving 0.25 mmol of Se powder was quickly injected. The reaction solution was reacted at this temperature for 90 seconds to obtain CdSe cores of about 3.5 nm. 0.75 mmol of octyl mercaptan was added dropwise to the reaction solution at 300° C., and CdS shells of about 1 nm thick was grown after 30 minutes of reaction. 4 mmol of $Zn(OA)_2$, and 2 ml of TBP dissolved in 4 mmol of S powder were then added dropwise to the reaction solution to grow a ZnS shells (about 1 nm). After the reaction was continued for 10 minutes, it was cooled to room temperature.

5 mL of n-hexane was added to the three-necked flask, and the mixture was added to a plurality of 10 mL centrifuge tubes, acetone was added until precipitation occurred, and centrifugation was carried out. The precipitate was taken, the supernatant was removed, the precipitate was dissolved with n-hexane, acetone was added until precipitation occurred, and centrifugation was carried out. This process was repeated for three times. The final precipitate was dissolved in a small amount of toluene, and the result transferred to a glass bottle for storage.

Example 4: Preparation of ZnO Nanoparticles 1.475 g of zinc acetate was dissolved in 62.5 mL of methanol to give a Solution 1. 0.74 g of KOH was dissolved in 32.5 mL of methanol to give a solution 2. Solution 1 was warmed to 60° C. with stirring vigorously. Solution 2 was added dropwise to Solution 1 using an injector. After the completion of the dropwise addition, the mixed solution system was further stirred at 60° C. for 2 hours. The heat source was removed and the solution system was allowed to stand for 2 hours. The reaction solution was centrifuged three times or more using a centrifugal condition of 4500 rpm for 5 minutes. Finally, a white solid was obtained as ZnO nanoparticles having a diameter of about 3 nm.

Example 5: Preparation of Quantum Dot Printing Ink Containing Quinoline and 1-Tetralone Quinoline (5.7 g) and 1-tetralone (3.8 g) solvents were weighed separately (weight ratio 60:40). A vial in which the stirrer was placed was cleaned and transferred to the glove box. The quantum dots were precipitated from the solution with acetone and centrifuged to obtain a quantum dot solid. In the glove box 0.5 g of quantum dot solid was weighed, and added to the quinoline solvent in the vial, and stirred at 60° C. until the quantum dots were completely dispersed, then 1-tetralone solvent was added to obtain a mixed solution and stirred until the quantum dots were completely dispersed, then the solution was cooled to room temperature. The obtained quantum dot solution was filtered through a 0.2 m PTFE filter and sealed for storage.

Example 6: Preparation of ZnO Nanoparticle Printing Ink Containing Acetophenone and 3-Isopropylbiphenyl Acetophenone (5.7 g) and 3-isopropylbiphenyl (3.8 g) solvents were weighed (weight ratio 60:40). A vial in which the stirrer was placed was cleaned and transferred to the glove box. In the glove box 0.5 g of ZnO nanoparticles solid was weighed, and added to the acetophenone solvent in the vial, and stirred at 60° C. until the ZnO nanoparticles are completely dispersed, then 3-isopropylbiphenyl solvent was added to obtain a mixed solution and stirred until the ZnO nanoparticles were completely dispersed, then the solution was cooled to room temperature. The obtained solution of ZnO nanoparticles was filtered through a 0.2 m PTFE filter and sealed for storage.

The organic functional materials involved in the following examples are all commercially available, such as Jilin OLED Material Tech Co., Ltd. (www.jl-oled.com), or synthesized according to methods reported in the literature.

Example 7: Preparation of Printing Ink of Organic Light-Emitting Layer Material Containing Chloronaphthalene and 3-Phenoxytoluene In this example, the organic light-emitting layer functional material comprises a phosphorescent host material and a phosphorescent emitter material. The phosphorescent host material is selected from a carbazole derivative as follows:

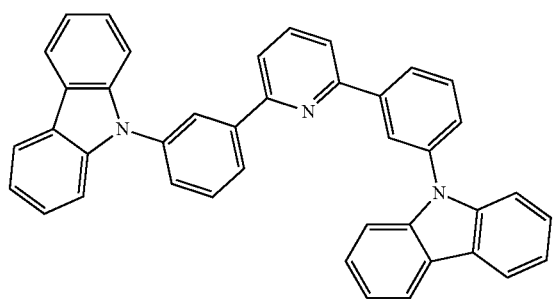 [SMILES: c1cc(-c2cccc(-c3cccc(-n4c5ccccc5c5ccccc54)c3)n2)cc(-n2c3ccccc3c3ccccc32)c1]

The phosphorescent emitter material is selected from a ruthenium complex as follows:

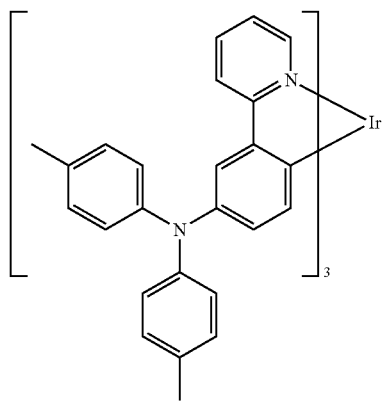

Chloronaphthalene (5.88 g) and 3-phenoxytoluene (3.92 g) solvent (weight ratio 60:40) were weighed. A vial in which the stirrer was placed was cleaned and transferred to the glove box. In the glove box, 0.18 g of the phosphorescent host material and 0.02 g of the phosphorescent emitter material was weighed, and added to the chloronaphthalene solvent in the vial, and stirred for mixing. The mixture was stirred at 60° C. until the organic functional material was completely dissolved, then 3-phenoxytoluen solvent was added to obtain a mixed solution and stirred until the organic functional material was completely dissolved, then the solution was cooled to room temperature. The obtained solution of organic functional material was filtered through a 0.2 m PTFE filter and sealed for storage.

Example 8: Preparation of Printing Ink of Organic Light-Emitting Layer Material Containing Pentylbenzene and Isononyl Isononanoate In this example, the organic light-emitting layer functional material comprises a fluorescent host material and a fluorescent emitter material.

The fluorescent host material is selected from a spirofluorene derivative as follows:

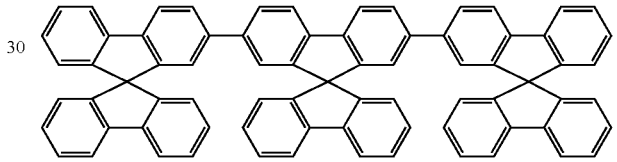

The fluorescent emitter material is selected from a compound as follows:

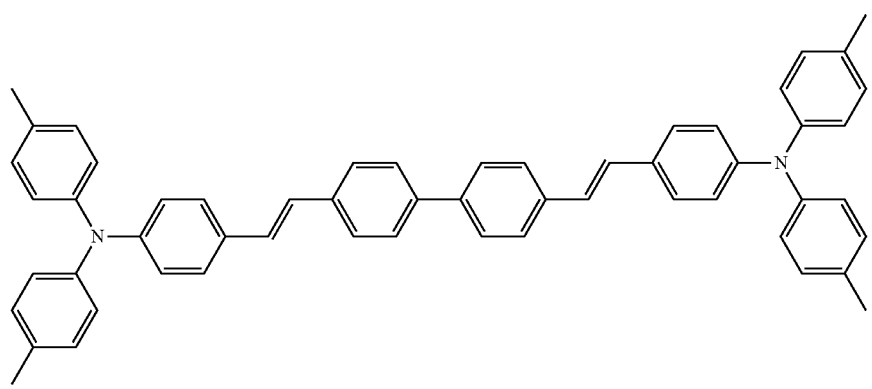 [SMILES: Cc1ccc(N(c2ccc(C)cc2)c2ccc(/C=C/c3ccc(-c4ccc(/C=C/c5ccc(N(c6ccc(C)cc6)c6ccc(C)cc6)cc5)cc4)cc3)cc2)cc1]

Pentylbenzene (5.88 g) and isononyl isononanoate (3.92 g) solvent (weight ratio 60:40) were weighed. A vial in which the stirrer was placed was cleaned and transferred to the glove box. In the glove box, 0.19 g of the fluorescent host material and 0.01 g of the phosphorescent emitter material was weighed, and added to the pentylbenzene solvent in the vial, and stirred for mixing. The mixture was stirred at 60° C. until the organic functional material was completely dissolved, then isononyl isononanoate solvent was added to obtain a mixed solution and stirred until the organic functional material was completely dissolved, then the solution was cooled to room temperature. The obtained solution of organic functional material was filtered through a 0.2 μm PTFE filter and sealed for storage.

Example 9: Preparation of Printing Ink of Organic Light-Emitting Layer Material Containing 3-Phenoxytoluene and Sulfolane In this example, the organic light-emitting layer functional material comprises a host material and a TADF material.

The host material is selected from a compound as follows:

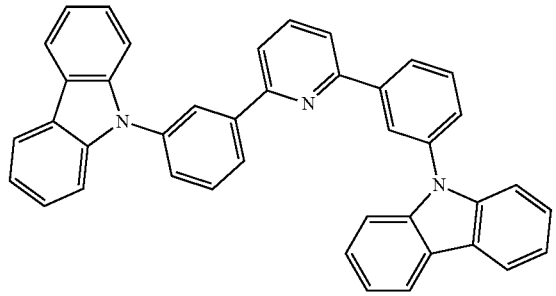 [SMILES: c1cc(-c2cccc(-c3cccc(-n4c5ccccc5c5ccccc54)c3)n2)cc(-n2c3ccccc3c3ccccc32)c1]

The TADF material is selected from a compound as follows:

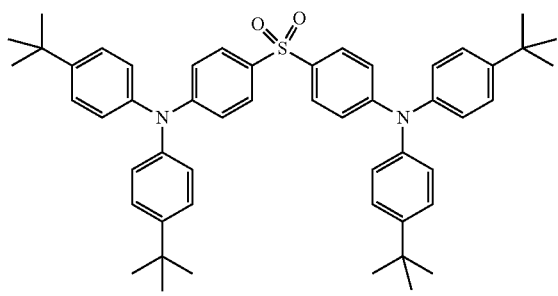 [SMILES: CC(C)(C)c1ccc(N(c2ccc(C(C)(C)C)cc2)c2ccc(S(=O)(=O)c3ccc(N(c4ccc(C(C)(C)C)cc4)c4ccc(C(C)(C)C)cc4)cc3)cc2)cc1]

3-phenoxytoluene (5.88 g) and sulfolane (3.92 g) solvent (weight ratio 60:40) were weighed. A vial in which the stirrer was placed was cleaned and transferred to the glove box. In the glove box, 0.18 g of the host material and 0.02 g of the TADF material was weighed, and added to the 3-phenoxytoluene solvent in the vial, and stirred for mixing. The mixture was stirred at 60° C. until the organic functional material was completely dissolved, then sulfolane solvent was added to obtain a mixed solution and stirred until the organic functional material was completely dissolved, then the solution was cooled to room temperature. The obtained solution of organic functional material was filtered through a 0.2 μm PTFE filter and sealed for storage.

Example 10: Preparation of Printing Ink of Hole Transport Material Containing Tetrahydronaphthalene and Dodecylbenzene In this example, the printing ink comprises a hole transport layer material having a hole transporting capability.

The hole transport material is selected from a triarylamine derivative as follows:

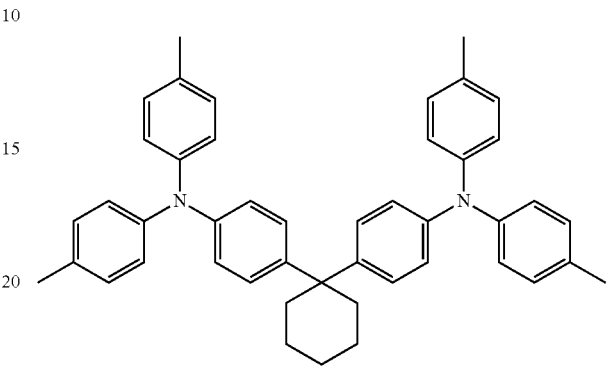

Tetrahydronaphthalene (5.88 g) and dodecylbenzene (3.92 g) solvent (weight ratio 60:40) were weighed. A vial in which the stirrer was placed was cleaned and transferred to the glove box. In the glove box, 0.2 g of the hole transport material was weighed, and added to the tetrahydronaphthalene solvent in the vial, and stirred for mixing. The mixture was stirred at 60° C. until the organic functional material was completely dissolved, then dodecylbenzene solvent was added to obtain a mixed solution and stirred until the organic functional material was completely dissolved, then the solution was cooled to room temperature. The obtained solution of organic functional material was filtered through a 0.2 m PTFE filter and sealed for storage.

Example 11: Viscosity and Surface Tension Test

The viscosity of the functional material ink was tested by a DV-I Prime Brookfield rheometer; the surface tension of the functional material ink was tested by a SITA bubble pressure tension meter.

According to the above test, the functional material ink obtained in Example 5 had a viscosity of 6.3±0.5 cPs and a surface tension of 43.2±0.3 dyne/cm.

According to the above test, the functional material ink obtained in Example 6 had a viscosity of 4.7±0.3 cPs and a surface tension of 36.2±0.3 dyne/cm.

According to the above test, the functional material ink obtained in Example 7 had a viscosity of 4.2±0.3 cPs and a surface tension of 39.6±0.5 dyne/cm.

According to the above test, the functional material ink obtained in Example 8 had a viscosity of 3.8±0.3 cPs and a surface tension of 29.1±0.3 dyne/cm.

According to the above test, the functional material ink obtained in Example 9 had a viscosity of 6.7±0.5 cPs and a surface tension of 35.9±0.5 dyne/cm.

According to the above test, the functional material ink obtained in Example 10 had a viscosity of 3.6±0.5 cPs and a surface tension of 33.1±0.5 dyne/cm.

A functional layer in the light-emitting diode, such as a light-emitting layer and a charge transport layer, can be prepared by inkjet printing using the printing ink containing a functional material based on the two organic solvent systems prepared above, and the specific steps are as follows.

The ink containing the functional material is loaded into an ink tank that is assembled to an inkjet printer such as Dimatix Materials Printer DMP-3000 (Fujifilm). The waveform, pulse time and voltage of ink jetting are adjusted to optimize ink jetting and to stabilize the inkjet range. In the preparation of an organic light-emitting diode/quantum dot light-emitting diode (OLED/QLED) device in which the functional material film is a light-emitting layer, the following technical solution is adopted: The substrate of the OLED/QLED is a 0.7 mm thick glass sputtered with an indium tin oxide (ITO) electrode pattern. The pixel defining layer is patterned on the ITO to form an internal hole for depositing the printing ink. The HIL/HTL material is then inkjet printed into the hole and the solvent is removed by drying at a high temperature in a vacuum to obtain a HIL/HTL film. Thereafter, the printing ink containing the light emitting functional material is ink-jet printed onto the HIL/HTL film, and the solvent is removed by drying at a high temperature in a vacuum to obtain a light emitting layer film. Subsequently, a printing ink containing a functional material having electron transporting properties is ink-jet printed onto the light emitting layer film, and the solvent is removed by drying at a high temperature in a vacuum to form an electron transport layer (ETL). When using organic electron transport materials, ETL can also be formed by vacuum thermal evaporation. Then, the Al cathode is formed by vacuum thermal evaporation, followed by packaging to complete the preparation of the OLED/QLED device.

The technical features of the above-described embodiments may be combined arbitrarily. To simplify the description, all the possible combinations of the technical features in the above embodiments are not described. However, all of the combinations of these technical features should be considered as within the scope of the present disclosure, as long as such combinations do not contradict with each other.

The above-described embodiments merely represent several embodiments of the present 5 disclosure, and the description thereof is more specific and detailed, but it should not be construed as limiting the scope of the present disclosure. It should be noted that, for those skilled in the art, several variations and improvements may be made without departing from the concept of the present disclosure, and these are all within the protection scope of the present disclosure.

The invention claimed is:

1. A printing ink formulation, comprising a functional material and a solvent, the solvent could be evaporable from the printing ink formulation to form a functional film;
  wherein the solvent is formed by mixing at least two organic solvents including a first solvent and a second solvent, the first solvent and the second solvent are miscible, and at least one of the first solvent and the second solvent has a boiling point greater than or equal to 160° C., the second solvent has a surface tension less than that of the first solvent and a viscosity greater than that of the first solvent, and the difference in surface tension between the first solvent and the second solvent is at least 2 dyne/cm, and the difference in viscosity between the second solvent and the first solvent is at least 2 cPs,
  wherein the functional material is an inorganic nanomaterial or an organic functional material, and wherein the organic functional material is selected from the group consisting of hole injection materials, hole transport materials, electron transport materials, electron injection materials, electron blocking materials, hole blocking materials, emitters, host materials, and organic dyes.

2. The printing ink formulation according to claim 1, wherein at least one of the first solvent and the second solvent has a surface tension between 19 dyne/cm and 50 dyne/cm at 25° C.

3. The printing ink formulation according to claim 1, wherein at least one of the first solvent and the second solvent has a viscosity between 1 cPs and 100 cPs at 25° C.

4. The printing ink formulation according to claim 1, wherein the first solvent is present in an amount between 30 wt % and 90 wt % based on the total weight of the solvent, and the second solvent is present in an amount between 10 wt % and 70 wt % based on the total weight of the solvent.

5. The printing ink formulation according to claim 1, wherein the first solvent or the second solvent is each independently selected from the group consisting of a substituted or unsubstituted aromatic solvent, a substituted or unsubstituted heteroaromatic solvent, an aromatic ketone solvent, an aromatic ether solvent, ester solvent, a linear aliphatic solvent, an alicyclic solvent, an aliphatic ketone solvent, an aliphatic ether solvent, an alcohol solvent, and an inorganic ester solvent.

6. The printing ink formulation according to claim 5, wherein the substituted or unsubstituted aromatic solvent is selected from the group consisting of p-diisopropylbenzene, pentylbenzene, tetrahydronaphthalene, cyclohexylbenzene, chloronaphthalene, 1,4-dimethylnaphthalene, 3-isopropylbiphenyl, p-methylisopropylbenzene, dipentylbenzene, o-diethylbenzene, m-diethylbenzene, p-diethylbenzene, 1,2,3,4-tetramethylbenzene, 1,2,3,5-tetramethylbenzene, 1,2,4,5-tetramethylbenzene, butylbenzene, dodecylbenzene 1-methylnaphthalene, 1,2,4-trichlorobenzene, 1,3-dipropoxybenzene, 4,4-difluorodiphenylmethane, 1,2-dimethoxy-4-(1-propenyl)benzene, diphenylmethane, N-methyldiphenylamine, 4-isopropylbiphenyl, α,α-dichlorodiphenylmethane, benzyl benzoate, 1,1-bis(3,4-dimethylphenyl)ethane, 2-isopropylnaphthalene, dibenzyl ether, and 2-isopropyl naphthalene;
  the substituted or unsubstituted heteroaromatic solvent is selected from the group consisting of 2-phenylpyridine, 3-phenylpyridine, 4-(3-phenylpropyl)pyridine, quinoline, isoquinoline, 8-hydroxyquinoline, methyl 2-furancarboxylate, and ethyl 2-furancarboxylate;
  the aromatic ketone solvent is selected from the group consisting of: 1-tetralone, 2-tetralone, acetophenone, propiophenone or benzophenone, the 1-tetralone or 2-tetralone is each independently, optionally substituted by a substituent of an aliphatic group, an aryl group, a heteroaryl group or a halogen; the acetophenone, propiophenone or benzophenone is each independently, optionally substituted by a methyl group;
  the aromatic ether solvent is selected from the group consisting of 3-phenoxytoluene, butoxybenzene, benzyl butylbenzene, p-anisaldehyde dimethyl acetal, tetrahydro-2-phenoxy-2H-pyran, 1,2-dimethoxy-4-(1-propenyl)benzene, 1,4-benzodioxane, 1,3-dipropylbenzene, 2,5-dimethoxytoluene, 4-ethylphenetole, 1,2,4-trimethoxybenzene, 4-(1-propenyl)-1,2-dimethoxybenzene, 1,3-dimethoxybenzene, glycidyl phenyl ether, dibenzyl ether, 4-tert-butylanisole, trans-p-propenyl anisole, 1,2-dimethoxybenzene, 1-methoxynaphthalene, diphenyl ether, 2-phenoxymethyl ether, 2-phenoxytetrahydrofuran, and ethyl-2-naphthyl ether;

the ester solvent is selected from the group consisting of alkyl octanoate, alkyl sebacate, alkyl stearate, alkyl benzoate, alkyl phenylacetate, alkyl cinnamate, alkyl oxalate, alkyl maleate, alkyl lactone, and alkyl oleate;

the cycloaliphatic solvent is selected from the group consisting of tetrahydronaphthalene, cyclohexylbenzene, decahydronaphthalene, 2-phenoxytetrahydrofuran, 1,1'-bicyclohexane, butylcyclohexane, ethyl rosinate, benzyl rosinate, ethylene glycol carbonate, styrene oxide, isophorone, 3,3,5-trimethylcyclohexanone, cycloheptanone, fenchone, 1-tetralone, 2-tetralone, 2-(phenyl epoxy)tetralone, 6-(m ethoxy)tetralone, γ-butyrolactone, γ-valerolactone, 6-caprolactone, N,N-diethyl cyclohexylamine, sulfolane, and 2,4-dimethylsulfolane;

the aliphatic ketone solvent is selected from the group consisting of 2-nonanone, 3-nonanone, 5-nonanone, 2-decanone, 2,5-hexanedione, di-n-pentyl ketone, phorone, isophorone, 2,6,8-trimethyl-4-nonanone, camphor, and fenchone;

the aliphatic ether solvent is selected from the group consisting of pentyl ether, hexyl ether, dioctyl ether, ethylene glycol dibutyl ether, diethylene glycol diethyl ether, diethylene glycol butyl methyl ether, diethylene glycol dibutyl ether, triethylene glycol dimethyl ether, triethylene glycol ethyl methyl ether, triethylene glycol butyl methyl ether, tripropylene glycol dimethyl ether, and tetraethylene glycol dimethyl ether;

the inorganic ester solvent is selected from the group consisting of tributyl borate, tripentyl borate, trimethyl phosphate, triethyl phosphate, tributyl phosphate, tris(2-ethylhexyl) phosphate, triphenyl phosphate, diethyl phosphate, dibutyl phosphate, and di(2-ethylhexyl) phosphate.

7. The printing ink formulation according to claim 6, wherein the second solvent is 1-tetralone and the first solvent is quinolone or isoquinolone;

or, the second solvent is 3-phenoxytoluene and the first solvent is selected from the group consisting of chlorophthalene, styrene oxide, quinoline and isoquinoline;

or, the second solvent is 3-isopropylbiphenyl, and the first solvent is selected from the group consisting of 3-phenoxytoluene, acetophenone, tetrahydronaphthalene, chloronaphthalene, 1,4-dimethylnaphthalene, 1-methylnaphthalene, diphenyl ether, diphenylmethane, 2-isopropylnaphthalene, styrene oxide, quinoline and isoquinoline;

or, the second solvent is isononyl isononanoate, the first solvent is selected from the group consisting of 3-phenoxytoluene, acetophenone, pentylbenzene, tetrahydronaphthalene, cyclohexylbenzene, chloronaphthalene, o-diethylbenzene, dodecylbenzene, diphenyl ether, diphenylmethane, 2-isopropylbenzene, octyl octanoate, 1,1-bicyclohexane, butyrolactone, isophorone, cycloheptanone and triethyl phosphate;

or, the second solvent is sulfolane, and the first solvent is selected from the group consisting of 3-phenoxytoluene, acetophenone, chloronaphthalene, 1,4-dimethylnaphthalene, 1-methylnaphthalene, diphenyl ether, ethylene glycol carbonate, quinoline and isoquinoline;

or, the second solvent is dodecylbenzene, and the first solvent is selected from the group consisting of acetophenone, tetrahydronaphthalene, chloronaphthalene, 1-methylnaphthalene, diphenylmethane, butyrolactone, isophorone and isoquinoline;

or, the second solvent is 2,4-dimethyl sulfolane, and the first solvent is selected from the group consisting of 3-phenoxytoluene, acetophenone, pentylbenzene, cyclohexylbenzene, chloronaphthalene, diethylbenzene, xylene, dichlorobenzene, dodecylbenzene, trichlorobenzene, diphenyl ether, diphenylmethane, 2-isopropylnaphthalene, 1,1-bicyclohexane, butyrolactone, cycloheptanone, quinoline, isoquinoline and triethyl phosphate.

8. The printing ink formulation according to claim 7, wherein the second solvent is 1-tetralone and the first solvent is quinolone;

or, the second solvent is 3-phenoxytoluene and the first solvent is chloronaphthalene;

or, the second solvent is 3-isopropylbiphenyl and the first solvent is acetophenone;

or, the second solvent is isononyl isononanoate and the first solvent is pentylbenzene;

or, the second solvent is sulfolane and the first solvent is 3-phenoxytoluene;

or, the second solvent is dodecylbenzene and the first solvent is tetrahydronaphthalene.

9. The printing ink formulation according to claim 7, wherein weight ratio of the first solvent to the second solvent is between 40:60 and 80:20.

10. The printing ink formulation according to claim 1, wherein the solvent further comprises methanol, ethanol, 2-methoxyethanol, dichloromethane, trichloromethane, chlorobenzene, o-dichlorobenzene, tetrahydrofuran, anisole, morpholine, toluene, o-xylene, m-xylene, p-xylene, 1,4-dioxane, acetone, methyl ethyl ketone, 1,2-dichloroethane, 3-phenoxytoluene, 1,1,1-trichloroethane, 1,1,2,2-tetrachloroethane, ethyl acetate, butyl acetate, dimethylformamide, dimethylacetamide, dimethyl sulfoxide, tetrahydronaphthalene, decalin, indene, or mixtures thereof.

11. The printing ink formulation according to claim 1, wherein weight ratio of the functional material in the printing ink formulation is between 0.3 wt % and 30 wt %; the weight ratio of the solvent in the printing ink formulation is between 70 wt % and 99.7 wt %.

12. The printing ink formulation according to claim 1, wherein the inorganic nanomaterial is a quantum dot material with a monodisperse size distribution and has a shape selected from sphere, cube, rod, and branched structure.

13. The printing ink formulation according to claim 12, wherein the quantum dot material is a semiconductor nanocrystal; the semiconductor nanocrystal comprises at least one semiconductor material; and the semiconductor material is selected from binary or multiple semiconductor compounds or mixtures thereof of Group IV, II-VI, II-V, III-V, III-VI, IV-VI, I-III-VI, II-IV-VI, II-IV-V of the periodic table.

14. The printing ink formulation according to claim 13, wherein the inorganic nanomaterial is selected from the group consisting of perovskite nanomaterials, metal nanoparticle materials, metal oxide nanoparticle materials, and mixtures thereof.

15. The printing ink formulation according to claim 1, wherein the organic functional material comprises at least one host material and at least one emitter.

16. The printing ink formulation according to claim 1, wherein at least one of the first solvent or the second solvent is represented by the following formula:

wherein, $Ar^1$ is an aromatic containing 5 to 10 ring atoms or heteroaromatic containing 5 to 10 ring atoms, n 1 and R is a substituent.

17. The printing ink formulation according to claim 1, wherein the functional material is an inorganic semiconductor nanomaterial.

18. The printing ink formulation according to claim 1, wherein the difference in surface tension between the first solvent and the second solvent is at least 4 dyne/cm.

19. The printing ink formulation according to claim 1, wherein the printing ink formulation has a surface tension in the range from 19 dyne/cm to 50 dyne/cm at 25° C.

* * * * *